(12) United States Patent
Yakubo et al.

(10) Patent No.: US 11,875,838 B2
(45) Date of Patent: Jan. 16, 2024

(54) MEMORY DEVICE, SEMICONDUCTOR DEVICE, AND ELECTRONIC DEVICE

(71) Applicant: SEMICONDUCTOR ENERGY LABORATORY CO., LTD., Atsugi (JP)

(72) Inventors: Yuto Yakubo, Kanagawa (JP); Takahiko Ishizu, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 173 days.

(21) Appl. No.: 17/625,922

(22) PCT Filed: Jul. 6, 2020

(86) PCT No.: PCT/IB2020/056325
§ 371 (c)(1),
(2) Date: Jan. 10, 2022

(87) PCT Pub. No.: WO2021/009607
PCT Pub. Date: Jan. 21, 2021

(65) Prior Publication Data
US 2022/0254402 A1    Aug. 11, 2022

(30) Foreign Application Priority Data

Jul. 12, 2019 (JP) ................. 2019-130021

(51) Int. Cl.
*G11C 11/405* (2006.01)
*G11C 11/4096* (2006.01)
(Continued)

(52) U.S. Cl.
CPC ........ *G11C 11/405* (2013.01); *G11C 11/4096* (2013.01); *H01L 27/124* (2013.01);
(Continued)

(58) Field of Classification Search
CPC ..... G11C 11/405; G11C 11/4096; G11C 7/08; G11C 11/4074; G11C 2207/063;
(Continued)

(56) References Cited

U.S. PATENT DOCUMENTS 9,159,738 B2    10/2015    Yamauchi
9,177,872 B2    11/2015    Sandhu
(Continued)

FOREIGN PATENT DOCUMENTS

CN    104205228 A    12/2014
CN    109643572 A    4/2019
(Continued)

OTHER PUBLICATIONS

International Search Report (Application No. PCT/IB2020/056325) dated Oct. 6, 2020.
(Continued)

*Primary Examiner* — Michael T Tran
(74) *Attorney, Agent, or Firm* — NIXON PEABODY LLP; Jeffrey L. Costellia

(57) ABSTRACT

A memory device with shortened access time in data reading is provided. The memory device includes a first layer and a second layer positioned above the first layer, the first layer includes a reading circuit, and the second layer includes a first memory cell and a second memory cell. The reading circuit includes a Si transistor. The first memory cell and the second memory cell each include an OS transistor. The first memory cell is electrically connected to the reading circuit, and the second memory cell is electrically connected to the reading circuit. When a first current corresponding to first data retained in the first memory cell flows from the reading circuit to the first memory cell and a second current corresponding to second data retained in the second memory cell flows from the reading circuit to the second memory cell, the (Continued)

reading circuit compares the current amounts of the first current and the second current, and reads the first data.

8 Claims, 25 Drawing Sheets

(51) Int. Cl.
    *H01L 27/12*     (2006.01)
    *H01L 29/786*     (2006.01)
    *H10B 12/00*     (2023.01)

(52) U.S. Cl.
    CPC ...... *H01L 27/1225* (2013.01); *H01L 27/1255* (2013.01); *H01L 29/7869* (2013.01); *H01L 29/78648* (2013.01); *H10B 12/00* (2023.02)

(58) Field of Classification Search
    CPC ... G11C 2207/065; G11C 5/025; G11C 7/062; G11C 7/067; G11C 7/06; G11C 11/4091; H01L 27/1225; H01L 27/124; H01L 27/1255; H01L 29/78648; H01L 29/7869; H01L 29/78696; H10B 12/00; H10B 41/70
    USPC .............................................. 365/149, 189.09
    See application file for complete search history.

(56) References Cited

U.S. PATENT DOCUMENTS

| | | | |
|---|---|---|---|
| 9,634,097 B2 | 4/2017 | Rabkin et al. | |
| 10,388,364 B2 | 8/2019 | Ishizu et al. | |
| 10,453,532 B1* | 10/2019 | Antonyan | G11C 11/1673 |
| 10,943,646 B2 | 3/2021 | Ishizu et al. | |
| 11,586,778 B2* | 2/2023 | Giterman | G11C 7/222 |
| 2011/0065270 A1 | 3/2011 | Shim et al. | |
| 2015/0043279 A1 | 2/2015 | Yamauchi | |
| 2018/0075900 A1 | 3/2018 | Ishizu et al. | |
| 2018/0137913 A1* | 5/2018 | Kim | G11C 13/004 |
| 2018/0166131 A1* | 6/2018 | Chen | G11C 11/418 |
| 2018/0277201 A1* | 9/2018 | Hori | G11C 13/004 |
| 2019/0214059 A1* | 7/2019 | Po | G11C 16/28 |
| 2019/0287594 A1* | 9/2019 | Osada | G11C 11/1675 |
| 2019/0325976 A1* | 10/2019 | Ko | G11C 7/06 |
| 2020/0090723 A1* | 3/2020 | Katayama | G11C 11/1673 |
| 2020/0105327 A1* | 4/2020 | Gupta | G11C 11/1659 |
| 2020/0194085 A1* | 6/2020 | Hung | G11C 16/08 |
| 2020/0265883 A1* | 8/2020 | Hanyu | G11C 11/1673 |
| 2020/0286536 A1* | 9/2020 | Fukami | H01L 29/82 |
| 2021/0005808 A1* | 1/2021 | Sato | H10N 50/85 |

FOREIGN PATENT DOCUMENTS

| | | | | |
|---|---|---|---|---|
| JP | 60-070591 A | | 4/1985 | |
| JP | 02-009094 A | | 1/1990 | |
| JP | 2011-192329 A | | 9/2011 | |
| JP | 2018-152152 A | | 9/2018 | |
| JP | 2018163728 A | * | 10/2018 | ......... G11C 11/1655 |
| KR | 2019-0049785 A | | 5/2019 | |
| WO | WO-2013/153853 | | 10/2013 | |
| WO | WO-2016/181256 | | 11/2016 | |
| WO | WO-2018/047035 | | 3/2018 | |
| WO | WO-2021142681 A1 | * | 7/2021 | ......... G11C 11/1655 |

OTHER PUBLICATIONS

Written Opinion (Application No. PCT/IB2020/056325) dated Oct. 6, 2020.

Sheu.S et al., "A 4Mb Embedded SLC Resistive-RAM Macro with 7.2ns Read-Write Random-Access Time and 160ns MLC-Access Capability", ISSCC 2011 (Digest of Technical Papers, IEEE International Solid-State Circuits Conference), Feb. 20, 2011, pp. 200-202.

* cited by examiner

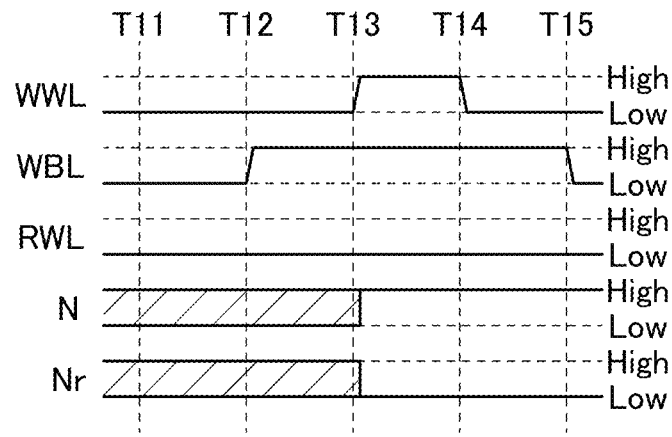
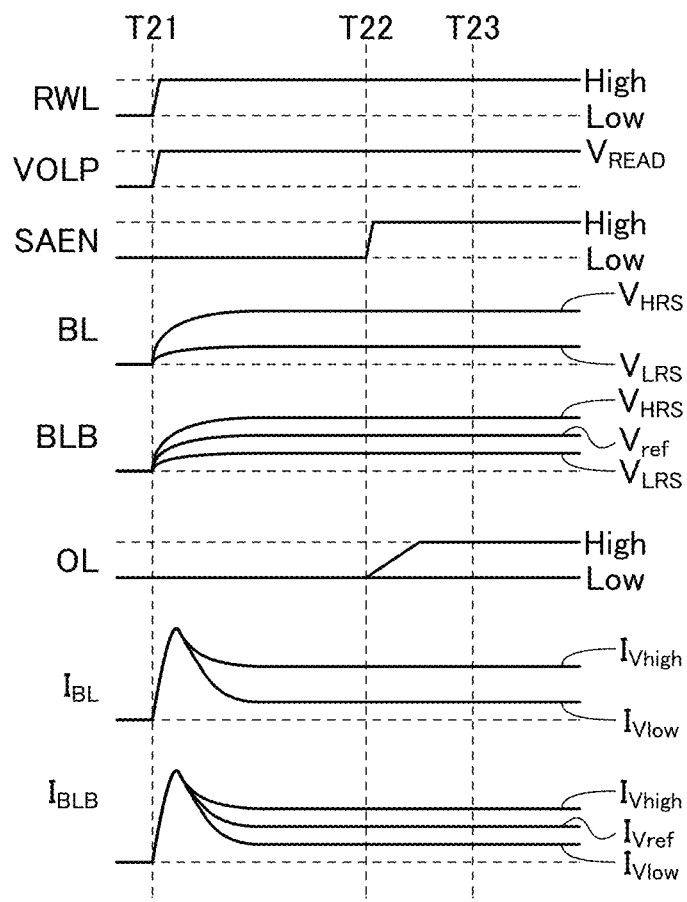

600A

600A

600A

FIG. 18A
|  | Intermediate state New crystalline phase | |
|---|---|---|
| Amorphous | Crystalline | Crystal |
| • completely amorphous | • CAAC<br>• nc<br>• CAC<br>excluding single crystal and poly crystal | • single crystal<br>• poly crystal |
FIG. 18B
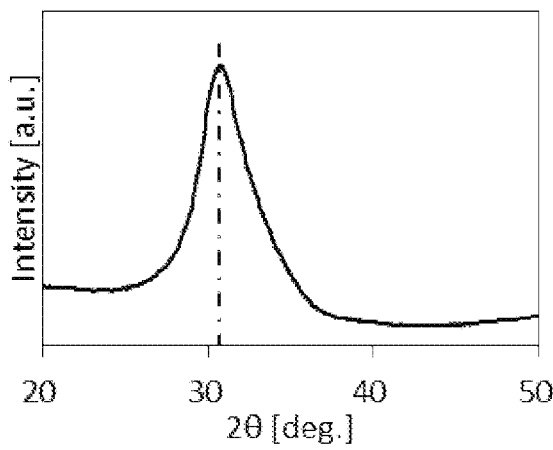
FIG. 18C
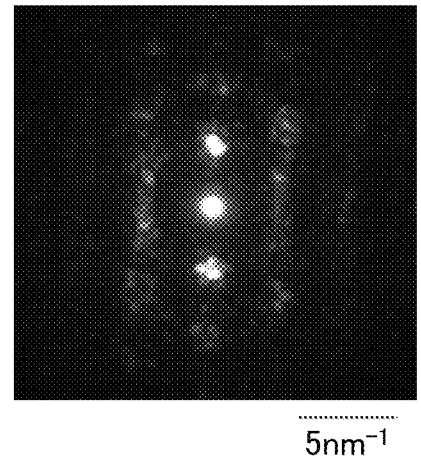

MEMORY DEVICE, SEMICONDUCTOR DEVICE, AND ELECTRONIC DEVICE

TECHNICAL FIELD

One embodiment of the present invention relates to a memory device, a semiconductor device, and an electronic device.

Note that one embodiment of the present invention is not limited to the above technical field. The technical field of the invention disclosed in this specification and the like relates to an object, an operation method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

In recent years, with an increasing amount of data to process, a semiconductor device having a larger storage capacity has been required. To increase storage capacity per unit area, stacking memory cells is effective (see Patent Document 1, Patent Document 2, and Patent Document 3). Stacking memory cells can increase storage capacity per unit area in accordance with the number of stacked memory cells.

Examples of a method for reading data stored in a memory device include a voltage sensing amplifier (VSA) and a current sensing amplifier (CSA). When a semiconductor device has large memory capacity, the current sensing amplifier is more preferable than the voltage sensing amplifier as the data reading method in some cases. For example, when a large number of memory cells are electrically connected to one bit line, there is a large load (e.g., parasitic capacitance) on the bit line; thus, in the case of using the voltage sensing amplifier, it takes a long time to precharge the bit line with a certain potential and to perform discharging to the bit line, resulting in a long waiting time until the bit line reaches a potential that can be determined. By contrast, in the case of using the current sensing amplifier, high-speed data reading can be performed even when there is a large load on the bit line. Non-Patent Document 1 discloses a relationship between the number of memory cells electrically connected to a bit line and access time in each case of using a voltage sensing amplifier and a plurality of kinds of current sensing amplifiers. Non-Patent Document 1 discloses that the access time is shorter in the case of using the current sensing amplifiers than in the case of using the voltage sensing amplifier when the number of memory cells connected to the bit line is larger than or equal to 128.

REFERENCES

Patent Documents

[Patent Document 1] United States Patent Application Publication No. 2011/0065270
[Patent Document 2] U.S. Pat. No. 9,634,097
[Patent Document 3] U.S. Pat. No. 9,177,872

Non-Patent Document

[Non-Patent Document 1] Shyh-Shyuan Sheu, et. al., ISSCC Dig. Tech. Papers, pp. 200-202, 2011.

SUMMARY OF THE INVENTION

Problems to be Solved by the Invention

In a memory device, larger amount of data to process, for example, a larger number of memory cells electrically connected to one bit line, tends to increase the access time. As for the data reading method, the access time is sometimes shorter in the case of using the current sensing amplifier than in the case of using the voltage sensing amplifier, whereas power consumption in data reading is sometimes larger in the case of using the current sensing amplifier than in the case of using the voltage sensing amplifier.

An object of one embodiment of the present invention is to provide a memory device with shortened access time in data reading. Another object of one embodiment of the present invention is to provide a memory device with reduced power consumption. Another object of one embodiment of the present invention is to provide a memory device with a reduced circuit area.

Another object of one embodiment of the present invention is to provide a novel semiconductor device and the like. Another object of one embodiment of the present invention is to provide an electronic device including the semiconductor device.

Note that the objects of one embodiment of the present invention are not limited to the objects listed above. The objects listed above do not preclude the existence of other objects. Note that the other objects are objects that are not described in this section and are described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a memory device including a first layer and a second layer positioned above the first layer. The first layer includes a reading circuit, and the second layer includes a first memory cell and a second memory cell. A transistor included in the reading circuit contains silicon in a channel formation region, and a transistor included in the first memory cell and a transistor included in the second memory cell each include a metal oxide in a channel formation region. The first memory cell is electrically connected to the reading circuit through a first wiring, and the second memory cell is electrically connected to the reading circuit through a second wiring. When a first current corresponding to first data retained in the first memory cell flows from the reading circuit to the first memory cell and a second current corresponding to second data retained in the second memory cell flows from the reading circuit to the second memory cell, the reading circuit has a function of reading the first data in accordance with a magnitude relationship between the first current and the second current.

(2)

In the above structure (1), the reading circuit may include a first transistor and a second transistor. As a specific connection structure, a first terminal of the first transistor is electrically connected to the first wiring, and a first terminal of the second transistor is electrically connected to the second wiring. Note that the first transistor and the second transistor are preferably n-channel transistors.

(3)

In the above structure (2), the reading circuit may include a third transistor, a fourth transistor, a fifth transistor, a sixth transistor, a seventh transistor, an eighth transistor, a ninth transistor, a tenth transistor, and a first circuit. As a specific connection structure, a second terminal of the first transistor is electrically connected to a first terminal of the third transistor, a first terminal of the fifth transistor, a gate of the fifth transistor, and a gate of the seventh transistor. A first terminal of the seventh transistor is electrically connected to a first terminal of the ninth transistor and an input terminal of the first circuit. A second terminal of the second transistor is electrically connected to a first terminal of the fourth transistor, a first terminal of the sixth transistor, a gate of the sixth transistor, and a gate of the eighth transistor. A first terminal of the eighth transistor is electrically connected to a first terminal of the tenth transistor, a gate of the tenth transistor, and a gate of the ninth transistor. Note that the ninth transistor and the tenth transistor are preferably n-channel transistors, and the third transistor, the fourth transistor, the fifth transistor, the sixth transistor, the seventh transistor, and the eighth transistor are preferably p-channel transistors. The first circuit has a function of outputting a reading potential of the first data from an output terminal of the first circuit in accordance with a first potential of the input terminal of the first circuit. Note that the first potential is a potential based on the first current and the second current.

(4)

In the above structure (1), the reading circuit may include a third transistor, a fourth transistor, a fifth transistor, a sixth transistor, a seventh transistor, an eighth transistor, a ninth transistor, a tenth transistor, and a first circuit. As a specific connection structure, a first terminal of the third transistor is electrically connected to the first wiring, a first terminal of the fifth transistor, a gate of the fifth transistor, and a gate of the seventh transistor. A first terminal of the seventh transistor is electrically connected to a first terminal of the ninth transistor and an input terminal of the first circuit. A first terminal of the fourth transistor is electrically connected to the second wiring, a first terminal of the sixth transistor, a gate of the sixth transistor, and a gate of the eighth transistor. A first terminal of the eighth transistor is electrically connected to a first terminal of the tenth transistor, a gate of the tenth transistor, and a gate of the ninth transistor. Note that the ninth transistor and the tenth transistor are preferably n-channel transistors, and the third transistor, the fourth transistor, the fifth transistor, the sixth transistor, the seventh transistor, and the eighth transistor are preferably p-channel transistors. The first circuit has a function of outputting a reading potential of the first data from an output terminal of the first circuit in accordance with a first potential of the input terminal of the first circuit. Note that the first potential is a potential based on the first current and the second current.

(5)

In any of the above structures (1) to (4), the first memory cell may include an eleventh transistor, a twelfth transistor, a thirteenth transistor, and a first capacitor. The second memory cell may include a fourteenth transistor, a fifteenth transistor, a sixteenth transistor, and a second capacitor. As a specific connection structure, a gate of the eleventh transistor is electrically connected to a first terminal of the twelfth transistor and a first terminal of the first capacitor, a first terminal of the eleventh transistor is electrically connected to a first terminal of the thirteenth transistor, and a second terminal of the thirteenth transistor is electrically connected to the first wiring. A gate of the fourteenth transistor is electrically connected to a first terminal of the fifteenth transistor and a first terminal of the second capacitor, a first terminal of the fourteenth transistor is electrically connected to a first terminal of the sixteenth transistor, and a second terminal of the sixteenth transistor is electrically connected to the second wiring.

(6)

In any of the above structures (1) to (4), the first memory cell may include an eleventh transistor, a twelfth transistor, and a first capacitor. The second memory cell may include a fourteenth transistor, a fifteenth transistor, and a second capacitor. As a specific connection structure, a gate of the eleventh transistor is electrically connected to a first terminal of the twelfth transistor and a first terminal of the first capacitor, and a first terminal of the eleventh transistor is electrically connected to the first wiring. A gate of the fourteenth transistor is electrically connected to a first terminal of the fifteenth transistor and a first terminal of the second capacitor, and a first terminal of the fourteenth transistor is electrically connected to the second wiring.

(7)

Another embodiment of the present invention is a semiconductor device including the memory device having any of the above structures (1) to (6) and a processor. Note that the processor is preferably included in the first layer.

(8)

Another embodiment of the present invention is an electronic device including the memory device having any one of the above structures (1) to (6) and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves are semiconductor devices, or include semiconductor devices in some cases.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow(s) electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether a current flows or not.

For example, in the case where X and Y are functionally connected, one or more circuits that allow(s) functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For example, even when another circuit is interposed between X and Y, X and Y are regarded as being functionally connected when a signal output from X is transmitted to Y.

Note that an explicit description, X and Y are electrically connected, includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor" can be, for example, a circuit element or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be replaced with the terms "resistance", "load", "region having a resistance value", and the like; inversely, the terms "resistance", "load", and "region having a resistance value" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9$Ω.

In this specification and the like, a "capacitor" can be, for example, a circuit element having an electrostatic capacitance value higher than 0 F, a region of a wiring having an electrostatic capacitance value, parasitic capacitance, or gate capacitance of a transistor. Therefore, in this specification and the like, a "capacitor" sometimes includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; inversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. Alternatively, the electrostatic capacitance value may be greater than or equal to 1 pF and less than or equal to 10 μF, for example.

In this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be replaced with each other in this specification and the like. In this specification and the like, expressions "one of a source and a drain" (or a first electrode or a first terminal) and "the other of the source and the drain" (or a second electrode or a second terminal) are used in description of the connection relationship of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, "voltage" and "potential" can be replaced with each other as appropriate. The "voltage" refers to a potential difference from a reference potential, and when the reference potential is a ground potential, for example, the "voltage" can be replaced with the "potential". Note that the ground potential does not necessarily mean 0 V. Moreover, potentials are relative values, and a potential supplied to a wiring, a potential applied to a circuit and the like, a potential output from a circuit and the like, for example, are changed with a change of the reference potential.

In this specification and the like, the term "high-level potential" or "low-level potential" does not mean a particular potential. For example, in the case where two wirings are both described as "functioning as a wiring for supplying a high-level potential", the levels of the high-level potentials supplied by the wirings are not necessarily equal to each other. Similarly, in the case where two wirings are both described as "functioning as a wiring for supplying a low-level potential", the levels of the low-level potentials supplied by the wirings are not necessarily equal to each other.

Note that "current" is a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with a positive charge moves, and the amount of current is expressed as a positive value. In other words, the direction in which a carrier with a negative charge moves is opposite to the direction of a current, and the amount of current is expressed as a negative value. Thus, in the case where the polarity of a current (or the direction of a current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. Furthermore, in this specification and the like, for example, a "first" component in one embodiment can be omitted in other embodiments or the scope of claims.

In this specification and the like, the terms for describing positioning, such as "over" or "above" and "under" or "below", are sometimes used for convenience to describe the positional relationship between components with reference to drawings. The positional relationship between components is changed as appropriate in accordance with a direction in which the components are described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" or "above" and "under" or "below" do not necessarily mean that a component is placed directly over or directly under and in direct contact with another component. For example, the expression "electrode B over insulating layer A" does not necessarily mean that the electrode B is formed over and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Inversely, the term "signal line", "power supply line", or the like can be changed into the term "wiring" in some cases. The term "power supply line" or the like can be changed into the term "signal line" or the like in some cases. Inversely, "signal line" or the like can be changed into the term "power supply line" or the like in some cases. The term "potential" that is applied to a wiring can be changed into the term "signal" or the like depending on the case or according to circumstances. Inversely, the term "signal" or the like can be changed into the term "potential" in some cases.

In this specification and the like, an impurity in a semiconductor refers to an element other than a main component of a semiconductor layer, for example. For example, an element with a concentration of lower than 0.1 atomic % is an impurity. When an impurity is contained, for example, the density of defect states in a semiconductor may be increased, the carrier mobility may be decreased, or the crystallinity may be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include oxygen, Group 1 elements except hydrogen, Group 2 elements, Group 13 elements, and Group 15 elements.

In this specification and the like, a switch has a function of being in a conduction state (on state) or a non-conduction state (off state) to determine whether a current flows or not. Alternatively, a switch has a function of selecting and changing a current path. For example, an electrical switch or a mechanical switch can be used. That is, a switch can be any element capable of controlling a current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical system) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, the term "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

According to one embodiment of the present invention, a memory device with shortened access time in data reading can be provided. According to another embodiment of the present invention, a memory device with reduced power consumption can be provided. According to another embodiment of the present invention, a memory device with a reduced circuit area can be provided.

According to another embodiment of the present invention, a novel semiconductor device and the like can be provided. According to another embodiment of the present invention, an electronic device including the semiconductor device can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the descriptions of the specification, the drawings, and the like and can be extracted from these descriptions by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 4A and FIG. 4B are timing charts showing operation examples of a memory device.

FIG. 18A is a diagram showing classifications of crystal structures of IGZO, FIG. 18B is a diagram showing an XRD spectrum of crystalline IGZO, and FIG. 18C is a diagram showing nanobeam electron diffraction patterns of the crystalline IGZO.

MODE FOR CARRYING OUT THE INVENTION

Figure 1:
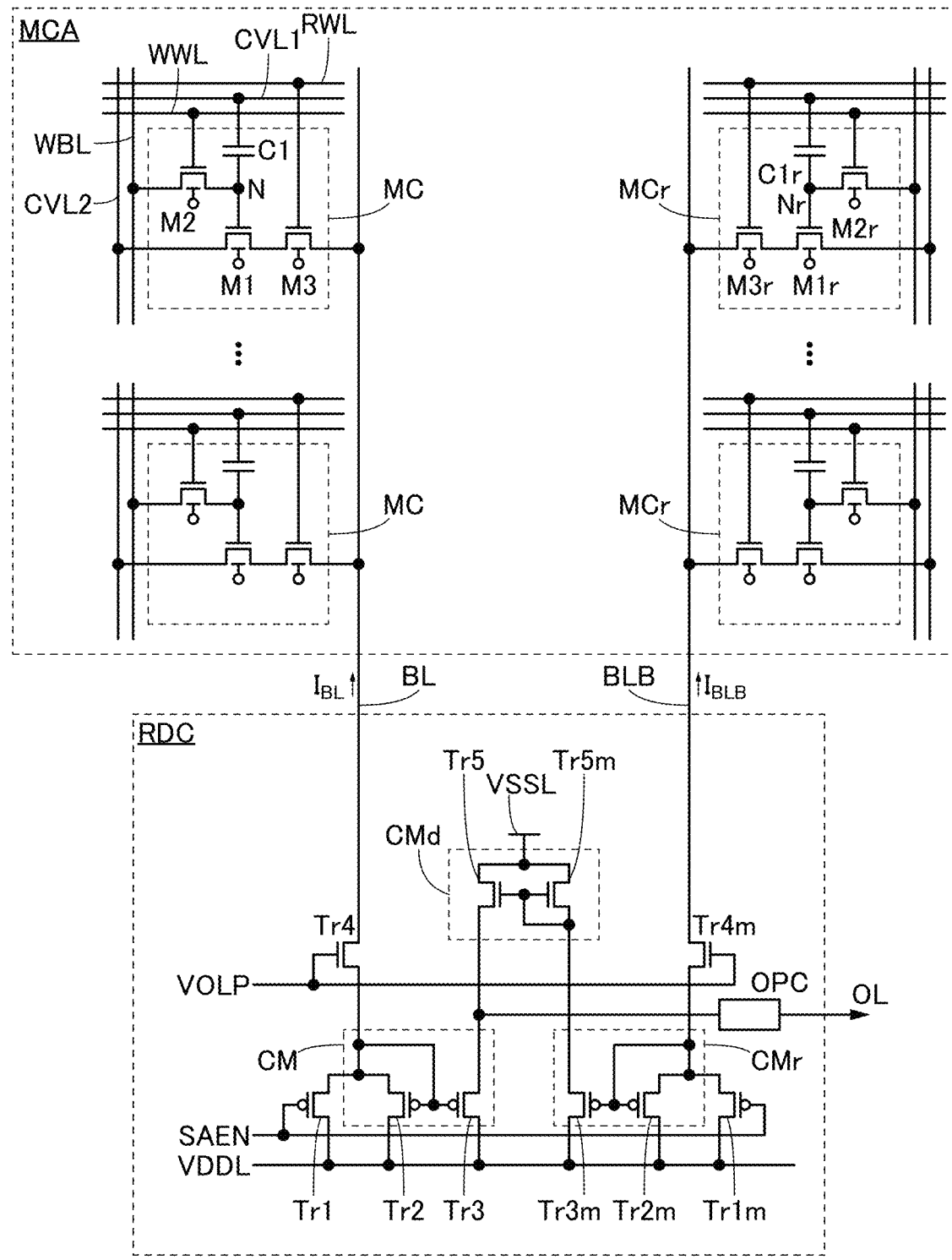
FIG. 1 is a circuit diagram illustrating an example of a memory device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

Furthermore, in this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) described in the embodiment and a content (or part of the content) described in one or a plurality of different embodiments.

Note that in each embodiment (or the example), a content described in the embodiment is a content described with reference to a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes or values shown in the drawings. For example, variations in signal, voltage, or current due to noise, variations in signal, voltage, or current due to difference in timing, or the like can be included.

Embodiment 1

In this embodiment, a structure example of a memory device of one embodiment of the present invention and operation examples of the memory device are described.

Structure Example 1

FIG. 1 is a circuit diagram illustrating the structure example of the memory device of one embodiment of the present invention. A memory device 100 includes a memory cell array MCA and a reading circuit RDC, for example.

The memory cell array MCA includes a plurality of memory cells MC and a plurality of memory cells MCr, for example. In particular, the memory cell MCr functions as a reference memory cell of the memory cell MC. Note that the memory cell MC may function as a reference memory cell of the memory cell MCr. The memory cell MC and the memory cell MCr are examples of a RAM called a NOSRAM (Nonvolatile Oxide Semiconductor Random Access Memory) (registered trademark), and function as gain-cell memory cells.

In the memory device 100 in FIG. 1, when 1-bit data is written to the memory cell MC, for example, data with the inverted logic of the data is written to the memory cell MCr. Note that reference data may be written to the memory cell MCr regardless of the data written to the memory cell MC.

The memory cell MC includes a transistor M1 to a transistor M3 and a capacitor C1, for example.

In the memory cell MC, a first terminal of the transistor M1 is electrically connected to a wiring CVL2, a second terminal of the transistor M1 is electrically connected to a first terminal of the transistor M3, and a gate of the transistor M1 is electrically connected to a first terminal of the transistor M2 and a first terminal of the capacitor C1. A second terminal of the transistor M2 is electrically connected to a wiring WBL, and a gate of the transistor M2 is electrically connected to a wiring WWL. A second terminal of the capacitor C1 is electrically connected to a wiring CVL1. A second terminal of the transistor M3 is electrically connected to a wiring BL, and a gate of the transistor M3 is electrically connected to a wiring RWL.

In the memory device 100 in FIG. 1, the electrical connection point of the gate of the transistor M1, the first terminal of the transistor M2, and the first terminal of the capacitor C1 is a node N.

The wiring BL functions as a wiring for supplying data stored in the memory cell MC to the reading circuit RDC. That is, the wiring BL is sometimes referred to as a read bit line or the like.

The wiring WWL functions as a control wiring for switching an on state and an off state of the transistor M2. Since the transistor M2 functions as a write transistor in the memory cell MC, the wiring WWL is sometimes referred to as a write word line or the like.

The wiring RWL functions as a control wiring for switching an on state and an off state of the transistor M3. Since electrical continuity is established between the second terminal of the transistor M1 and the wiring BL when the transistor M3 is in an on state, the wiring RWL is sometimes referred to as a read word line or the like.

The wiring WBL functions as a wiring for supplying data to be written to the memory cell MC. That is, the wiring WBL is sometimes referred to as a write bit line or the like.

The wiring CVL1 functions as a wiring for supplying a constant voltage. The constant voltage can be a ground potential or a low-level potential, for example. In this embodiment, the wiring CVL1 functions a wiring for supplying a low-level potential.

The wiring CVL2 functions as a wiring for supplying a constant voltage. The constant voltage can be a ground potential, a low-level potential, or a high-level potential, for example. In this embodiment, the wiring CVL2 functions as a wiring for supplying a low-level potential.

In the memory device 100 in FIG. 1, the memory cell MCr has a structure similar to that of the memory cell MC. Thus, "r" is added to the reference numerals of the circuit elements and the like included in the memory cell MCr to differentiate them from the circuit elements and the like included in the memory cell MC. That is, the memory cell MCr includes a transistor M1r, a transistor M2r, a transistor M3r, and a capacitor C1r.

In FIG. 1, the wiring BL is illustrated as the read bit line of the memory cell MC, and a wiring BLB is illustrated as a read bit line of the memory cell MCr. In the memory cell MCr, a second terminal of the transistor M3r is electrically connected to the wiring BLB.

The read circuit RDC has a function of reading data stored in the memory cell MC electrically connected to the wiring BL.

The reading circuit RDC includes a transistor Tr1 to a transistor Tr5, a transistor Tr1m to a transistor Tr5m, and a circuit OPC, for example. In particular, in the memory device 100 in FIG. 1, the transistor Tr1 to the transistor Tr3 and the transistor Tr1m to the transistor Tr3m are p-channel transistors, and the transistor Tr4, the transistor Tr5, the transistor Tr4m, and the transistor Tr5m are n-channel transistors.

FIG. 1 illustrates a current $I_{BL}$ flowing to the wiring BL that electrically connects the reading circuit RDC and the memory cell array MCA, and a current $I_{BLB}$ flowing to the wiring BLB that electrically connects the reading circuit RDC and the memory cell array MCA.

A first terminal of the transistor Tr1 is electrically connected to a first terminal of the transistor Tr2, a gate of the transistor Tr2, a gate of the transistor Tr3, and a first terminal of the transistor Tr4. A second terminal of the transistor Tr1 is electrically connected to a wiring VDDL, and a gate of the transistor Tr1 is electrically connected to a wiring SAEN. A second terminal of the transistor Tr2 is electrically connected to the wiring VDDL. A second terminal of the transistor Tr4 is electrically connected to the wiring BL, and a gate of the transistor Tr4 is electrically connected to a wiring VOLP. A first terminal of the transistor Tr3 is electrically connected to a first terminal of the transistor Tr5 and an input terminal of the circuit OPC, and a second terminal of the transistor Tr3 is electrically connected to the wiring VDDL. An output terminal of the circuit OPC is electrically connected to a wiring OL.

A first terminal of the transistor Tr1m is electrically connected to a first terminal of the transistor Tr2m, a gate of the transistor Tr2m, a gate of the transistor Tr3m, and a first terminal of the transistor Tr4m. A second terminal of the transistor Tr1m is electrically connected to the wiring VDDL, and a gate of the transistor Tr1m is electrically connected to the wiring SAEN. A second terminal of the transistor Tr2m is electrically connected to the wiring VDDL. A second terminal of the transistor Tr4m is electrically connected to the wiring BLB, and a gate of the transistor Tr4m is electrically connected to the wiring VOLP. A first terminal of the transistor Tr3m is electrically connected to a first terminal of the transistor Tr5m, a gate of the transistor Tr5, and a gate of the transistor Tr5m, and a second terminal of the transistor Tr3m is electrically connected to the wiring VDDL.

A second terminal of the transistor Tr5 is electrically connected to a second terminal of the transistor Tr5m and a wiring VSSL.

The wiring VDDL functions as a wiring for supplying a constant voltage. The constant voltage can be a high-level potential, for example.

The wiring VSSL functions as a wiring for supplying a constant voltage. The constant voltage can be a ground potential or a low-level potential, for example.

The wiring SAEN functions as a wiring for transmitting an enable signal to the reading circuit RDC. For example, in the memory device 100, the reading circuit RDC is brought into a disable state and does not perform reading operation when a high-level potential is supplied to the wiring SAEN, and the reading circuit RDC is brought into an enable state and performs reading operation when a low-level potential is supplied to the wiring SAEN.

The wiring VOLP will be described in an operation example later.

In the memory device 100 in FIG. 1, a current mirror circuit CM is configured with the transistor Tr2 and the transistor Tr3. Similarly, a current mirror circuit CMr is configured with the transistor Tr2m and the transistor Tr3m, and a current mirror circuit CMd is configured with the transistor Tr5 and the transistor Tr5m.

The circuit OPC has a function of outputting a potential corresponding to a potential input to the input terminal of the circuit OPC, from the output terminal of the circuit OPC. The circuit OPC may have a function of, for example, converting an analog potential input to the input terminal of the circuit OPC into a digital voltage that is a high-level potential or a low-level potential, and outputting the digital voltage from the output terminal of the circuit OPC. In this case, the circuit OPC may include a comparator, for example.

The circuit OPC may have a function of outputting a voltage corresponding to the amount of current flowing to the input terminal of the circuit OPC, from the output terminal of the circuit OPC to the wiring OL. In this case, the circuit OPC includes a current-voltage converter circuit, for example. Note that the voltage corresponds to data read from the memory cell MC. Therefore, for example, in the case where 1-bit data is written in the memory cell MC, the voltage can be one of a high-level potential and a low-level potential; thus, the circuit OPC may include a comparator, for example.

FIG. 1 employs a structure in which the input terminal of the circuit OPC is electrically connected to the first terminal of the transistor Tr5 and the first terminal of the transistor Tr3; however, depending on the circuit structure of the circuit OPC, a structure may be employed in which another input terminal is additionally provided for the circuit OPC and the input terminal is electrically connected to the first terminal of the transistor Tr5m and the first terminal of the transistor Tr3m (not illustrated).

Here, specific examples of the circuit structure of the circuit OPC are described. The circuit OPC can have a structure illustrated in FIG. 2A, for example. The circuit OPC illustrated in FIG. 2A includes a transistor Tr6, a load LE2, and a comparator CMP, for example.

Figure 2A:
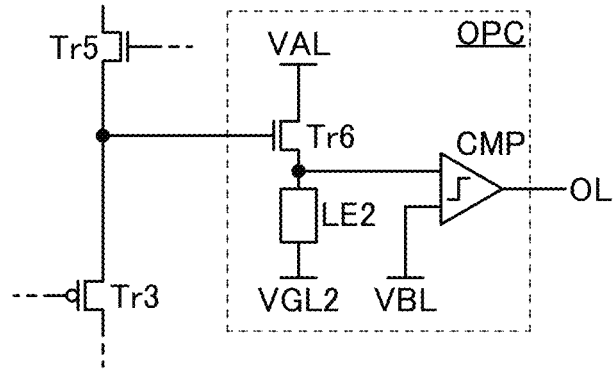
FIG. 2A to FIG. 2D are circuit diagrams illustrating examples of a circuit included in a memory device.

In FIG. 2A, the load LE2 can be a resistor, a capacitor, a diode, or a transistor, for example.

FIG. 2A also illustrates the transistor Tr3, the transistor Tr5, and the wiring OL to show the connection structure between the circuit OPC and peripheral circuits.

A gate of the transistor Tr6 is electrically connected to the first terminal of the transistor Tr3 and the first terminal of the transistor Tr5. That is, the gate of the transistor Tr6 is electrically connected to the input terminal of the circuit OPC. A first terminal of the transistor Tr6 is electrically connected to a first terminal of the load LE2 and a first terminal of the comparator CMP, and a second terminal of the transistor Tr6 is electrically connected to a wiring VAL. An output terminal of the comparator CMP is electrically connected to the wiring OL. That is, the output terminal of the comparator CMP is electrically connected to the output terminal of the circuit OPC.

A second terminal of the load LE2 is electrically connected to a wiring VGL2. A second terminal of the comparator CMP is electrically connected to a wiring VBL.

The wiring VGL2 functions as a wiring for supplying a constant voltage. The constant voltage can be a low-level potential or a ground potential, for example.

The wiring VAL functions as a wiring for supplying a constant voltage. The constant voltage can be a high-level potential, for example.

The wiring VBL functions as a wiring for supplying a constant voltage. The constant voltage can be a reference potential supplied to the comparator CMP, for example.

The circuit OPC in FIG. 2A includes a source follower circuit composed of the transistor Tr6 and the load LE2. When a potential of the first terminal of the transistor Tr3 and the first terminal of the transistor Tr5 is input to the gate of the transistor Tr6, a potential of the first terminal of the transistor Tr6 (the first terminal of the load LE2) becomes almost equal to the potential of the gate of the transistor Tr6. Accordingly, in the circuit OPC, a potential that is almost equal to a potential input to the input terminal of the circuit OPC can be input to the first terminal of the comparator CMP.

The comparator CMP compares the potential input to the first terminal of the comparator CMP and the reference potential input from the wiring VBL, and outputs a high-level potential or a low-level potential from the output terminal of the comparator CMP. The potential output from the output terminal of the comparator CMP can be processed as a potential corresponding to data read from the memory cell MC.

Figure 2B:
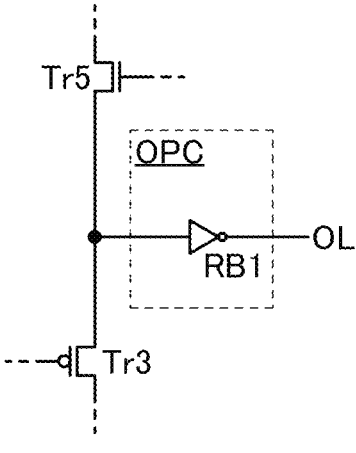

The circuit OPC can have a structure illustrated in FIG. 2B, for example. The circuit OPC illustrated in FIG. 2B includes a NOT circuit RB1, for example. An input terminal of the NOT circuit RB1 is electrically connected to the first terminal of the transistor Tr3 and the first terminal of the transistor Tr5. That is, the input terminal of the NOT circuit RB1 is electrically connected to the input terminal of the circuit OPC. An output terminal of the NOT circuit RB1 is electrically connected to the wiring OL. That is, the output terminal of the NOT circuit RB1 is electrically connected to the output terminal of the circuit OPC.

The circuit OPC in FIG. 2B is a circuit in which a potential corresponding to a current flowing through the transistor Tr3 and the transistor Tr5 is input as an input potential to the NOT circuit, and an output potential is obtained from the NOT circuit.

Figure 2C:
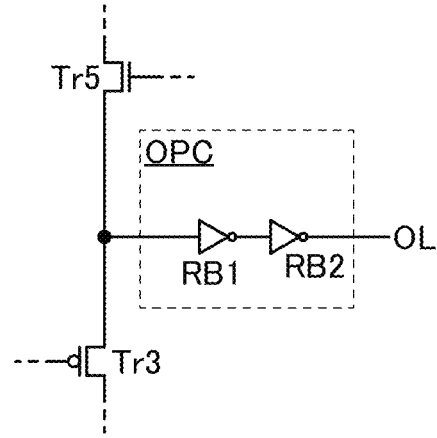

As in the circuit OPC in FIG. 2C, a structure may be employed in which a NOT circuit RB2 is additionally provided in the circuit OPC in FIG. 2B and the NOT circuit RB1 and the NOT circuit RB2 are connected in series. To obtain a potential with the inverted logic of the output potential of the circuit OPC in FIG. 2B, the circuit OPC in FIG. 2C is suitably used.

Figure 2D:
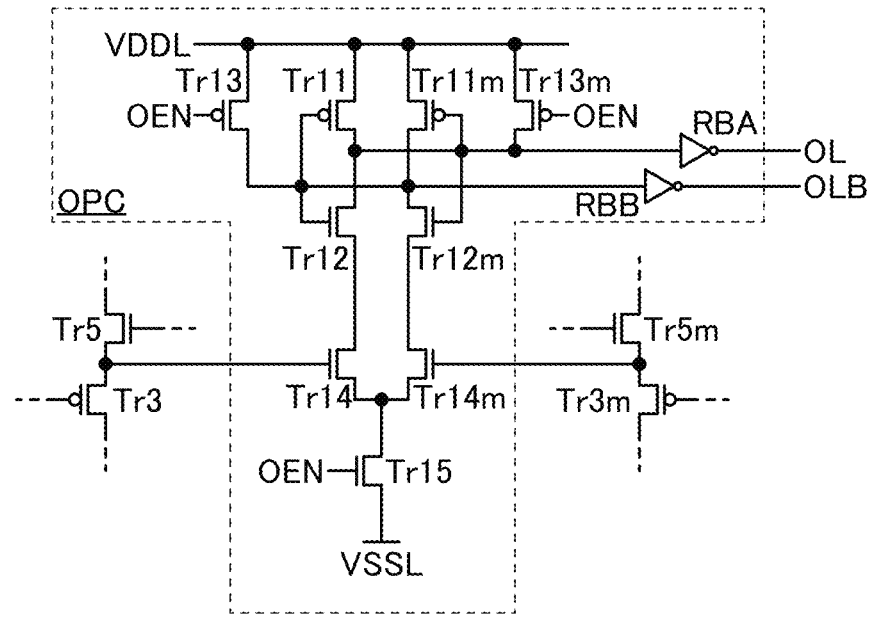

The circuit OPC can have a structure illustrated in FIG. 2D, for example. The circuit OPC illustrated in FIG. 2D includes a transistor Tr11 to a transistor Tr15, a transistor Tr11m to a transistor Tr14m, a NOT circuit RBA, and a NOT circuit RBB, for example. The circuit OPC in FIG. 2D has two input terminals; one of the input terminals is electrically connected to the first terminal of the transistor Tr5 and the first terminal of the transistor Tr3, and the other of the input terminals is electrically connected to the first terminal of the transistor Trym and the first terminal of the transistor Tr3m. The circuit OPC in FIG. 2D includes two output terminals; an output terminal of the NOT circuit RBA is electrically connected to the wiring OL, and an output terminal of the NOT circuit RBB is electrically connected to a wiring OLB. That is, the output terminal of the NOT circuit RBA is electrically connected to one of the output terminals of the circuit OPC, and the output terminal of the NOT circuit RBB is electrically connected to the other of the output terminals of the circuit OPC. Note that like the wiring OL, the wiring OLB functions as a wiring for transmitting a potential output from the circuit OPC.

A first terminal of the transistor Tr11 is electrically connected to a first terminal of the transistor Tr12, a gate of the transistor Tr11m, a gate of the transistor Tr12m, a first terminal of the transistor Tr13m, and an input terminal of the NOT circuit RBA. A first terminal of the transistor Tr11m is electrically connected to a first terminal of the transistor Tr12m, a gate of the transistor Tr11, a gate of the transistor Tr12, a first terminal of the transistor Tr13, and an input terminal of the NOT circuit RBB. A second terminal of the transistor Tr12 is electrically connected to a first terminal of the transistor Tr14. A second terminal of the transistor Tr12m is electrically connected to a first terminal of the transistor Tr14m. A second terminal of the transistor Tr14 and a second terminal of the transistor Tr14m are electrically connected to a first terminal of the transistor Tr15. A gate of the transistor Tr14 is electrically connected to one of the input terminals of the circuit OPC, and a gate of the transistor Tr14m is electrically connected to the other of the input terminals of the circuit OPC. A second terminal of the transistor Tr15 is electrically connected to the wiring VSSL, and a gate of the transistor Tr15 is electrically connected to a wiring OEN. Second terminals of the transistor Tr11, the transistor Tr11m, the transistor Tr13, and the transistor Tr13m are electrically connected to the wiring VDDL. A gate of the transistor Tr13 and a gate of the transistor Tr13m are each electrically connected to the wiring OEN.

With the above-described connection structure, the circuit OPC includes an inverter loop circuit composed of the transistor Tr11, the transistor Tr11m, the transistor Tr12, and the transistor Tr12m.

The wiring OEN functions as a wiring for transmitting a signal (e.g., a low-level potential or a high-level potential) for driving the circuit OPC.

For example, when a low-level potential is input to the wiring OEN, the transistor Tr13 and the transistor Tr13m are brought into an on state, and the transistor Tr15 is brought into an off state. At this time, a constant voltage (a high-level potential here) supplied by the wiring VDDL is input to the gates of the transistor Tr11, the transistor Tr12, the transistor Tr11m, and the transistor Tr12m. Accordingly, the transistor Tr11 and the transistor Tr11m are brought into an off state, and the transistor Tr12 and the transistor Tr12m are brought into an on state. Thus, a current flows from the wiring VDDL to the second terminal of the transistor Tr12 through the transistor Tr13m, and a current flows from the wiring VDDL to the second terminal of the transistor Tr12m through the transistor Tr13. In addition, since the transistor Tr15 is in an off state, the second terminals of the transistor Tr12 and the transistor Tr12m are charged to a predetermined potential. A potential of the second terminal of the transistor Tr12 becomes lower than the constant voltage supplied by the wiring VDDL by a threshold voltage of the transistor Tr12, for example, and a potential of the second terminal of the transistor Tr12m becomes lower than the high-level potential supplied by the wiring VDDL by a threshold voltage of the transistor Tr12m, for example. In addition, since the transistor Tr13m is in an on state, the circuit OPC can output a low-level potential from one of the output terminals of the circuit OPC to the wiring OL. In addition, since the transistor Tr13 is in an on state, the circuit OPC can output a low-level potential from the other of the output terminals of the circuit OPC to the wiring OLB.

Next, the potential of the wiring OEN is changed from a low-level potential to a high-level potential, so that the transistor Tr13 and the transistor Tr13m are brought into an off state and the transistor Tr15 is brought into an on state.

In the circuit OPC in FIG. 2D, the transistor Tr14 and the transistor Tr14m function as a differential pair. Thus, potentials of the second terminals of the transistor Tr12 and the transistor Tr12m change in accordance with potentials of the gates of the transistor Tr14 and the transistor Tr14m.

For example, when the potential of the gate of the transistor Tr14 is higher than the potential of the gate of the transistor Tr14m, the potential of the second terminal of the transistor Tr12 is lower than the potential of the second terminal of the transistor Tr12m. Thus, a potential between the first terminal of the transistor Tr11 and the first terminal of the transistor Tr12 becomes lower than a potential between the first terminal of the transistor Tr11m and the first terminal of the transistor Tr12m. Then, the above-described inverter loop circuit operates such that the transistor Tr12 is brought into an on state and the transistor Tr12m is brought into an off state. As a result, the potential between the first terminal of the transistor Tr11 and the first terminal of the transistor Tr12 is input to the input terminal of the NOT circuit RBA; thus, the circuit OPC can output a high-level potential from one of the output terminals of the circuit OPC to the wiring OL. Since the potential between the first terminal of the transistor Tr11m and the first terminal of the transistor Tr12m is input to the input terminal of the NOT circuit RBB, the circuit OPC can output a low-level potential from the other of the output terminals of the circuit OPC to the wiring OLB.

As another example, when the potential of the gate of the transistor Tr14 is lower than the potential of the gate of the transistor Tr14m, the potential of the second terminal of the transistor Tr12 is higher than the potential of the second terminal of the transistor Tr12m. Thus, the potential between the first terminal of the transistor Tr11 and the first terminal of the transistor Tr12 becomes higher than the potential between the first terminal of the transistor Tr11m and the first terminal of the transistor Tr12m. Then, the above-described inverter loop circuit operates such that the transistor Tr12 is brought into an off state and the transistor Tr12m is brought into an on state. As a result, the potential between the first terminal of the transistor Tr11 and the first terminal of the transistor Tr12 is input to the input terminal of the NOT circuit RBA; thus, the circuit OPC can output a low-level potential from one of the output terminals of the circuit OPC to the wiring OL. Since the potential between the first terminal of the transistor Tr11m and the first terminal of the transistor Tr12m is input to the input terminal of the NOT circuit RBB, the circuit OPC can output a high-level potential from the other of the output terminals of the circuit OPC to the wiring OLB.

Here, the structure of the reading circuit RDC and the magnitude of the current $I_{BL}$ and the current $I_{BLB}$ are considered. When the current $I_{BLB}$ is larger than the current $I_{BL}$, the potential of the first terminal of the transistor Tr5 and the first terminal of the transistor Tr3 is lower than the potential of the first terminal of the transistor Tr5m and the first terminal of the transistor Tr3m. When the current $I_{BLB}$ is smaller than the current $I_{BL}$, the potential of the first terminal of the transistor Tr5 and the first terminal of the transistor Tr3 is higher than the potential of the first terminal of the transistor Tr5m and the first terminal of the transistor Tr3m.

Thus, when the potential of the gate of the transistor Tr14 is lower than the potential of the gate of the transistor Tr14m, i.e., when the current $I_{BLB}$ is larger than the current $I_{BL}$, the circuit OPC in FIG. 2D can output a low-level potential from one of the output terminals of the circuit OPC to the wiring OL and output a high-level potential from the other of the output terminals of the circuit OPC to the wiring OLB by changing the potential of the wiring OEN from a low-level potential to a high-level potential. Meanwhile, when the potential of the gate of the transistor Tr14 is higher than the potential of the gate of the transistor Tr14m, i.e., when the current $I_{BLB}$ is smaller than the current $I_{BL}$, the circuit OPC in FIG. 2D can output a high-level potential from one of the output terminals of the circuit OPC to the wiring OL and output a low-level potential from the other of the output terminals of the circuit OPC to the wiring OLB by changing the potential of the wiring OEN from a low-level potential to a high-level potential.

The transistor M1 to the transistor M3 described in this embodiment are preferably OS transistors, for example. The transistor M1r to the transistor M3r are also preferably OS transistors, for example. In other words, the transistors included in the memory cell array MCA are preferably OS transistors. Note that the OS transistor will be described in detail in Embodiment 3.

For a metal oxide included in a channel formation region of an OS transistor, one or more materials selected from indium, an element M (the element M is one or more kinds of elements selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like), and zinc can be used, for example. In particular, a metal oxide containing indium, gallium, and zinc is an intrinsic (also referred to as i-type) or substantially intrinsic semiconductor that has a wide bandgap, and the carrier concentration of the metal oxide is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$. The off-state current per micrometer of channel width of the OS transistor including the metal oxide in the channel formation region can be lower than or equal to 10 aA ($1 \times 10^{-17}$ A), preferably lower than or equal to 1 aA ($1 \times 10^{-18}$ A), further preferably lower than or equal to 10 zA ($1 \times 10^{-20}$ A), still further preferably lower than or equal to 1 zA ($1 \times 10^{-21}$ A), yet further preferably lower than or equal to 100 yA ($1 \times 10^{-22}$ A). Since the carrier concentration of the metal oxide in the OS transistor is low, the off-state current remains low even when the temperature of the OS transistor is changed. For example, even when the temperature of the OS transistor is 150° C., the off-state current per micrometer of channel width can be 100 zA.

As described above, an OS transistor has a feature of an extremely low off-state current; thus, when an OS transistor is used especially as the transistor M1 to the transistor M3, these transistors can have a low off-state current compared with the case where a Si transistor is used.

In addition, a back gate can be easily provided for an OS transistor. Thus, as an example, the transistor M1 to the transistor M3 and the transistor M1r to the transistor M3r in FIG. 1 are each illustrated to include a back gate. Note that one embodiment of the present invention does not depend on the connection structure of a back gate of a transistor. In the transistor M1 to the transistor M3 and the transistor M1r to the transistor M3r in FIG. 1, the back gate is illustrated and the connection structure of the back gate is not illustrated; however, a portion to which the back gate is electrically connected can be determined at a design stage. For example, in a transistor including a back gate, a gate and the back gate may be electrically connected to each other to increase the on-state current of the transistor. That is, for example, the gate and back gate of the transistor M1 may be electrically connected to each other, the gate and back gate of the transistor M2 may be electrically connected to each other, and the gate and back gate of the transistor M3 may be electrically connected to each other. Alternatively, for example, in a transistor including a back gate, a wiring electrically connected to an external circuit or the like may be provided and a potential may be supplied to the back gate of the transistor from the external circuit or the like by electrically connecting the wiring and the back gate of the transistor, in order to change the threshold voltage of the transistor or to reduce the off-state current of the transistor.

The semiconductor device of one embodiment of the present invention does not depend on the structure of a transistor included in the semiconductor device. For example, the transistor M1 to the transistor M3 and the transistor M1r to the transistor M3r illustrated in FIG. 1 may have a structure not including a back gate, that is, may be single-gate transistors. It is also possible that some transistors have a structure including a back gate and the other transistors have a structure not including a back gate.

Note that the above modification examples of the transistor structure are applied not only to the transistor M1 to the transistor M3 and the transistor M1r to the transistor M3r. For example, the same is applied to the transistor Tr4, the transistor Tr4m, the transistor Tr14, and the transistor Tr14m, furthermore, transistors described in other parts of this specification and transistors illustrated in other drawings.

On the other hand, the transistor Tr1 to the transistor Tr6 and the transistor Trim to the transistor Tr5m are preferably transistors containing silicon in their channel formation regions (hereinafter referred to as Si transistors). As the silicon, amorphous silicon (referred to as hydrogenated amorphous silicon in some cases), microcrystalline silicon, polycrystalline silicon, single crystal silicon, or the like can be used, for example. The transistor Tr4, the transistor Tr4m, the transistor Try, and the transistor Tr5m may be not Si transistors but OS transistors.

The transistor included in the memory device of one embodiment of the present invention can be, for example, a transistor including a semiconductor such as Ge in a channel formation region, a transistor including a compound semiconductor such as ZnSe, CdS, GaAs, InP, GaN, or SiGe in a channel formation region, a transistor including a carbon nanotube in a channel formation region, a transistor including an organic semiconductor in a channel formation region, other than the Si transistor and the OS transistor.

Here, a case is considered where the transistors included in the memory cell array MCA are OS transistors and the transistors included in the reading circuit RDC are Si transistors. By determining the structure of the transistors included in the memory device 100 in this manner, the reading circuit RDC including the Si transistors can be formed over a semiconductor substrate containing Si and the memory cell array MCA including the OS transistors can be provided above the Si transistors, for example, as illustrated in FIG. 3.

Figure 3:
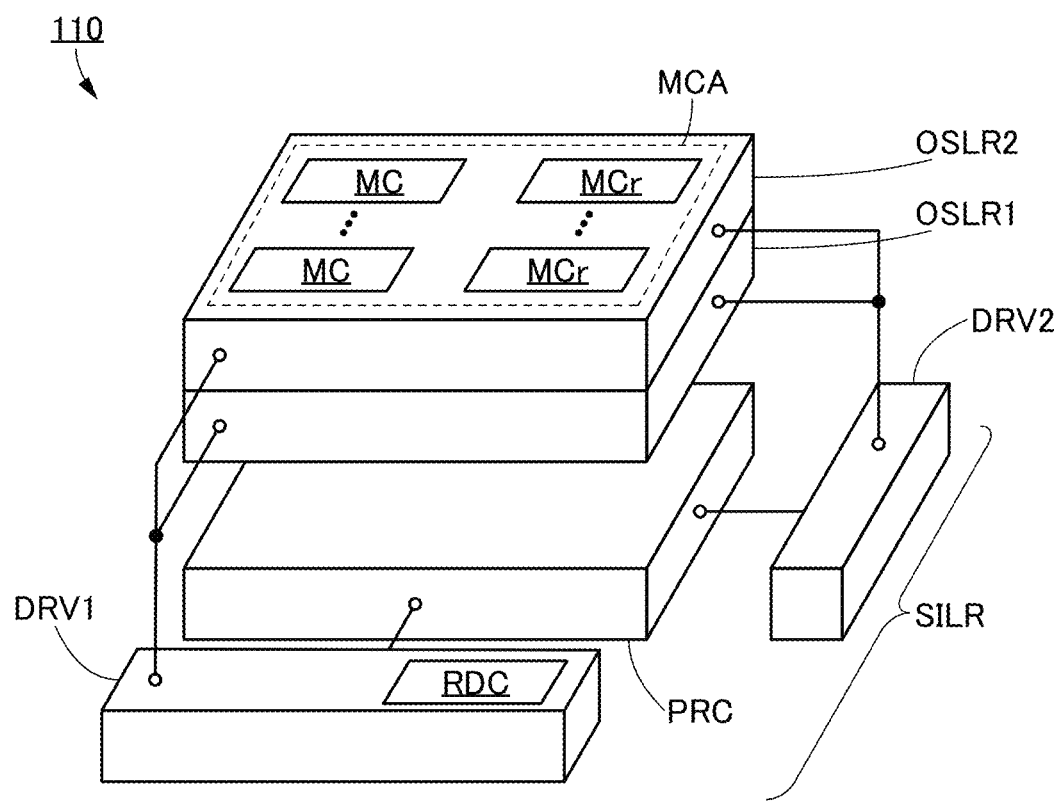
FIG. 3 is a schematic view illustrating an example of a semiconductor device.

FIG. 3 is a three-dimensional schematic view illustrating a structure example of in-memory computing that uses the memory device 100. A semiconductor device 110 illustrated in FIG. 3 includes a layer SILR, a layer OSLR1, and a layer OSLR2.

The layer SILR includes a plurality of circuits including the Si transistors formed on the semiconductor substrate containing Si. In the semiconductor device 110 illustrated in FIG. 3, the layer SILR includes a driver circuit DRV1, a driver circuit DRV2, and a processor PRC, for example.

The layer OSLR1 and the layer OSLR2 include a plurality of circuits that are provided above the layer SILR and include the OS transistors. In the semiconductor device 110 illustrated in FIG. 3, the layer OSLR2 includes the memory cell array MCA, for example. Note that the layer OSLR1 may also include the memory cell array MCA. That is, the memory device 100 may have a structure in which a plurality of memory cell arrays MCA are stacked. Alternatively, the layer OSLR1 may be not the memory cell array MCA but a driver circuit or the like of a memory device or a semiconductor device, which is formed of OS transistors.

Although FIG. 3 illustrates the two layers of the layer OSLR1 and the layer OSLR2 as the layers including the OS transistors, the memory device of one embodiment of the present invention is not limited thereto. The semiconductor device 110 may include one layer or three or more layers including the OS transistors.

The driver circuit DRV1 and the driver circuit DRV2 each function as a driver circuit for writing data to the memory cell array MCA included in the layer OSLR1 and the layer OSLR2, or for reading data from the memory cell array MCA. Note that in the semiconductor device 110 illustrated in FIG. 3, the driver circuit DRV1 includes the reading circuit RDC of the memory device 100, for example.

The processor PRC has a function of controlling the memory device 100, for example. Specifically, for example, the processor PRC has a function of transmitting, to the driver circuit DRV1 and the driver circuit DRV2, an instruction signal for writing data to the memory cell array MCA and reading data from the memory cell array MCA.

The processor PRC may be a circuit including an arithmetic unit, for example. Specifically, for example, the processor PRC may have a function of performing arithmetic operation using data read from the memory cell array MCA and writing the arithmetic operation results as data to the memory cell array MCA.

Thus, the processor PRC may include a CPU (Central Processing Unit), a product-sum operation unit, or a function circuit, for example.

As illustrated in FIG. 3, the semiconductor device 110 has a structure in which the circuits including the Si transistors are provided in the layer SILR and the circuits including the OS transistors are provided in the layer OSLR1 (the layer OSLR2) above the layer SILR, so that the circuit area of the memory device 100 can be reduced. Moreover, the memory cell array MCA is provided above the processor PRC, so that time taken for overhead in data transfer can be reduced and the reading speed of the memory device 100 can be increased.

Note that the structure of the memory device of one embodiment of the present invention is not limited to that of the memory device 100 described above. The memory device of one embodiment of the present invention may have a structure changed from that of the memory device 100 according to circumstances. For example, in the case where constant voltages supplied by the wiring CVL2, the wiring VSSL, and the like are equal to each other in the memory device 100, the wiring CVL2, the wiring VSSL, and the like may be combined into one wiring.

Operation Example

Next, operation examples of the memory device 100 in FIG. 1 are described.

FIG. 4A is a timing chart showing an operation example of writing data to the memory cell MC and the memory cell MCr. Specifically, the timing chart in FIG. 4A shows changes in potentials of the wiring WWL, the wiring WBL, the wiring RWL, the node N of the memory cell MC, and a node Nr of the memory cell MCr from Time T11 to Time T15 and around the period. Note that in FIG. 4A, a high-level potential is denoted by High and a low-level potential is denoted by Low.

In this operation example, the memory cell MCr functions as a reference memory cell of the memory cell MC.

In this operation example, the constant voltages supplied by the wiring CVL1 and the wiring CVL2 are each a ground potential.

The timing chart in FIG. 4A shows an operation example of writing a high-level potential as data to the memory cell MC.

From Time T11 to Time T12, a low-level potential is input to the wiring WWL, the wiring WBL, and the wiring RWL. In particular, since the wiring WWL is electrically connected to the gate of the transistor M2 included in the memory cell MC, the low-level potential is input to the gate of the transistor M2. Accordingly, the transistor M2 is brought into an off state. Since the wiring RWL is electrically connected to the gate of the transistor M3 included in the memory cell MC, the low-level potential is input to the gate of the transistor M3. Accordingly, the transistor M3 is brought into an off state.

The potentials of the node N and the node Nr are not determined at this time. Thus, the timing chart in FIG. 4A shows the potentials of the node N and the node Nr from Time T11 to Time T12 by hatching.

From Time T12 to Time T13, a high-level potential is input to the wiring WBL.

From Time T13 to Time T14, a high-level potential is input to the wiring WWL. Thus, the high-level potential is input to the gate of the transistor M2. Accordingly, the transistor M2 is brought into an on state.

When the transistor M2 is brought into an on state, electrical continuity is established between the wiring WBL and the first terminal of the capacitor C1. Accordingly, the potential of the node N becomes the high-level potential input from the wiring WBL.

From Time T14 to Time T15, a low-level potential is input to the wiring WWL. Since the wiring WWL is electrically connected to the gate of the transistor M2 included in the memory cell MC, the low-level potential is input to the gate of the transistor M2. Accordingly, the transistor M2 is brought into an off state.

When the transistor M2 is brought into an off state, electrical continuity between the wiring WBL and the first terminal of the capacitor C1 is broken. At this time, the potential of the node N, i.e., the high-level potential input from the wiring WBL, is retained in the memory cell MC by the capacitor C1.

Meanwhile, data with the inverted logic of the data written to the memory cell MC is retained in the memory cell MCr through an operation similar to that of the memory cell MC. For example, in this operation example, in the case where a high-level potential is retained in the memory cell MC, the potential of the node Nr, i.e., a low-level potential input from the wiring WBL, is retained in the memory cell MCr by the capacitor C1r.

Note that the high-level potential supplied to the wiring WBL may be returned to a potential before Time T12 (e.g., a low-level potential) after data is written to the memory cell MC. In the timing chart in FIG. 4A, the potential of the wiring WBL is changed from the high-level potential to a low-level potential after Time T15.

Through the above operation example, data can be written to the memory cell MC and the memory cell MCr. Although a high-level potential is written to the memory cell MC in the operation example described above, a low-level potential may be written as data to the memory cell MC. In this case, a high-level potential is preferably written in the memory cell MCr.

Next, an operation example of reading data from the memory cell MC is described.

FIG. 4B is a timing chart showing the operation example of reading data from the memory cell MC and the memory cell MCr. Specifically, the timing chart in FIG. 4B shows changes in potentials of the wiring RWL, the wiring SAEN, the wiring BL, the wiring BLB, the wiring VOLP, and the wiring OL from Time T21 to Time T23 and around the period. In addition, the timing chart in FIG. 4B shows changes in current amounts of the current $I_{BL}$ flowing to the wiring BL and the current $I_{BLB}$ flowing to the wiring BLB. Note that in FIG. 4B, a high-level potential is denoted by High and a low-level potential is denoted by Low.

In this operation example, a constant voltage supplied by the wiring VDDL is a high-level potential and a constant voltage supplied by the wiring VSSL is a low-level potential.

From Time T21 to Time T22, a low-level potential is input to the wiring SAEN. In particular, since the wiring SAEN is electrically connected to the gates of the transistor Tr1 and the transistor Tr1m included in the reading circuit RDC, a low-level potential is input to the gates of the transistor Tr1 and the transistor Tr1m. Thus, the transistor Tr1 and the transistor Tr1m are brought into an on state.

At this time, a high-level potential is supplied from the wiring VDDL to the first terminal of the transistor Tr4 through the transistor Tr1. Similarly, a high-level potential is supplied from the wiring VDDL to the first terminal of the transistor Tr4m through the transistor Tr1m.

A high-level potential is supplied from the wiring VDDL to the first terminal of the transistor Tr2, the gate of the transistor Tr2, and the gate of the transistor Tr3 through the transistor Tr1. When the threshold voltages of the transistor Tr2 and the transistor Tr3 are each within an appropriate range at this time, the transistor Tr2 and the transistor Tr3 are each brought into an off state. Similarly, a high-level potential is supplied from the wiring VDDL to the first terminal of the transistor Tr2m, the gate of the transistor Tr2m, and the gate of the transistor Tr3m through the transistor Tr1m. When the threshold voltages of the transistor Tr2m and the transistor Tr3m are each within an appropriate range at this time, the transistor Tr2m and the transistor Tr3m are each brought into an off state.

From Time T21 to Time T22, a voltage $V_{READ}$ is input to the wiring VOLP. Accordingly, $V_{READ}$ is supplied to the gates of the transistor Tr4 and the transistor Tr4m included in the reading circuit RDC.

The transistor Tr4 functions as a transistor for controlling a current supplied to the wiring BL, for example. When $V_{READ}$ is supplied as an analog potential to the gate of the transistor Tr4, for example, a current corresponding to $V_{READ}$ can flow between the first terminal and second terminal of the transistor Tr4. Similarly, when $V_{READ}$ is supplied as an analog potential to the gate of the transistor Tr4m, for example, a current corresponding to $V_{READ}$ can flow between the first terminal and second terminal of the transistor Tr4m.

Note that the transistor Tr4 may function as a switching element, for example. Specifically, the transistor Tr4 in a conduction state may output, from the second terminal, a potential input to the first terminal of the transistor Tr4. In this case, the transistor Tr4 may be either an n-channel transistor or a p-channel transistor.

Here, when the transistor M1 and the transistor M3 (the transistor M1r and the transistor M3r) in the memory cell MC (the memory cell MCr) are OS transistors, $I_{BL}$ ($I_{BLB}$) flowing to the memory cell MC (the memory cell MCr) is small compared with the case where the transistor M1 and the transistor M3 (the transistor M1r and the transistor M3r) are Si transistors. In the case where $I_{BL}$ ($I_{BLB}$) flowing to the memory cell MC (the memory cell MCr) is small, sometimes an analog potential need not be supplied to the gate of the transistor Tr4 (the transistor Tr4m) to control a current flowing to the wiring BL (the wiring BLB). In this case, the transistor Tr4 may function as a switching element. By contrast, when the transistor M1 and the transistor M3 (the transistor M1r and the transistor M3r) are Si transistors, $I_{BL}$ ($I_{BLB}$) flowing to the memory cell MC (the memory cell MCr) is large, and thus an analog potential need not be supplied to the gate of the transistor Tr4 (the transistor Tr4m) to control a current flowing to the wiring BL (the wiring BLB). Thus, using OS transistors as the transistor M1 and the transistor M3 (the transistor M1r and the transistor M3r) in the memory cell MC (the memory cell MCr) enables the transistor Tr4 (the transistor Tr4m) to be used as a switching element, so that it becomes unnecessary to generate an analog potential to be input to the gate of the transistor Tr4 (the transistor Tr4m) to control the current flowing to the wiring BL (the wiring BLB).

From Time T21 to Time T22, a high-level potential is input to the wiring RWL electrically connected one of the plurality of memory cells MC included in the memory cell array MCA. In addition, the high-level potential is input to the wiring RWL electrically connected to the memory cell MCr that is a reference memory cell corresponding to the one of the memory cells MC. Hereinafter, one of the plurality of memory cells MC is simply referred to as the memory cell MC, and a reference memory cell corresponding to the memory cell MC is referred to as the memory cell MCr.

When a high-level potential is input to the wiring RWL electrically connected to the memory cell MC, the transistor M3 included in the memory cell MC is brought into an on state. In addition, the transistor M3r included in the memory cell MCr is brought into an on state.

Since a ground potential is input to the second terminal of the transistor M1 included in the memory cell MC, a current flowing between the first terminal and second terminal of the transistor M1 is determined in accordance with the potential of the gate of the transistor M1 (the potential of the node N). Similarly, since a ground potential is input to the second terminal of the transistor M1r included in the memory cell MCr, a current flowing between the first terminal and second terminal of the transistor M1r is determined in accordance with the potential of the gate of the transistor M1r (the potential of the node Nr).

Here, when the potential of the gate of the transistor M1 included in the memory cell MC is a high-level potential, for example, the gate-source voltage of the transistor M1 corresponds to a potential difference between the high-level potential and the ground potential. In this case, a current flowing between the first terminal and second terminal of the transistor M1 is $I_{Vhigh}$. When the potential of the gate of the transistor M1 is a low-level potential, the gate-source voltage of the transistor M1 corresponds to a potential difference between the low-level potential and the ground potential. In this case, a current flowing between the first terminal and second terminal of the transistor M1 is $I_{Vlow}$. Note that as for the gate-source voltage of the transistor M1, the potential difference between the high-level potential and the ground potential is larger than the potential difference between the low-level potential and the ground potential; thus, $I_{Vhigh}$ is larger than $I_{Vlow}$.

In addition, a current flows between the first terminal and second terminal of the transistor M1 and the transistor M3 is in an on state, and thus electrical continuity is established between the wiring BL and the wiring CVL2. A potential of the wiring BL when a current flowing between the first terminal and second terminal of the transistor M1 is $I_{Vhigh}$ is $V_{LRS}$, and a potential of the wiring BL when a current flowing between the first terminal and second terminal of the transistor M1 is $I_{Vlow}$ is $V_{HRS}$. Since $I_{Vhigh}$ is larger than $I_{Vlow}$, $V_{HRS}$ is higher than $V_{LRS}$.

When the potential of the gate of the transistor M1 included in the memory cell MCr is a high-level potential or a low-level potential, for example, a current flowing between the first terminal and second terminal of the transistor M1 can be $I_{Vhigh}$ or $I_{Vlow}$ as in the memory cell MC. Similarly, a potential of the wiring BLB when a current flowing between the first terminal and second terminal of the transistor M1 is $I_{Vhigh}$ may be Was, and a potential of the wiring BLB when a current flowing between the first terminal and second terminal of the transistor M1 is $I_{Vlow}$ may be $V_{HRS}$.

Alternatively, the potential of the gate of the transistor M1r included in the memory cell MCr may be an intermediate potential. The intermediate potential here is, for example, a potential higher than a low-level potential and lower than a high-level potential. A current flowing between the first terminal and second terminal of the transistor M1r when the gate-source voltage of the transistor M1r corresponds to a potential difference between the intermediate potential and the ground potential is $I_{Vref}$. The potential of the wiring BLB when a current flowing between the first terminal and second terminal of the transistor M1r is $I_{Vref}$ is $V_{ref}$. Note that $I_{Vref}$ is a current larger than $I_{Vlow}$ and smaller than $I_{Vhigh}$, and $V_{ref}$ is a potential higher than $V_{LRS}$ and lower than $V_{HRS}$.

Note that from Time T21 to Time T22, the reading circuit RDC is not in a driving state. Here, a potential output from the circuit OPC (i.e., the potential of the wiring OL) is a low-level potential, for example.

From Time T22 to Time T23, a high-level potential is input to the wiring SAEN. Thus, the high-level potential is input to the gates of the transistor Tr1 and the transistor Tr1m, so that the transistor Tr1 and the transistor Tr1m are brought into an off state.

After the transistor Tr1 is brought into an off state, the current $I_{BL}$ of the wiring BL flows from the wiring VDDL through not the transistor Tr1 but the transistor Tr2. Since the transistor Tr2 has a diode-connected structure, the potential of the gate of the transistor Tr2 becomes a potential that allows the current $I_{BL}$ to flow between the first terminal and second terminal of the transistor Tr2.

In addition, since the current mirror circuit CM is configured with the transistor Tr2 and the transistor Tr3, a current almost equal to the current $I_{BL}$ flowing between the first terminal and second terminal of the transistor Tr2 flows between the first terminal and second terminal of the transistor Tr3. Note that in this operation example, the current flowing between the first terminal and second terminal of the transistor Tr3 is $I_{BL}$.

After the transistor Tr1m is brought into an off state, the current $I_{BLB}$ of the wiring BLB flows from the wiring VDDL through not the transistor Tr1m but the transistor Tr2m. Since the transistor Tr2m has a diode-connected structure, the potential of the gate of the transistor Tr2m becomes a potential that allows the current $I_{BLB}$ to flow between the first terminal and second terminal of the transistor Tr2m.

In addition, since the current mirror circuit CMr is configured with the transistor Tr2m and the transistor Tr3m, a current almost equal to the current $I_{BLB}$ flowing between the first terminal and second terminal of the transistor Tr2m flows between the first terminal and second terminal of the transistor Tr3m. Note that in this operation example, the current flowing between the first terminal and second terminal of the transistor Tr3m is $I_{BLB}$.

Next, the current mirror circuit CMd is considered. Since the current $I_{BLB}$ flows between the first terminal and second terminal of the transistor Tr3m, the current $I_{BLB}$ flows between the first terminal and second terminal of the transistor Tr5m. At this time, since the transistor Tr5m has a diode-connected structure, the potential of the gate of the transistor Tr5m becomes a potential that allows the current $I_{BLB}$ to flow between the first terminal and second terminal of the transistor Tr5m.

In the case where the circuit OPC has a function of outputting a potential corresponding to a potential of the input terminal of the circuit OPC from the output terminal of the circuit OPC, that is, for example, in the case where the input terminal of the circuit OPC has a high impedance and thus a current does not flow to the input terminal of the circuit OPC, the impedances of the transistor Tr3 and the transistor Tr5 are determined such that a current flowing between the first terminal and second terminal of the transistor Tr3 and a current flowing between the first terminal and second terminal of the transistor Tr5 become equal to each other.

For example, in the case where the current $I_{BL}$ is larger than the current $I_{BLB}$, the impedance of the transistor Tr5 is high, and thus an input potential to the input terminal of the circuit OPC is high. By contrast, in the case where the current $I_{BL}$ is smaller than the current $I_{BLB}$, the impedance of the transistor Tr5 is low, and thus an input potential to the input terminal of the circuit OPC is low. That is, the circuit OPC outputs a high-level potential from one of the output terminals of the circuit OPC when the current $I_{BL}$ is larger than the current $I_{BLB}$, and the circuit OPC outputs a low-level potential from the one of the output terminals when the current $I_{BL}$ is smaller than the current $I_{BLB}$.

For example, when a high-level potential is retained in the memory cell MC and a low-level potential or an intermediate potential is retained in the memory cell MCr, a current flowing to the wiring BL is $I_{Vhigh}$ and a current flowing to the wiring BLB is $I_{Vlow}$ or $I_{Vref}$. In this case, the circuit OPC outputs a high-level potential from the output terminal of the circuit OPC. Alternatively, for example, when a low-level potential is retained in the memory cell MC and a high-level potential or an intermediate potential is retained in the memory cell MCr, a current flowing to the wiring BL is $I_{Vhigh}$ and a current flowing to the wiring BLB is $I_{Vlow}$ or $I_{Vref}$. In this case, the circuit OPC outputs a low-level potential from the output terminal of the circuit OPC.

In the above manner, the reading circuit RDC can read a potential retained in the memory cell MC through the operation from Time T21 to Time T23 and around the period.

The operation of the memory device of one embodiment of the present invention is not limited to the operation example described in this embodiment. The operation example described in this embodiment can be changed according to circumstances as appropriate. For example, although a high-level potential is supplied to the wiring RWL and $V_{READ}$ is supplied to the wiring VOLP at Time T21 in the reading operation, the potentials may be supplied to the wiring RWL and the wiring VOLP at different timings. Specifically, a high-level potential may be supplied to the wiring RWL after $V_{READ}$ is supplied to the wiring VOLP, for example.

Note that this embodiment can be combined with any of the other embodiments in this specification as appropriate.

Embodiment 2

This embodiment describes other structure examples of memory devices that are different from the memory device 100 described in the above embodiment.

Structure Example 2

Figure 5:
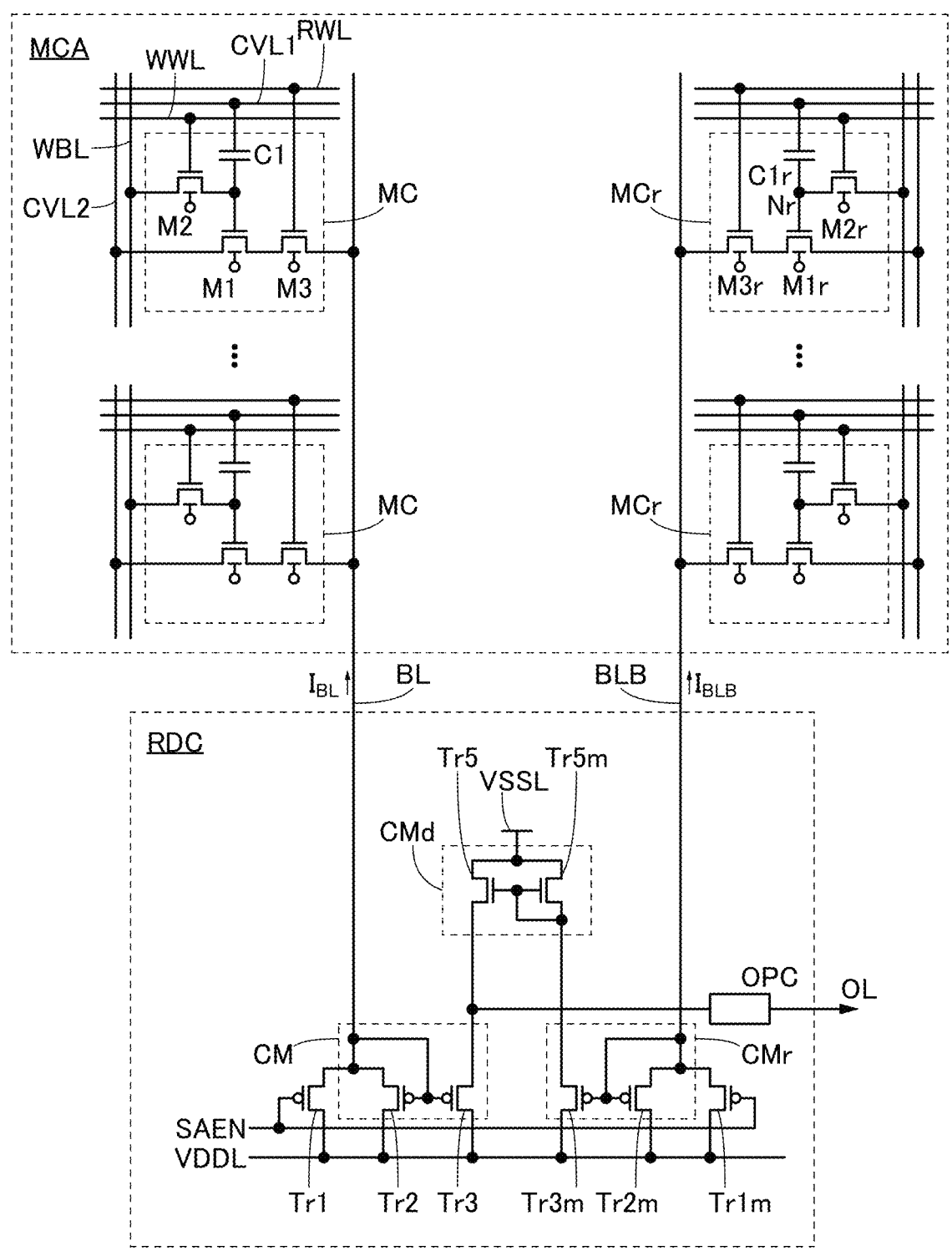
FIG. 5 is a circuit diagram illustrating an example of a memory device.

FIG. 5 is a circuit diagram illustrating a structure example of the memory device of one embodiment of the present invention. A memory device 100A is a modification example of the memory device 100, and is different from the memory device 100 in that the transistor Tr4 and the transistor Tr4*m* are not provided in the reading circuit RDC.

Since the transistor Tr4 is not provided in the memory device 100A, when the current $I_{BL}$ need not flow to the wiring BL, that is, when data is not read from the memory cell array MCA, the transistors M3 in all of the memory cells MC electrically connected to the wiring BL are brought into an off state. When data is read from one of the all of the memory cells MC, the transistor M3 of the memory cell MC is brought into an on state and the transistors M3 of the other memory cells MC are brought into an off state. Similarly, since the transistor Tr4*m* is not provided in the memory device 100A, when the current $I_{BLB}$ need not flow to the wiring BLB, the transistors M3*r* in all of the memory cells MCr electrically connected to the wiring BLB are brought into an off state. When data is read from one of the all of the memory cells MCr, the transistor M3*r* of the memory cell MCr is brought into an on state and the transistors M3*r* of the other memory cells MCr are brought into an off state.

In this case, OS transistors with a low off-state current are preferably used as the transistor M3 and the transistor M3*r* as described above.

Since the memory device 100A has a structure in which the transistor Tr4 and the transistor Tr4*m* are not provided in the memory device 100, the memory device 100A can be manufactured to have a smaller area than the memory device 100. In addition, there is no need to input a voltage to the gates of the transistor Tr4 and the transistor Tr4*m* in the memory device 100A, and thus the memory device 100A can have lower power consumption than the memory device 100.

Structure Example 3

Figure 6:
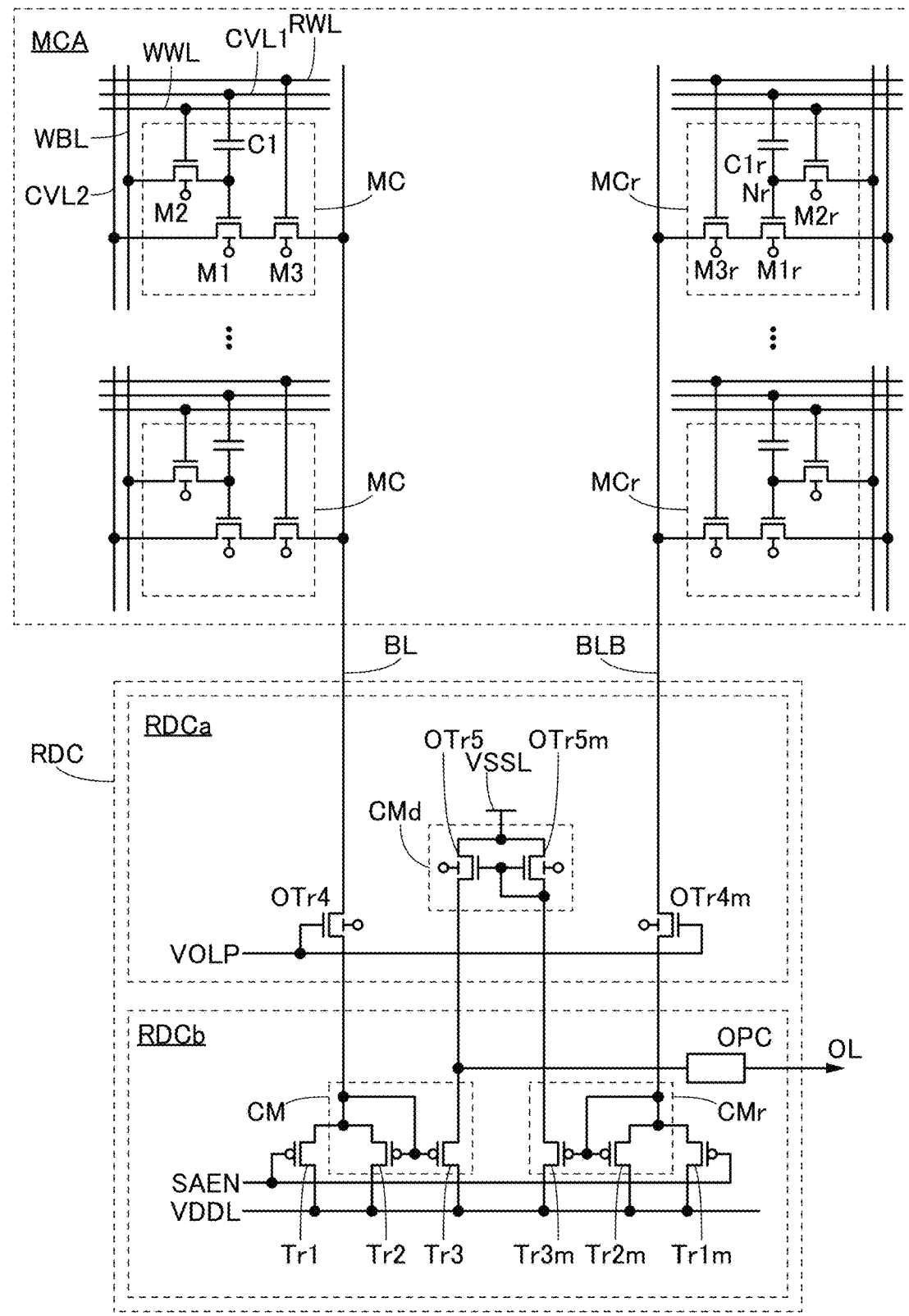
FIG. 6 is a circuit diagram illustrating an example of a memory device.

A memory device 100B illustrated in FIG. 6 is a modification example of the memory device 100. Specifically, the memory device 100B has a structure in which the transistor Tr4 is replaced with a transistor OTr4, the transistor Tr4*m* is replaced with a transistor OTr4*m*, the transistor Tr5 is replaced with a transistor OTr5, and the transistor Tr5*m* is replaced with a transistor OTr5*m* in the reading circuit RDC of the memory device 100.

As described above, the transistor Tr4, the transistor Tr4*m*, the transistor Tr5, and the transistor Tr5*m* in the memory device 100 are n-channel transistors. Thus, OS transistors can be used as the transistor OTr4, the transistor OTr4*m*, the transistor OTr5, and the transistor OTr5*m*, for example.

The transistor Tr1, the transistor Tr1*m*, the transistor Tr2, the transistor Tr2*m*, the transistor Tr3, the transistor Tr3*m*, and the transistors included in the circuit OPC are Si transistors.

Here, in the reading circuit RDC, a circuit including the transistor OTr4, the transistor OTr4*m*, the transistor OTr5, and the transistor OTr5*m* is a circuit RDCa, and a circuit including the transistor Tr1, the transistor Tr1*m*, the transistor Tr2, the transistor Tr2*m*, the transistor Tr3, the transistor Tr3*m*, and the circuit OPC is a circuit RDCb. That is, in the reading circuit RDC, the circuit including the OS transistors is the circuit RDCa and the circuit including the Si transistors is the circuit RDCb.

When the transistors included in the reading circuit RDC are defined as described above, the circuit RDCb including the Si transistors can be formed over a semiconductor substrate containing silicon, and the circuit RDCa including the OS transistors can be formed above the circuit RDCb. The memory cell array MCA may be formed above the circuit RDCb concurrently with the circuit RDCa, or may be formed above the circuit RDCa after the circuit RDCa is formed. By forming the circuit RDCb above the circuit RDCa, the circuit area of the reading circuit RDC can be made small.

Specifically, in the case where the memory device 100B is used for the semiconductor device in FIG. 3, the memory cell array MCA is provided in the layer OSLR2, the circuit RDCa is provided in the layer OSLR1, and the circuit RDCb is provided in the layer SILR.

The on-state current of the OS transistor is smaller than the on-state current of the Si transistor. In the case where the amounts of currents flowing to the wiring BL and the wiring BLB are small, the transistor Tr4 and the transistor Tr4*m* included in the reading circuit RDC of the memory device 100 in FIG. 1 can be replaced respectively with the transistor OTr4 and the transistor OTr4*m* that are OS transistors, as in the memory device 100B illustrated in FIG. 6.

Although the memory device 100B in FIG. 6 has a structure in which the transistors included in the current mirror circuit CMd are OS transistors and the current mirror circuit CMd is included in the circuit RDCa, one embodiment of the present invention is not limited thereto. For example, the memory device 100B in FIG. 6 may have a structure in which the transistors included in the current mirror circuit CMd are Si transistors and the current mirror circuit CMd is included in the circuit RDCb (not illustrated). This structure is suitable for increasing the on-state currents flowing through the transistor Tr5 and the transistor Tr5*m*.

Structure Example 4

Figure 7:
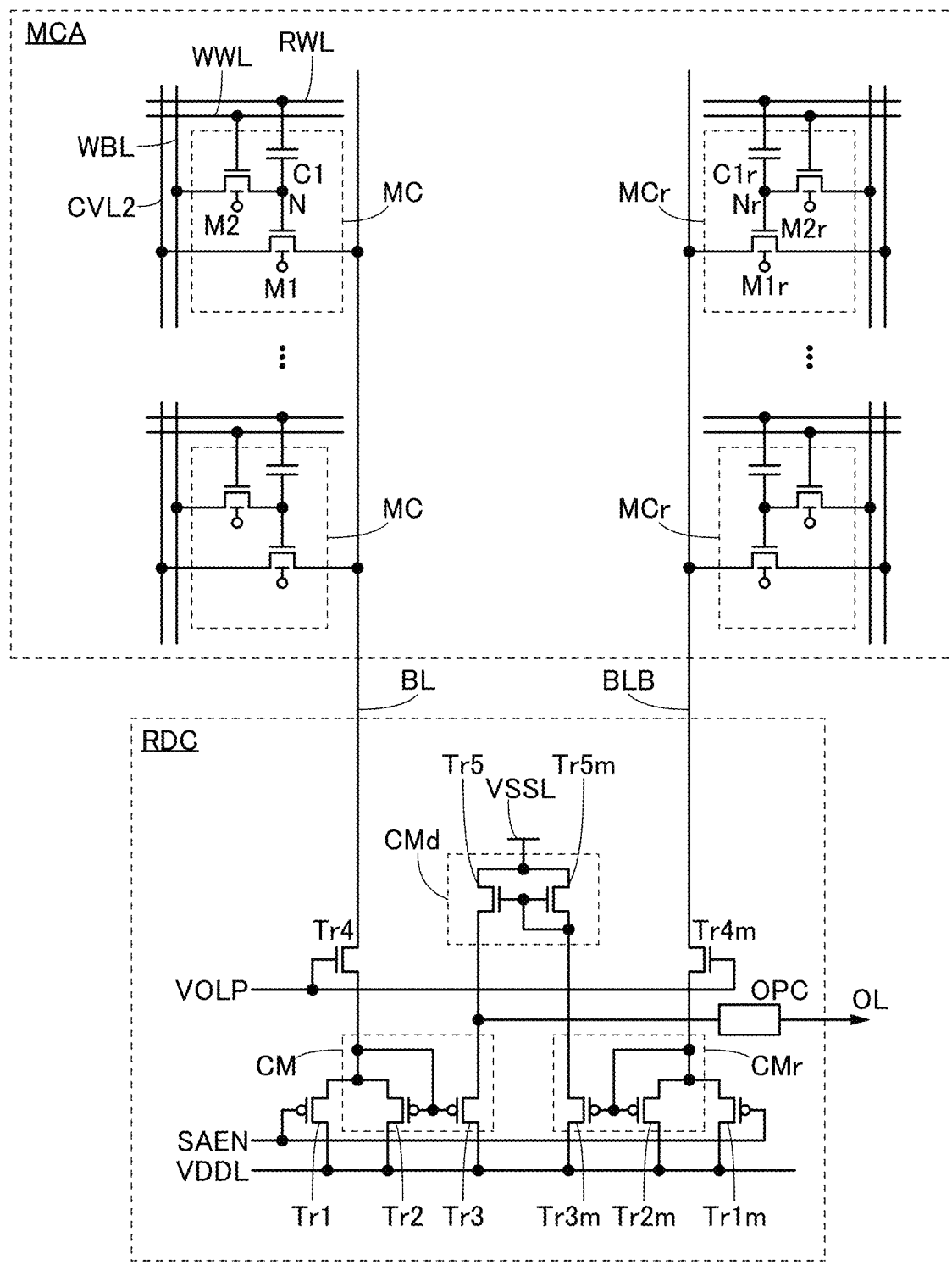
FIG. 7 is a circuit diagram illustrating an example of a memory device.

FIG. 7 is a circuit diagram illustrating a structure example of a memory device of one embodiment of the present invention. A memory device 100C is a modification example of the memory device 100, and is different from the memory device 100 in the structures of the memory cell MC and the memory cell MCr of the memory cell array MCA.

Here, the structures of the memory cell MC and the memory cell MCr included in the memory cell array MCA of the memory device 100C are described.

The memory cell MC included in the memory device 100C has a structure in which the transistor M3 is not provided in the memory cell MC included in the memory device 100. That is, the memory cell MC of the memory device 100C includes the transistor M1, the transistor M2, and the capacitor C1.

In the memory cell MC of the memory device 100C, the first terminal of the transistor M1 is electrically connected to the wiring CVL2, the second terminal of the transistor M1 is electrically connected to the wiring BL, and the gate of the transistor M1 is electrically connected to the first terminal of the transistor M2 and the first terminal of the capacitor C1. The second terminal of the transistor M2 is electrically connected to the wiring WBL, and the gate of the transistor M2 is electrically connected to the wiring WWL. The second terminal of the capacitor C1 is electrically connected to the wiring RWL.

In the memory device 100C in FIG. 7, the electrical connection point of the gate of the transistor M1, the first terminal of the transistor M2, and the first terminal of the capacitor C1 is the node N.

In the memory device 100C in FIG. 7, the memory cell MCr has a structure similar to that of the memory cell MC. Thus, "r" is added to the reference numerals of the circuit elements and the like included in the memory cell MCr to differentiate them from the circuit elements and the like included in the memory cell MC. That is, the memory cell MCr includes the transistor M1r, the transistor M2r, and the capacitor C1r.

In FIG. 7, the wiring BL is illustrated as the read bit line of the memory cell MC and the wiring BLB is illustrated as the read bit line of the memory cell MCr. In the memory cell MCr, the second terminal of the transistor M1r is electrically connected to the wiring BLB.

For the functions of the wiring BL, the wiring BLB, the wiring WWL, the wiring WBL, and the wiring CVL2, the description of the memory device 100 in FIG. 1 in Embodiment 1 is referred to.

The wiring RWL functions as a read word line for selecting the memory cell MC from which data is read, from the plurality of memory cells MC included in the memory cell array MCA.

To make the wiring RWL function as a read word line, for example, a high-level potential is applied to the wiring RWL in advance when data is written to the memory cell MC, and the transistor M2 is brought into an off state after the data is written to the first terminal of the capacitor C1. That is, the node N is brought into a floating state after the data is written to the first terminal of the capacitor C1. After that, a low-level potential is supplied to the wiring RWL so that the potential of the gate (the node N) of the transistor M1 is reduced by capacitive coupling and the transistor M1 is brought into an off state. When the data is read from the memory cell MC, a potential supplied by the wiring RWL is changed from the low-level potential to a high-level potential so that the transistor M1 is brought into an on state. At this time, a current corresponding to the gate-source voltage of the transistor M1 flows between the first terminal and second terminal of the transistor M1. Here, when a constant potential supplied by the wiring CVL2 is a ground potential, the amount of current flowing between the first terminal and second terminal of the transistor M1 is determined in accordance with the potential of the gate (the node N) of the transistor M1. At this time, the data written to the memory cell MC can be read from the amount of current flowing from the wiring BL to the wiring CVL2 through the transistor M1.

In the memory device 100 illustrated in FIG. 1, the memory cell MC (the memory cell MCr) of the memory cell array MCA from which data is read can be selected by switching the on state and the off state of the transistor M3 (the transistor M3r) included in the memory cell MC (the memory cell MCr). On the other hand, in the memory device 100C illustrated in FIG. 7, the memory cell MC (the memory cell MCr) of the memory cell array MCA from which data is read can be selected in the following manner: a low-level potential is input to the wiring RWL electrically connected to the memory cells MC (the memory cells MCr) from which data is not read so that the transistors M1 (the transistors M1r) are brought into an off state, and a high-level potential is input to the wiring RWL electrically connected to the memory cell MC (the memory cell MCr) from which data is read so that the transistor M1 (the transistor M1r) is brought into an on state.

Since the memory device 100C has a structure in which the transistor M3 (the transistor M3r) is not provided in the memory cell MC (the memory cell MCr) of the memory device 100, the circuit area of the memory cell MC (the memory cell MCr) of the memory device 100C can be made small. In addition, by additionally providing another memory cell MC (the memory cell MCr) in a space obtained by reducing the circuit area of the memory cell MC (the memory cell MCr) of the memory cell array MCA, the cell density of the memory cell array MCA can be increased.

For the operations of the memory device 100A, the memory device 100B, and the memory device 100C described above, the operation examples described in Embodiment 1 is referred to.

Note that the memory device of one embodiment of the present invention is not limited to the memory device 100A, the memory device 100B, and the memory device 100C described above. The memory device of one embodiment of the present invention can have a circuit structure changed from that of the memory device 100A, the memory device 100B, or the memory device 100C according to circumstances.

Note that this embodiment can be combined with any of the other embodiments in this specification as appropriate.

Embodiment 3

In this embodiment, structure examples of the memory devices described in the above embodiments and structure examples of transistors that can be used in the memory devices are described.

Structure Example of Memory Device

Figure 8:
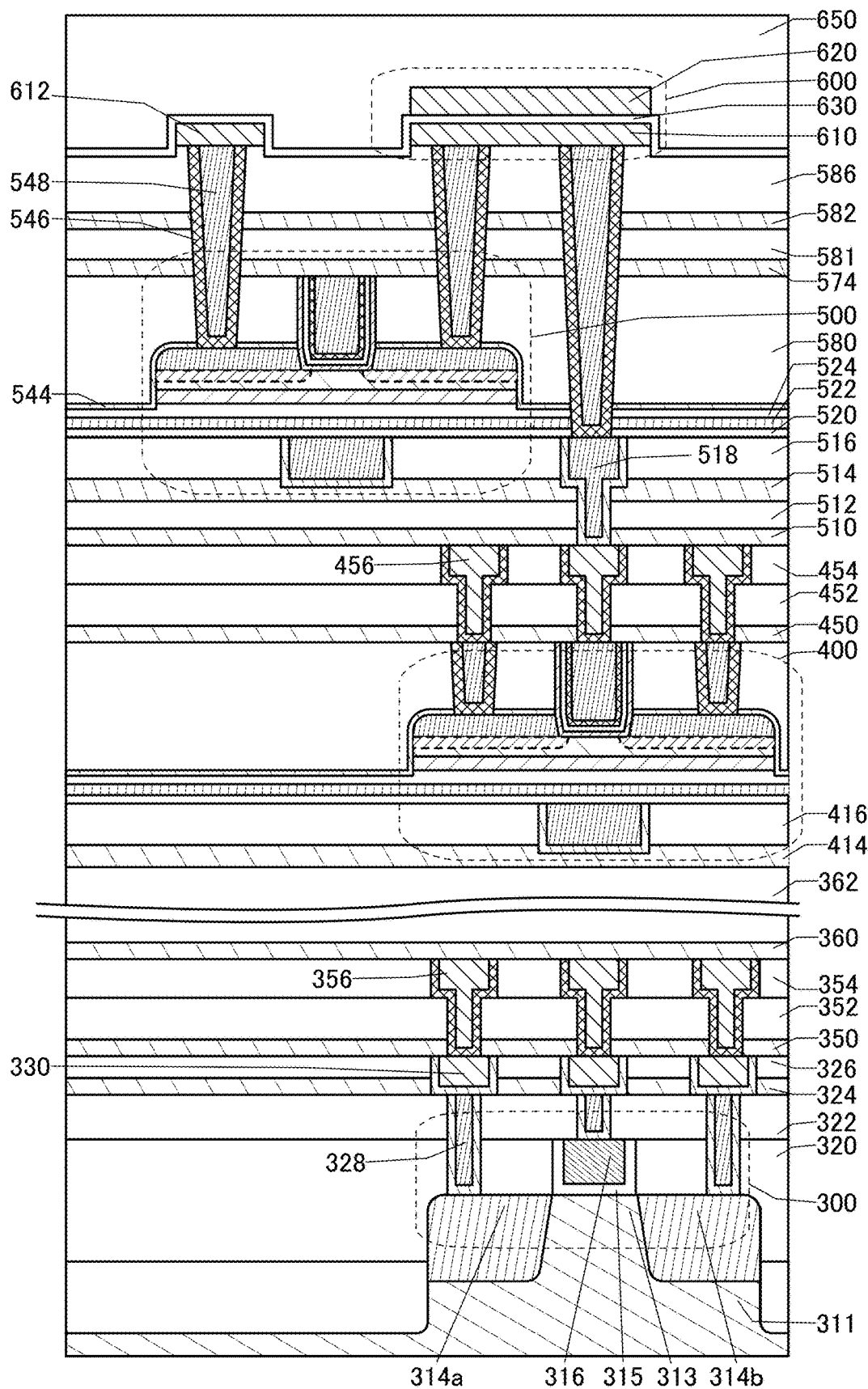
FIG. 8 is a schematic cross-sectional view illustrating a structure example of a memory device.
Figure 11A:
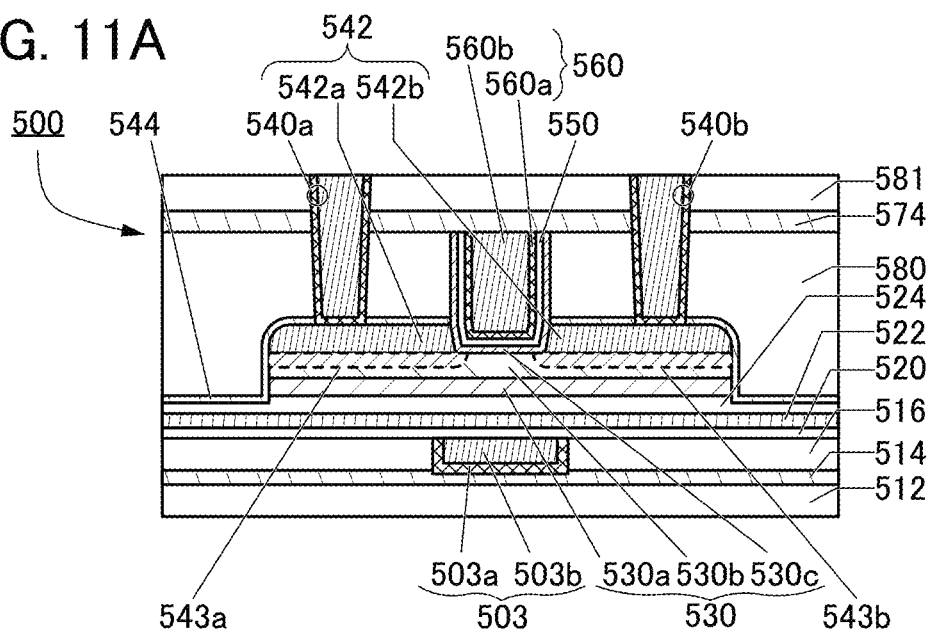
FIG. 11A to FIG. 11C are schematic cross-sectional views illustrating structure examples of transistors.
Figure 11B:
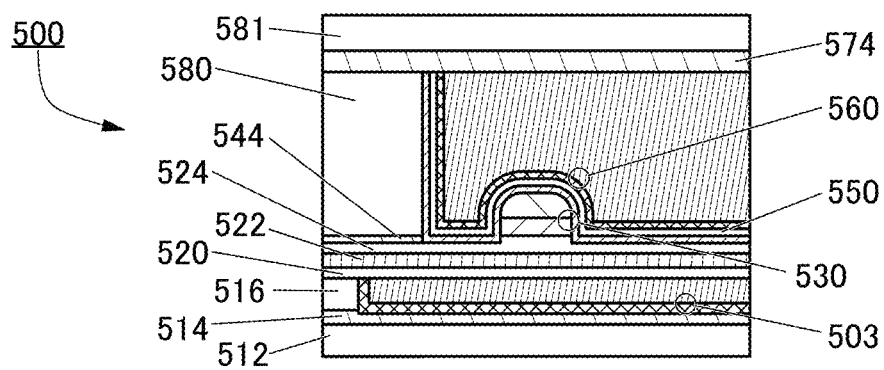
Figure 11C:
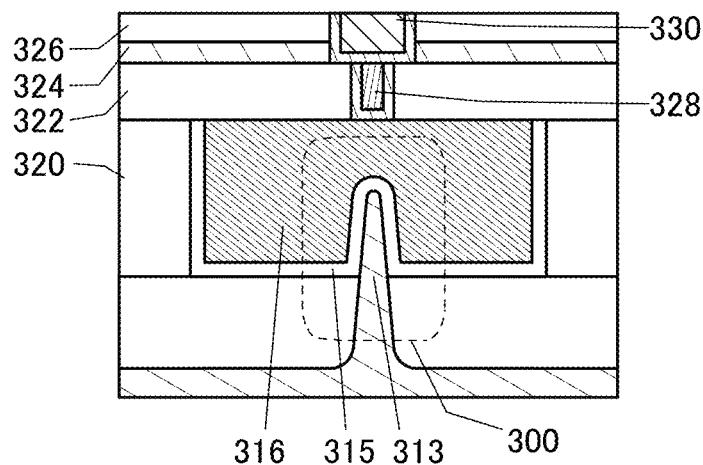

The memory device illustrated in FIG. 8 includes a transistor 300, a transistor 400, a transistor 500, and a capacitor 600. FIG. 11A is a cross-sectional view of the transistor 400 and the transistor 500 in the channel length direction, FIG. 11B is a cross-sectional view of the transistor 400 and the transistor 500 in the channel width direction, and FIG. 11C is a cross-sectional view of the transistor 300 in the channel width direction.

The transistor 400 and the transistor 500 are each a transistor including a metal oxide in its channel formation region (an OS transistor). Features of the transistor 400 and the transistor 500 are that the off-state current is low and the field-effect mobility hardly changes even at high temperatures. The transistor 400 can be, for example, the transistor M1 included in the memory cell MC of the memory cell array MCA described in the above embodiment, and the transistor 500 can be, for example, the transistor M2 included in the memory cell MC of the memory cell array MCA described in the above embodiment. In particular, an OS transistor has a low off-state current, and thus using the transistor M2 that is an OS transistor as the transistor 500 can prevent degradation of retained data due to the off-state current.

The transistor 400 is provided above the transistor 300, for example, the transistor 500 is provided above the transistor 400, for example, and the capacitor 600 is provided above the transistor 500, for example. Note that the capacitor 600 can be, for example, the capacitor C1 included in the memory cell MC of the memory cell array MCA described in the above embodiment. In the case where large parasitic capacitance is formed between another wiring and the node N, the capacitor 600 illustrated in FIG. 8 is not necessarily provided.

Figure 9:
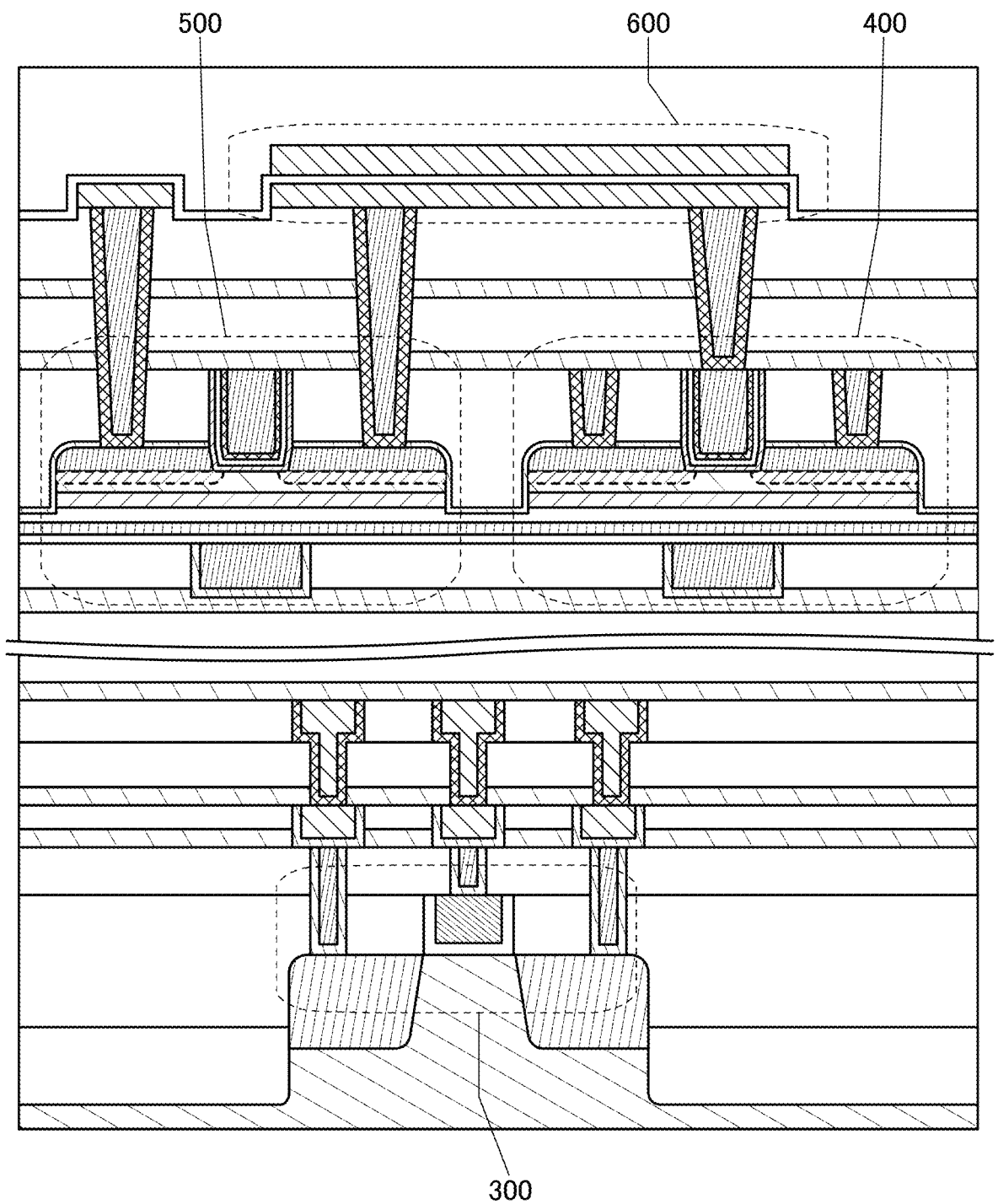
FIG. 9 is a schematic cross-sectional view illustrating a structure example of a memory device.

Although the memory device in FIG. 8 has a structure in which the transistor 500 is provided above the transistor 400, one embodiment of the present invention is not limited thereto. For example, as illustrated in FIG. 9, the transistor 500 may be positioned at the same level as the transistor 400 so as to be provided concurrently with the transistor 400. Note that FIG. 9 shows the reference numerals of only the transistor 300, the transistor 400, the transistor 500, and the capacitor 600, and the reference numerals of the others are omitted.

The transistor 300 is provided on a substrate 311 and includes a conductor 316, an insulator 315, a semiconductor region 313 that is part of the substrate 311, and a low-resistance region 314*a* and a low-resistance region 314*b* each functioning as a source region or a drain region. Note that the transistor 300 can be, for example, any one of the transistor Tr1 to the transistor Tr5 and the transistor Tr1$m$ to the transistor Tr$y$m included in the reading circuit RDC of the memory device 100 described in the above embodiment. Alternatively, the transistor 300 can be, for example, a transistor included in the circuit OPC of the memory device 100 described in the above embodiment.

A semiconductor substrate (e.g., a single crystal substrate or a silicon substrate) is preferably used as the substrate 311.

In the transistor 300, a top surface and a side surface of the semiconductor region 313 in the channel width direction are covered with the conductor 316 with the insulator 315 therebetween, as illustrated in FIG. 11C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314*a* and the low-resistance region 314*b* each functioning as a source region or a drain region, and the like preferably contain a semiconductor such as a silicon-based semiconductor, and preferably contain single crystal silicon. Alternatively, the above regions may be formed using a material containing Ge (germanium), SiGe (silicon germanium), GaAs (gallium arsenide), or GaAlAs (gallium aluminum arsenide), for example. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314*a* and the low-resistance region 314*b* contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material for the conductor, the threshold voltage of the transistor can be adjusted by selecting the material for the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 10:
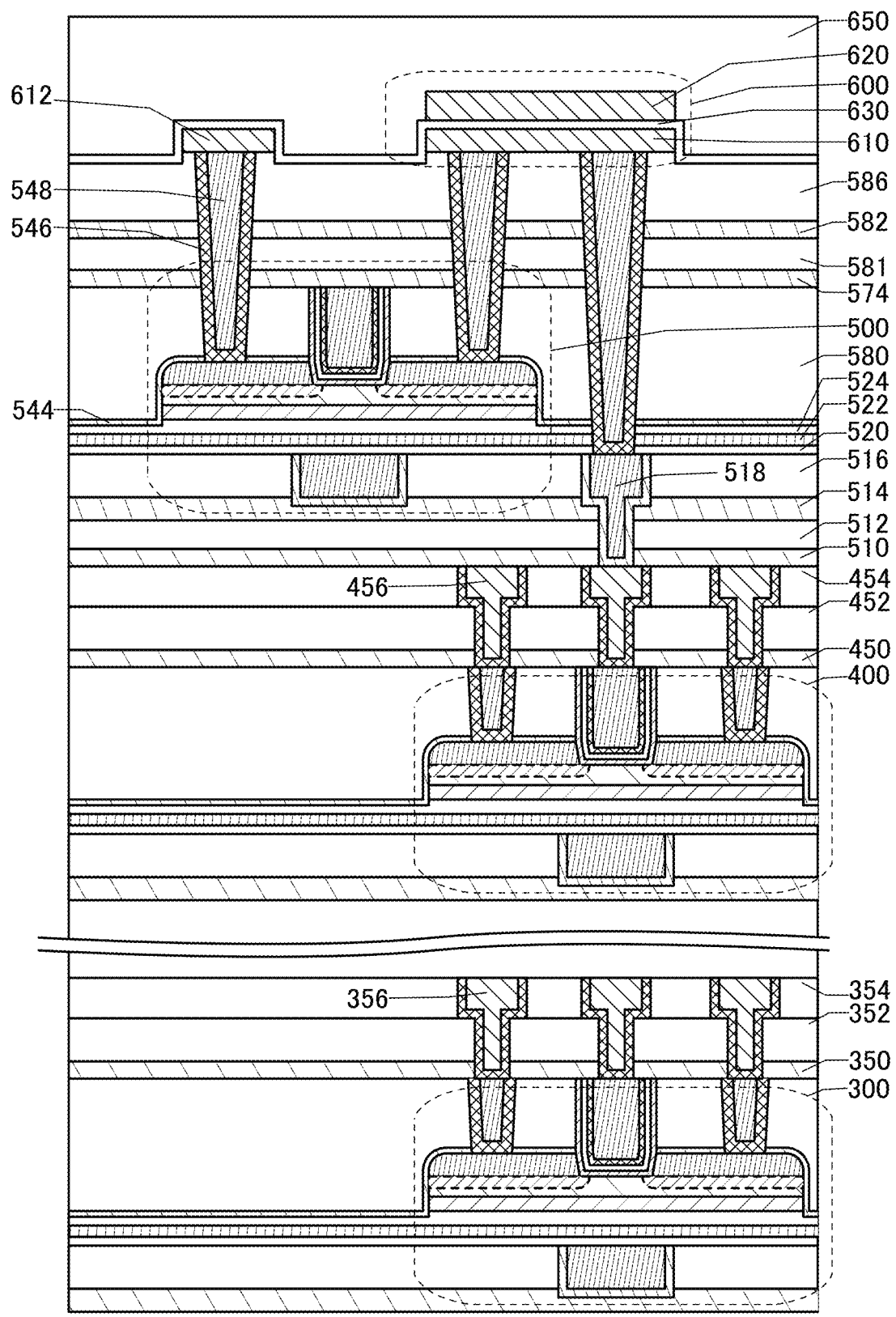
FIG. 10 is a schematic cross-sectional view illustrating a structure example of a memory device.

Note that the transistor 300 illustrated in FIG. 8 is an example and the structure is not limited thereto; an appropriate transistor can be used in accordance with a circuit structure or a driving method. For example, when the semiconductor device is a single-polarity circuit using only OS transistors (which means a circuit constituted by transistors having the same polarity, e.g., only n-channel transistors), the transistor 300 has a structure similar to those of the transistor 400 and the transistor 500 using an oxide semiconductor, as illustrated in FIG. 10. Note that the details of the transistor 400 and the transistor 500 will be described later.

Although not illustrated, in the memory device in FIG. 10, a Si transistor may be provided below the transistor 300. Such a structure can be applied to the memory device 100B described in the above embodiment, for example. Specifically, in the memory device 100B, the transistor M1 can be the transistor 400, the transistor M2 can be the transistor 500, the transistor OTr4, the transistor OTr5, and the transistors included in the circuit RDCa can each be the transistor 300, and the transistors included in the circuit RDCb can each be the Si transistor.

An insulator 320, an insulator 322, an insulator 324, and an insulator 326 are stacked sequentially to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen in its composition, and silicon nitride oxide refers to a material that contains nitrogen at a higher proportion than oxygen in its composition. Furthermore, in this specification, aluminum oxynitride refers to a material that contains oxygen at a higher proportion than nitrogen in its composition, and aluminum nitride oxide refers to a material that contains nitrogen at a higher proportion than oxygen in its composition.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

Furthermore, as the insulator 324, it is preferable to use a film having a barrier property that prevents diffusion of hydrogen and impurities from the substrate 311, the transistor 300, or the like into regions where the transistor 400 and the transistor 500 are provided.

For the film having a barrier property against hydrogen, silicon nitride formed by a CVD method can be used, for example. Here, diffusion of hydrogen into a semiconductor element including an oxide semiconductor, such as the transistor 400 or the transistor 500, degrades the characteristics of the semiconductor element in some cases. Therefore, a film that inhibits hydrogen diffusion is preferably used between the transistor 400 and the transistor 300. The film that inhibits hydrogen diffusion is specifically a film that releases a small amount of hydrogen.

The amount of released hydrogen can be analyzed by thermal desorption spectroscopy (TDS) or the like, for example. The amount of hydrogen released from the insulator 324 which is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

In addition, a conductor 328, a conductor 330, and the like that are electrically connected to a wiring or the like in the above layer are embedded in the insulator 320, the insulator 322, the insulator 324, and the insulator 326. Note that the conductor 328 and the conductor 330 each have a function of a plug or a wiring. That is, the insulator 322, the insulator 324, the insulator 326, the conductor 328, and the conductor 330 may collectively function as a wiring layer. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be additionally provided over the insulator 326 and the conductor 330. For example, in FIG. 8, an insulator 350, an insulator 352, and an insulator 354 are stacked sequentially. Furthermore, a conductor 356 is formed in the insulator 350, the insulator 352, and the insulator 354. The conductor 356 has a function of a plug or a wiring connected to the transistor 300. Note that the conductor 356 can be provided using a material similar to those for the conductor 328 and the conductor 330.

In the above, the wiring layer including the conductor 328, the conductor 330, and the conductor 356 is described; however, the semiconductor device of this embodiment is not limited thereto. Above the transistor 300, one wiring layer may be provided, or three or more wiring layers similar to the wiring layer including the conductor 356 may be provided.

For example, like the insulator 324, the insulator 350 is preferable formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 can be separated from the transistor 400 and the transistor 500 by a barrier layer, so that diffusion of hydrogen from the transistor 300 into the transistor 400 and the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

In FIG. 8, an insulator 360 is provided over the insulator 354 and the conductor 356, for example. For example, like the insulator 324, the insulator 360 is preferably formed using an insulator having a barrier property against hydrogen. With this structure, the transistor 300 can be separated from the transistor 400 and the transistor 500 by a barrier layer, so that diffusion of hydrogen from the transistor 300 into the transistor 400 and the transistor 500 can be inhibited.

An insulator 362 is provided over the transistor 300. For the insulator 362, a material similar to that for the insulator 320, the insulator 322, the insulator 324, or the insulator 326 can be used, for example.

An insulator 414 and an insulator 416 are sequentially stacked over the insulator 362. A substance having a barrier property against oxygen and hydrogen is preferably used for either the insulator 414 or the insulator 416.

For example, for the insulator 414, it is preferable to use a film having a barrier property that prevents diffusion of hydrogen and impurities from the substrate 311 or a region where the transistor 300 is provided into the region where the transistor 500 is provided. Therefore, a material similar to that for the insulator 324 can be used.

As the film having a barrier property against hydrogen, a metal oxide such as aluminum oxide, hafnium oxide, or tantalum oxide is preferably used for the insulator 414, for example.

In particular, aluminum oxide has an excellent blocking effect that prevents the passage of both oxygen and impurities such as hydrogen and moisture, which are factors of a change in electrical characteristics of the transistor. Accordingly, aluminum oxide can prevent entry of impurities such as hydrogen and moisture into the transistor 400 and the transistor 500 in a manufacturing process of the transistor and after the manufacturing process. In addition, release of oxygen from the oxide included in the transistor 400 and the transistor 500 can be inhibited. Therefore, aluminum oxide is suitably used for a protective film for the transistor 400 and the transistor 500.

For the insulator 416, a material similar to that for the insulator 320 can be used, for example. Furthermore, when a material with a comparatively low permittivity is used for these insulators, parasitic capacitance generated between wirings can be reduced. For example, a silicon oxide film, a silicon oxynitride film, or the like can be used for the insulator 416.

A conductor functioning as a plug or a wiring may be embedded in the insulator 414 and the insulator 416 (not illustrated). The conductor can be provided using a material similar to those for the conductor 328 and the conductor 330, for example. The conductor is preferably a conductor having a barrier property against oxygen, hydrogen, and water. In such a structure, the transistor 300 can be separated from the transistor 400 and the transistor 500 by a layer having a barrier property against oxygen, hydrogen, and water; thus, diffusion of hydrogen from the transistor 300 into the transistor 400 and the transistor 500 can be inhibited.

The transistor 400 is provided above the insulator 416. The transistor 400 can have the same structure as the transistor 500, for example. For the specific structure of the transistor 400, a later description of the transistor 500 is referred to.

Over the transistor 400, an insulator 450, an insulator 452, and an insulator 454 are stacked sequentially. Furthermore, a conductor 456 is formed in the insulator 450, the insulator 452, and the insulator 454. Note that the conductor 456 has a function of a plug or a wiring. That is, the insulator 450, the insulator 452, the insulator 454, and the conductor 456 may collectively function as a wiring layer. Note that the conductor 456 can be provided using a material similar to those for the conductor 328 and the conductor 330.

For example, like the insulator 324, the insulator 450 is preferably formed using an insulator having a barrier property against hydrogen. Thus, the insulator 450 is preferably formed using a material that can be used for the insulator 324.

Although the wiring layer including the conductor 456 is described above, the semiconductor device of this embodiment is not limited thereto. Two or more wiring layers similar to the wiring layer including the conductor 456 may be provided.

An insulator 510, an insulator 512, an insulator 514, and an insulator 516 are sequentially stacked over the insulator 454 and the conductor 456. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen and impurities from a region below the insulator 510, for example, into the region where the transistor 500 is provided. Therefore, a material similar to that for the insulator 324, the insulator 414, or the like can be used.

In addition, for the insulator 512 and the insulator 516, a material similar to that for the insulator 320 can be used, for example. Furthermore, when a material with a comparatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water.

The transistor 500 is provided above the insulator 516.

As illustrated in FIG. 11A and FIG. 11B, the transistor 500 includes the conductor 503 placed to be embedded in the insulator 514 and the insulator 516, an insulator 520 placed over the insulator 516 and the conductor 503, an insulator 522 placed over the insulator 520, an insulator 524 placed over the insulator 522, an oxide 530a placed over the insulator 524, an oxide 530b placed over the oxide 530a, a conductor 542a and a conductor 542b placed apart from each other over the oxide 530b, an insulator 580 that is placed above the insulator 522, the conductor 542a, and the conductor 542b and is provided with an opening formed to overlap with a region between the conductor 542a and the conductor 542b, an oxide 530c placed on a bottom and a side surface of the opening, an insulator 550 placed on a formation surface of the oxide 530c, and a conductor 560 placed on a formation surface of the insulator 550.

As illustrated in FIG. 11A and FIG. 11B, an insulator 544 is preferably provided between the insulator 580 and each of the oxide 530a, the oxide 530b, the conductor 542a, and the conductor 542b. In addition, as illustrated in FIG. 11A and FIG. 11B, the conductor 560 preferably includes a conductor 560a provided on the inner side of the insulator 550 and a conductor 560b provided to be embedded on the inner side of the conductor 560a. As illustrated in FIG. 11A and FIG. 11B, an insulator 574 is preferably provided over the insulator 580, the conductor 560, and the insulator 550.

Note that in the following description, the oxide 530a, the oxide 530b, and the oxide 530c are sometimes collectively referred to as an oxide 530.

The transistor 500 is illustrated to have a structure in which the three layers of the oxide 530a, the oxide 530b, and the oxide 530c are stacked in the region where the channel is formed and in the vicinity thereof; however, one embodiment of the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is illustrated to have a stacked-layer structure of two layers in the transistor 500, one embodiment of the present invention is not limited thereto. For example, the conductor 560 may have a single-layer structure or a stacked-layer structure of three or more layers. Note that the transistor 500 illustrated in FIG. 8, FIG. 11A, and FIG. 11B is an example, and the structure is not limited thereto; an appropriate transistor can be used in accordance with a circuit structure or a driving method.

Here, the conductor 560 functions as a gate electrode of the transistor, and the conductor 542a and the conductor 542b each function as a source electrode or a drain electrode. As described above, the conductor 560 is formed to be embedded in the opening of the insulator 580 and the region interposed between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not include a region overlapping with the conductor 542a or the conductor 542b. Thus, parasitic capacitance formed between the conductor 560 and each of the conductor 542*a* and the conductor 542*b* can be reduced. As a result, the transistor 500 can have increased switching speed and excellent frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 not in synchronization with but independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is placed to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503*a* is formed in contact with an inner wall of an opening of the insulator 514 and the insulator 516, and a conductor 503*b* is formed on the inner side. Although the transistor 500 is illustrated to have a structure in which the conductor 503*a* and the conductor 503*b* are stacked, one embodiment of the present invention is not limited thereto. For example, the conductor 503 may be provided as a single layer or to have a stacked-layer structure of three or more layers.

Here, for the conductor 503*a*, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which the oxygen is less likely to pass). Note that in this specification, a function of inhibiting diffusion of impurities or oxygen means a function of inhibiting diffusion of any one or all of the impurities and oxygen.

For example, when the conductor 503*a* has a function of inhibiting diffusion of oxygen, a reduction in conductivity of the conductor 503*b* due to oxidation can be inhibited.

In addition, in the case where the conductor 503 also functions as a wiring, a conductive material with high conductivity that contains tungsten, copper, or aluminum as its main component is preferably used for the conductor 503*b*. In that case, the conductor 503*a* is not necessarily provided. Note that the conductor 503*b* is illustrated as a single layer but may have a stacked-layer structure, for example, a stack of any of the above conductive materials and titanium or titanium nitride.

The insulator 520, the insulator 522, and the insulator 524 have a function of a second gate insulating film.

Here, as the insulator 524 in contact with the oxide 530, an insulator containing oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved. Note that in this specification and the like, an oxygen vacancy in a metal oxide is sometimes referred to as Vo.

The oxygen vacancy (Vo) is sometimes formed when hydrogen and oxygen bonded to a metal element, which are contained in the metal oxide, react with each other to be water. A transistor using a metal oxide is likely to change its electrical characteristics when impurities or oxygen vacancies (Vo) exist in a region of the metal oxide where a channel is formed, which might degrade the reliability. In some cases, hydrogen in the vicinity of an oxygen vacancy (Vo) forms a defect that is an oxygen vacancy (Vo) into which hydrogen enters (hereinafter sometimes referred to as VoH), which generates an electron serving as a carrier. Therefore, when the region of the oxide semiconductor where a channel is formed includes oxygen vacancies, the transistor tends to have normally-on characteristics (the characteristics with which, even when no voltage is applied to the gate electrode, the channel exits and a current flows through the transistor). Therefore, the impurities, oxygen vacancies, and VoH are preferably reduced as much as possible in the region of the oxide semiconductor where a channel is formed. In other words, it is preferable that the region of the oxide semiconductor where a channel is formed have a low carrier concentration and be of an i-type (intrinsic) or substantially i-type.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in a range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator in the vicinity of the oxide 530 in some cases. Part of hydrogen is diffused into or gettered (also referred to as gettering) by the conductor 542*a* and the conductor 542*b* in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, in other words, a reaction of "Vo+O→null" is promoted. Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of VoH.

In addition, in the case where the insulator 524 includes an excess-oxygen region, it is preferable that the insulator 522 have a function of inhibiting diffusion of oxygen (e.g., an oxygen atom, an oxygen molecule, or the like) (through which the oxygen is less likely to pass).

When the insulator 522 has a function of inhibiting diffusion of oxygen or impurities, oxygen contained in the oxide 530 does not diffuse into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which the oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride, which have thermal stability, are suitable. Furthermore, when an insulator that is a high-k material is combined with silicon oxide or silicon oxynitride, the insulator 520 having a stacked-layer structure that has thermal stability and a high dielectric constant can be obtained.

In the transistor 500 illustrated in FIG. 11A and FIG. 11B, the second gate insulating film has a stacked-layer structure of three layers including the insulator 520, the insulator 522, and the insulator 524; however, the second gate insulating film may have a single-layer structure, a two-layer structure, or a stacked-layer structure of four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds of elements selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide that can be used as the oxide 530 is preferably a CAAC-OS (C-Axis Aligned Crystalline Oxide Semiconductor) or a CAC-OS (Cloud-Aligned Composite Oxide Semiconductor). Alternatively, an In—Ga oxide, an In—Zn oxide, an In oxide, or the like may be used as the oxide 530.

Furthermore, a metal oxide with a low carrier concentration is preferably used in the transistor 500. In order to reduce the carrier concentration of the metal oxide, the concentration of impurities in the metal oxide is reduced so that the density of defect states can be reduced. Examples of impurities in the metal oxide include hydrogen, nitrogen, alkali metal, alkaline earth metal, iron, nickel, and silicon.

As described above, in the case where the oxide 530 includes an oxygen vacancy, hydrogen entered the oxygen vacancy sometimes causes bonding between the oxygen vacancy and the hydrogen to form VoH, in which case the VoH serves as a donor and an electron serving as a carrier might be generated. In other cases, bonding of part of hydrogen to oxygen bonded to a metal atom causes generation of an electron serving as a carrier. Thus, a transistor using a metal oxide containing a large amount of hydrogen is likely to have normally-on characteristics. Moreover, hydrogen in a metal oxide easily moves by stress such as heat and an electric field; thus, the reliability of a transistor may be low when the metal oxide contains a large amount of hydrogen. In one embodiment of the present invention, VoH in the oxide 530 is preferably reduced as much as possible so that the oxide 530 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose VoH is sufficiently reduced. When a metal oxide in which impurities such as VoH are sufficiently reduced is used for a channel formation region of a transistor, stable electrical characteristics can be given.

A defect that is an oxygen vacancy into which hydrogen has entered can function as a donor of a metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" mentioned in this specification and the like can be replaced with "donor concentration" in some cases.

Consequently, when a metal oxide is used as the oxide 530, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, stable electrical characteristics can be given.

In the case where a metal oxide is used as the oxide 530, contact between the oxide 530 and each of the conductor 542a and the conductor 542b may diffuse oxygen in the oxide 530 into the conductor 542a and the conductor 542b, resulting in oxidation of the conductor 542a and the conductor 542b in some cases. It is highly possible that oxidation of the conductor 542a and the conductor 542b lowers the conductivity of the conductor 542a and the conductor 542b. Note that diffusion of oxygen from the oxide 530 into the conductor 542a and the conductor 542b can be rephrased as absorption of oxygen in the oxide 530 by the conductor 542a and the conductor 542b.

When oxygen in the oxide 530 diffuses into the conductor 542a and the conductor 542b, a different layer is sometimes formed between the conductor 542a and the oxide 530b and between the conductor 542b and the oxide 530b. The different layer contains a larger amount of oxygen than the conductor 542a and the conductor 542b and thus presumably has an insulating property. In this case, a three-layer structure of the conductor 542a or the conductor 542b, the different layer, and the oxide 530b can be regarded as a three-layer structure of a metal, an insulator, and a semiconductor and is sometimes referred to as a MIS (Metal-Insulator-Semiconductor) structure or referred to as a diode-connected structure mainly formed of the MIS structure.

Note that the layer is not necessarily formed between the oxide 530b and each of the conductor 542a and the conductor 542b; for example, the layer is formed between the oxide 530c and each of the conductor 542a and the conductor 542b in some cases.

The metal oxide functioning as the channel formation region in the oxide 530 has a band gap of more than or equal to 2 eV, preferably more than or equal to 2.5 eV. With the use of a metal oxide having such a large band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of a plurality of oxide layers that differ in the atomic ratio of metal atoms. Specifically, the atomic proportion of the element M in the constituent elements in the metal oxide used as the oxide 530a is preferably higher than the atomic proportion of the element M in the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, a metal oxide that can be used as the oxide 530a or the oxide 530b can be used as the oxide 530c.

Specifically, as the oxide 530a, a metal oxide in which an atomic ratio of In to Ga and Zn is In:Ga:Zn=1:3:4 or 1:1:0.5 is used. In addition, as the oxide 530b, a metal oxide in which an atomic ratio of In to Ga and Zn is In:Ga:Zn=4:2:3 or 1:1:1 is used. In addition, as the oxide 530c, a metal oxide in which an atomic ratio of In to Ga and Zn is In:Ga:Zn=1:3:4 or an atomic ratio of Ga to Zn is Ga:Zn=2:1 or Ga:Zn=2:5 is used. Specific examples of the case where the oxide 530c has a stacked-layer structure include a stacked-layer structure of a layer in which an atomic ratio of In to Ga and Zn is In:Ga:Zn=4:2:3 and a layer with In:Ga:Zn=1:3:4; a stacked-layer structure of a layer in which an atomic ratio of Ga to Zn is Ga:Zn=2:1 and a layer in which an atomic ratio of In to Ga and Zn is In:Ga:Zn=4:2:3; a stacked-layer structure of a layer in which an atomic ratio of Ga to Zn is Ga:Zn=2:5 and a layer in which an atomic ratio of In to Ga and Zn is In:Ga:Zn=4:2:3; and a stacked-layer structure of gallium oxide and a layer in which an atomic ratio of In to Ga and Zn is In:Ga:Zn=4:2:3.

For example, in the case where the atomic ratio of In to the element M in the metal oxide used as the oxide 530a is lower than the atomic ratio of In to the element M in the metal oxide used as the oxide 530b, an In—Ga—Zn oxide having a composition with an atomic ratio of In:Ga:Zn=5:1:6 or a neighborhood thereof, In:Ga:Zn=5:1:3 or a neighborhood thereof, In:Ga:Zn=10:1:3 or a neighborhood thereof, or the like can be used as the oxide 530b.

As the oxide 530b, it is also possible to use a metal oxide having a composition of In:Zn=2:1, a composition of In:Zn=5:1, a composition of In:Zn=10:1, or a composition in the neighborhood of any one of these compositions, other than the above-described compositions.

These oxide 530a, the oxide 530b, and the oxide 530c are preferably combined to satisfy the above relationship of the atomic ratios. For example, it is preferable that the oxide 530a and the oxide 530c each be a metal oxide having a composition of In:Ga:Zn=1:3:4 or a composition in the neighborhood thereof and the oxide 530b be a metal oxide having a composition of In:Ga:Zn=4:2:3 to 4:2:4.1 or a composition in the neighborhood thereof. Note that the above composition represents the atomic ratio of an oxide formed over a base or the atomic ratio of a sputtering target. Moreover, it is suitable that the proportion of In is increased in the composition of the oxide 530b because the transistor can have a higher on-state current, higher field effect mobility, or the like.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used as the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element as its component; an alloy containing any of the above metal elements in combination; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

The conductor 542a and the conductor 542b are illustrated to have a single-layer structure in FIG. 11A and FIG. 11B, but may have a stacked-layer structure of two or more layers. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as illustrated in FIG. 11A, a region 543a and a region 543b are sometimes formed as low-resistance regions at an interface between the oxide 530 and the conductor 542a (the conductor 542b) and in the vicinity of the interface. In this case, the region 543a functions as one of a source region and a drain region, and the region 543b functions as the other of the source region and the drain region. Furthermore, the channel formation region is formed in a region interposed between the region 543a and the region 543b.

When the conductor 542a (the conductor 542b) is provided in contact with the oxide 530, the oxygen concentration in the region 543a (the region 543b) sometimes decreases. In addition, a metal compound layer containing the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used as the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, impurities such as water and hydrogen contained in the insulator 580 can be inhibited from diffusing into the oxide 530*b* through the oxide 530*c* and the insulator 550. Furthermore, oxidation of the conductor 560 due to excess oxygen contained in the insulator 580 can be inhibited.

The insulator 550 functions as a first gate insulating film. The insulator 550 is preferably placed in contact with the inner side (the top surface and the side surface) of the oxide 530*c*. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator that releases oxygen by heating is provided as the insulator 550 in contact with the top surface of the oxide 530*c*, oxygen can be effectively supplied from the insulator 550 to the channel formation region of the oxide 530*b* through the oxide 530*c*. Furthermore, as in the insulator 524, the concentration of impurities such as water or hydrogen in the insulator 550 is preferably lowered. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide that inhibits diffusion of oxygen inhibits diffusion of excess oxygen from the insulator 550 into the conductor 560. That is, reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of a transistor progress, a problem such as leakage current might arise because of a thinner gate insulating film; for that reason, when the insulator functioning as the gate insulating film has a stacked-layer structure of a high-k material and a thermally stable material, a gate potential during transistor operation can be reduced while the physical thickness is kept. Furthermore, the stacked-layer structure can be thermally stable and have a high dielectric constant.

The conductor 560 functioning as the first gate electrode is illustrated to have a two-layer structure in FIG. 11A and FIG. 11B, but may have a single-layer structure or a stacked-layer structure of three or more layers.

For the conductor 560*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom and an oxygen molecule). When the conductor 560*a* has a function of inhibiting diffusion of oxygen, it is possible to inhibit a reduction in conductivity of the conductor 560*b* due to oxidation caused by oxygen contained in the insulator 550.

As a conductive material having a function of inhibiting diffusion of oxygen, for example, tantalum, tantalum nitride, ruthenium, ruthenium oxide, or the like is preferably used. For the conductor 560*a*, the oxide semiconductor that can be used as the oxide 530 can be used. In that case, when the conductor 560*b* is formed by a sputtering method, the conductor 560*a* can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560*b*. Furthermore, the conductor 560*b* also functions as a wiring and thus a conductor having high conductivity is preferably used as the conductor 560*b*. For example, a conductive material containing tungsten, copper, or aluminum as its main component can be used. Moreover, the conductor 560*b* may have a stacked-layer structure, for example, a stacked-layer structure of the above conductive material and titanium or titanium nitride.

The insulator 580 is provided over the conductor 542*a* and the conductor 542*b* with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530*c*, oxygen in the insulator 580 can be efficiently supplied to the oxide 530 through the oxide 530*c*. Note that the concentration of impurities such as water or hydrogen in the insulator 580 is preferably reduced.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is formed by a sputtering method, excess-oxygen regions can be provided in the insulator 550 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are placed in openings formed in the insulator 581, the insulator 574, the insulator 580, and the insulator 544. The conductor 540a and the conductor 540b are provided to face each other with the conductor 560 interposed therebetween. The structures of the conductor 540a and the conductor 540b are similar to a structure of a conductor 546 and a conductor 548 that are described later.

An insulator 582 is provided over the insulator 581. A substance having a barrier property against oxygen or hydrogen is preferably used for the insulator 582. Therefore, a material similar to that for the insulator 514 can be used for the insulator 582. For example, a metal oxide such as aluminum oxide, hafnium oxide, or tantalum oxide is preferably used for the insulator 582.

In particular, aluminum oxide has an excellent blocking effect that prevents the passage of both oxygen and impurities such as hydrogen and moisture, which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for the protective film of the transistor 500.

In addition, an insulator 586 is provided over the insulator 582. For the insulator 586, a material similar to that for the insulator 320 can be used. Furthermore, when a material with a comparatively low permittivity is used for these insulators, parasitic capacitance generated between wirings can be reduced. For example, a silicon oxide film or a silicon oxynitride film can be used for the insulator 586.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Note that after the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. In the case where an opening is formed to surround the transistor 500, for example, formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. For the insulator having a high barrier property against hydrogen or water, a material similar to that for the insulator 522 can be used, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 are illustrated to have a single-layer structure in FIG. 8, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In addition, in the case where the conductor is formed concurrently with another component such as a conductor, Cu (copper), Al (aluminum), or the like, which is a low-resistance metal material, is used.

An insulator 650 is provided over the conductor 620 and the insulator 630. The insulator 650 can be provided using a material similar to that for the insulator 320. The insulator 650 may function as a planarization film that covers an uneven shape thereunder.

With the use of this structure, a change in electrical characteristics can be inhibited and reliability can be improved in a semiconductor device using a transistor including an oxide semiconductor. Alternatively, a semiconductor device using a transistor including an oxide semiconductor can be miniaturized or highly integrated.

Next, other structure examples of the OS transistor illustrated in FIG. 8, FIG. 9, and FIG. 10 are described.

Figure 12A:
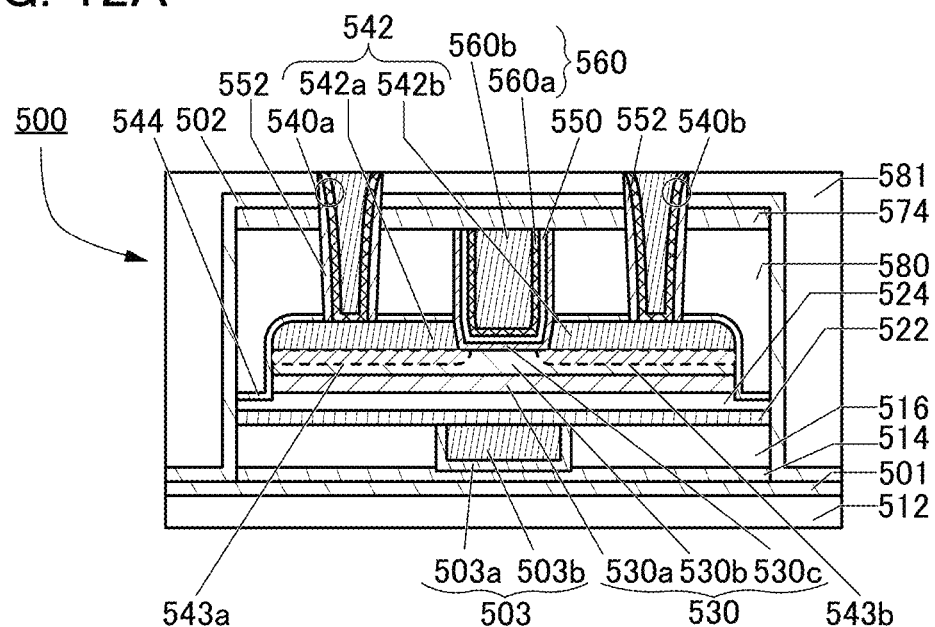
FIG. 12A and FIG. 12B are schematic cross-sectional views illustrating a structure example of a transistor.
Figure 12B:
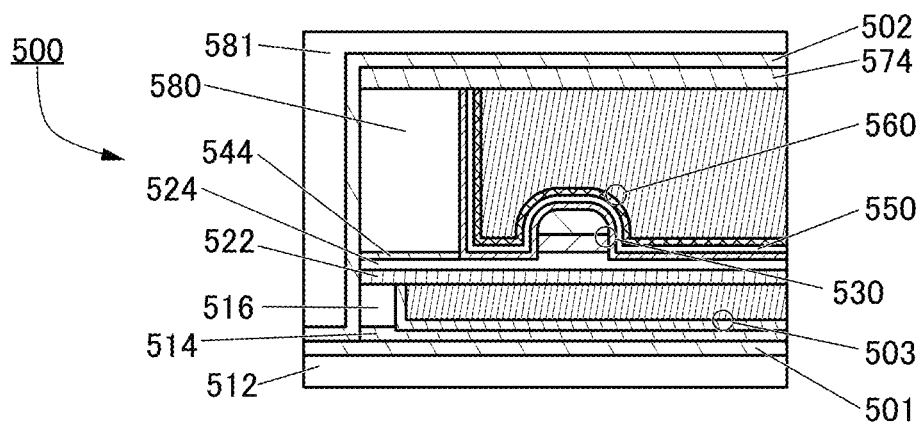

The transistor 500 having the structure illustrated in FIG. 12A and FIG. 12B is a modification example of the transistor 500 illustrated in FIG. 11A and FIG. 11B. FIG. 12A is a cross-sectional view of the transistor 500 in the channel length direction, and FIG. 12B is a cross-sectional view of the transistor 500 in the channel width direction. Note that the structure illustrated in FIG. 12A and FIG. 12B can also be employed for other transistors, such as the transistor 300, included in the semiconductor device of one embodiment of the present invention.

The transistor 500 having the structure illustrated in FIG. 12A and FIG. 12B includes an insulator 501 and an insulator 502, which is different from the transistor 500 having the structure illustrated in FIG. 11A and FIG. 11B. In addition, insulators 552 are provided in contact with a side surface of the conductor 540a and a side surface of the conductor 540b, which is different from the transistor 500 having the structure illustrated in FIG. 11A and FIG. 11B. Furthermore, the insulator 520 is not included, which is different from the transistor 500 having the structure illustrated in FIG. 11A and FIG. 11B.

In the transistor 500 having the structure illustrated in FIG. 12A and FIG. 12B, the insulator 501 is provided over the insulator 512. In addition, the insulator 502 is provided over the insulator 574 and the insulator 501.

In the transistor 500 having the structure illustrated in FIG. 12A and FIG. 12B, the insulator 514, the insulator 516, the insulator 522, the insulator 524, the insulator 544, the insulator 580, and the insulator 574 are provided and covered with the insulator 502. That is, the insulator 502 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 501. Thus, the oxide 530 and the like are isolated from the outside by the insulator 502 and the insulator 501.

It is preferable that the insulator 501 and the insulator 502 have higher capability of inhibiting diffusion of hydrogen (e.g., at least one of a hydrogen atom, a hydrogen molecule, and the like) or a water molecule. For example, the insulator 501 and the insulator 502 are preferably formed using silicon nitride or silicon nitride oxide that is a material having a high hydrogen barrier property. This can inhibit diffusion of hydrogen or the like into the oxide 530, whereby degradation of the characteristics of the transistor 500 can be inhibited. Consequently, the reliability of the semiconductor device of one embodiment of the present invention can be increased.

The insulator 552 is provided in contact with the insulator 581, the insulator 502, the insulator 574, the insulator 580, and the insulator 544. The insulator 552 preferably has a function of inhibiting diffusion of hydrogen or water molecules. For example, for the insulator 552, an insulator such as silicon nitride, aluminum oxide, or silicon nitride oxide that is a material having a high hydrogen barrier property is preferably used. In particular, silicon nitride is suitably used for the insulator 552 because of its high hydrogen barrier property. By using a material having a high hydrogen barrier property for the insulator 552, diffusion of impurities such as water or hydrogen from the insulator 580 and the like into the oxide 530 through the conductor 540a and the conductor 540b can be inhibited. Furthermore, oxygen contained in the insulator 580 can be inhibited from being absorbed by the conductor 540a and the conductor 540b. Thus, the reliability of the semiconductor device of one embodiment of the present invention can be increased.

Figure 13:
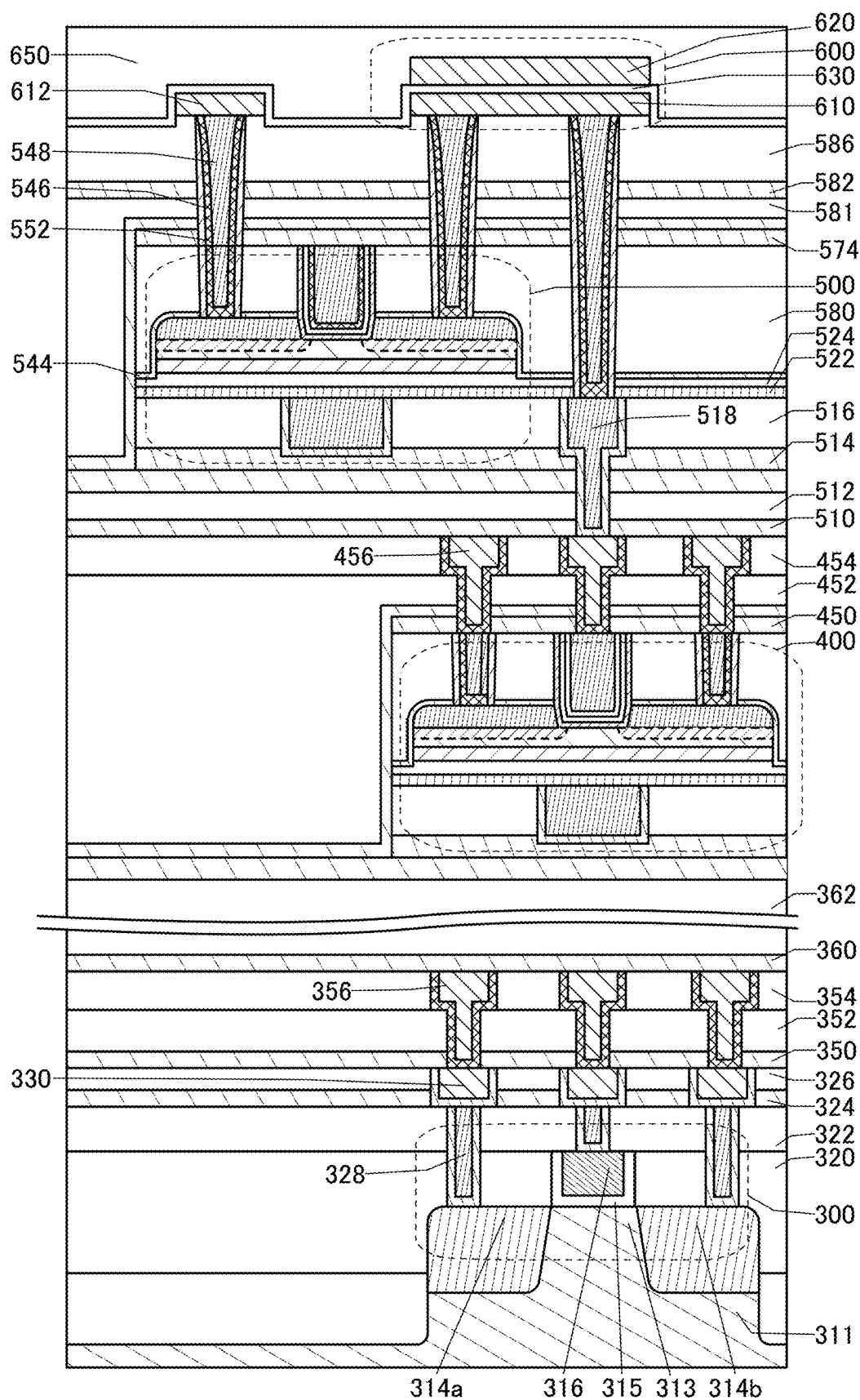
FIG. 13 is a schematic cross-sectional view illustrating a structure example of a memory device.

FIG. 13 is a cross-sectional view illustrating a structure example of the semiconductor device in the case where the transistor 400 and the transistor 500 have the structure illustrated in FIG. 12A and FIG. 12B. The insulator 552 is provided on a side surface of the conductor 546.

Figure 14A:
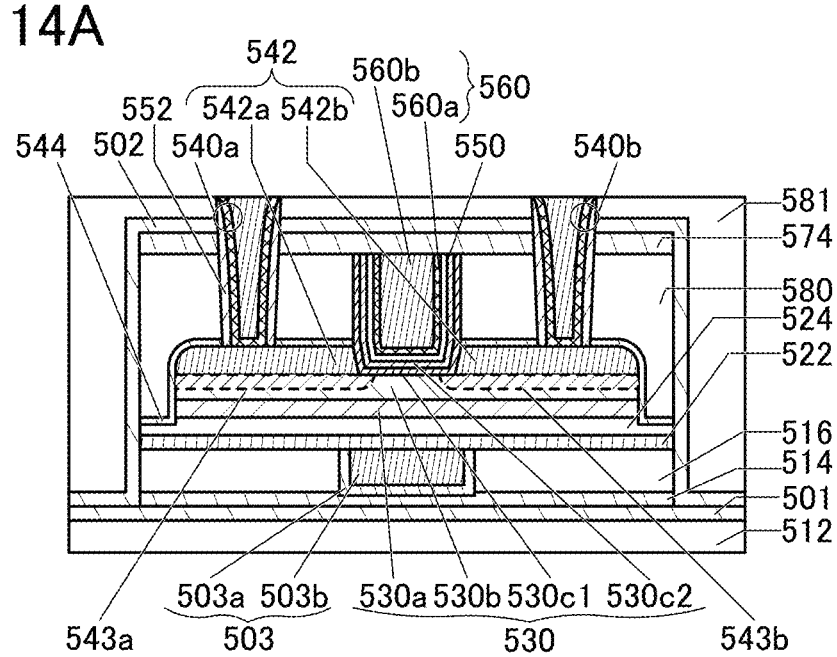
FIG. 14A and FIG. 14B are schematic cross-sectional views illustrating a structure example of a transistor.
Figure 14B:
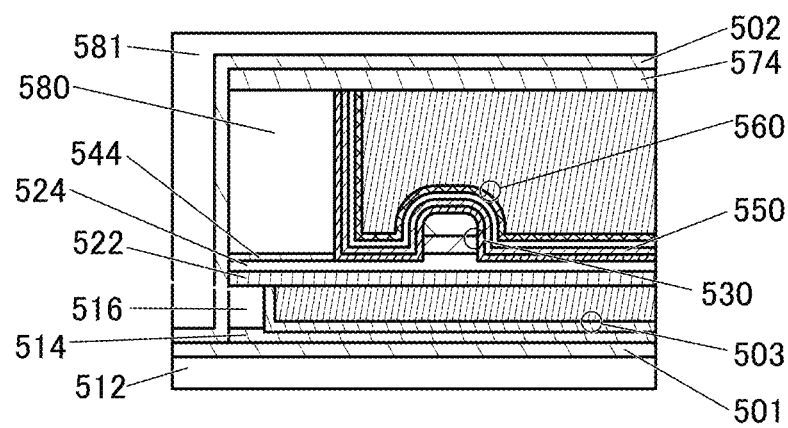

The transistor structure of the transistor 500 illustrated in FIG. 12A and FIG. 12B may be changed according to circumstances. As the modification example of the transistor 500 illustrated in FIG. 12A and FIG. 12B, a transistor illustrated in FIG. 14A and FIG. 14B can be employed, for example. FIG. 14A is a cross-sectional view of the transistor in the channel length direction and FIG. 14B is a cross-sectional view of the transistor in the channel width direction. The transistor illustrated in FIG. 14A and FIG. 14B is different from the transistor illustrated in FIG. 12A and FIG. 12B in that the oxide 530c has a two-layer structure of an oxide 530c1 and an oxide 530c2.

The oxide 530c1 is in contact with a top surface of the insulator 524, a side surface of the oxide 530a, a top surface and a side surface of the oxide 530b, side surfaces of the conductor 542a and the conductor 542b, a side surface of the insulator 544, and a side surface of the insulator 580. The oxide 530c2 is in contact with the insulator 550.

An In—Zn oxide can be used as the oxide 530c1, for example. For the oxide 530c2, it is possible to use a material similar to the material that can be used for the oxide 530c when the oxide 530c has a single-layer structure. For example, as the oxide 530c2, a metal oxide with In:Ga:Zn=1:3:4 [atomic ratio], Ga:Zn=2:1 [atomic ratio], or Ga:Zn=2:5 [atomic ratio] can be used.

When the oxide 530c has a two-layer structure of the oxide 530c1 and the oxide 530c2, the on-state current of the transistor can be increased as compared with the case where the oxide 530c has a single-layer structure. Thus, the transistor can be used as a power MOS transistor, for example. Note that the oxide 530c included in the transistor having the structure illustrated in FIG. 11A and FIG. 11B can also have a two-layer structure of the oxide 530c1 and the oxide 530c2.

The transistor having the structure illustrated in FIG. 14A and FIG. 14B can be used as, for example, the transistor 300 illustrated in FIG. 10. As described above, the transistor 300 can be used as, for example, the transistor OTr4, the transistor OTr5, the transistor OTr4m, the transistor OTr5m, or the like included in the circuit RDCa of the memory device 100B described in the above embodiment. Note that the transistor illustrated in FIG. 14A and FIG. 14B can also be used as the transistor 400, the transistor 500, or the like. In addition, the transistor illustrated in FIG. 14A and FIG. 14B can be used as a transistor other than the transistor 400 and the transistor 500 which are included in the memory device of one embodiment of the present invention.

Figure 15:
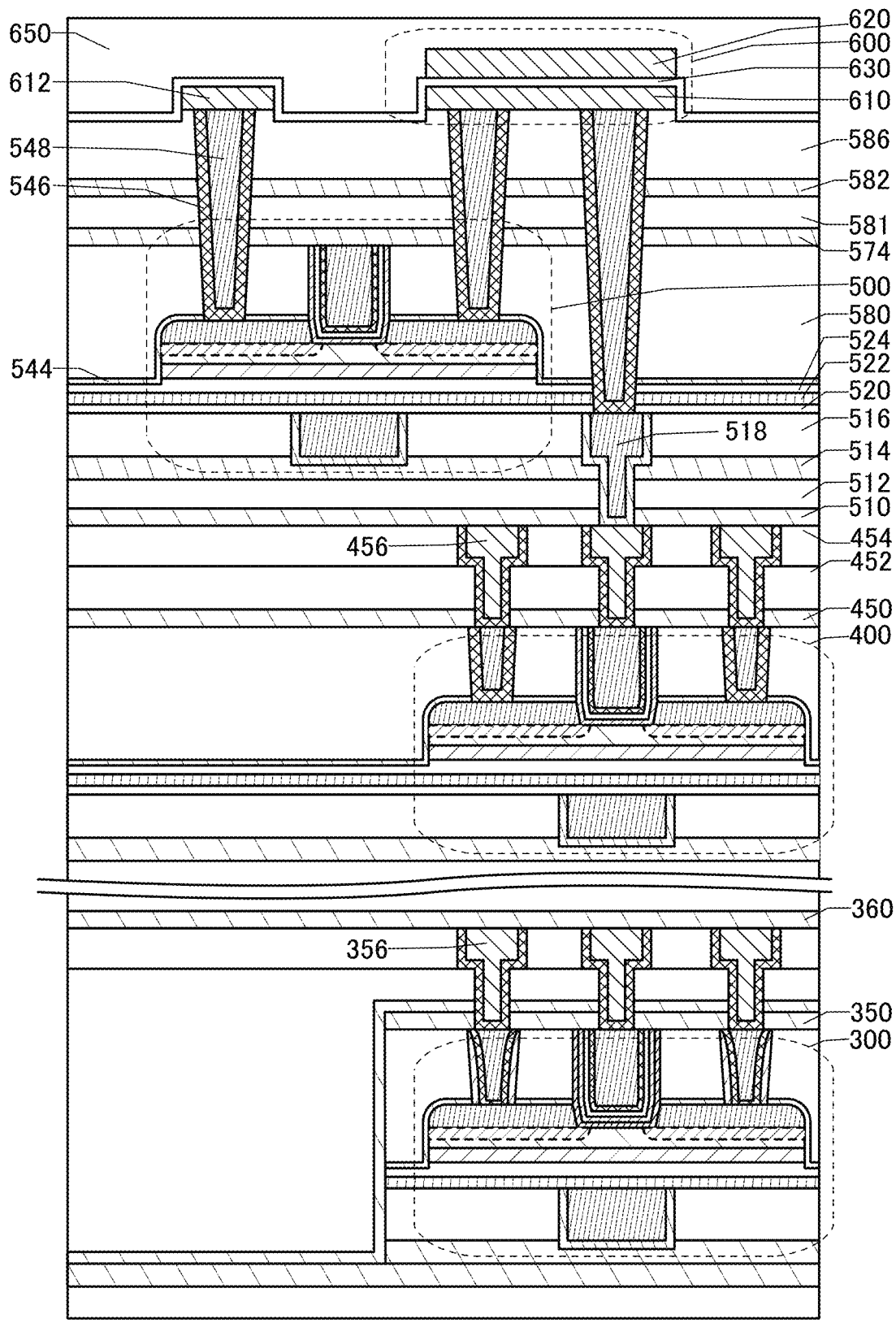
FIG. 15 is a schematic cross-sectional view illustrating a structure example of a memory device.

FIG. 15 is a cross-sectional view illustrating a structure example of a semiconductor device in which the transistor 500 has the transistor structure illustrated in FIG. 11A and the transistor 300 has the transistor structure illustrated in FIG. 14A. Note that a structure is employed in which the insulator 552 is provided on the side surface of the conductor 546 as in FIG. 13. As illustrated in FIG. 15, in the semiconductor device of one embodiment of the present invention, the transistor 300, the transistor 400, and the transistor 500 can have different structures while the transistor 300, the transistor 400, and the transistor 500 are OS transistors.

Next, a capacitor that can be used in the memory devices in FIG. 8 to FIG. 10, FIG. 13, and FIG. 15 is described.

Figure 16A:
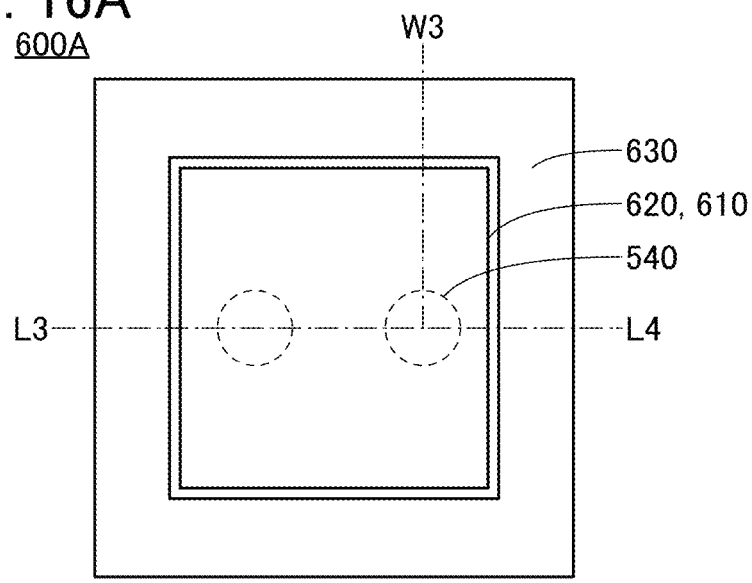
FIG. 16A is a top view illustrating a structure example of a capacitor.
Figure 16B:
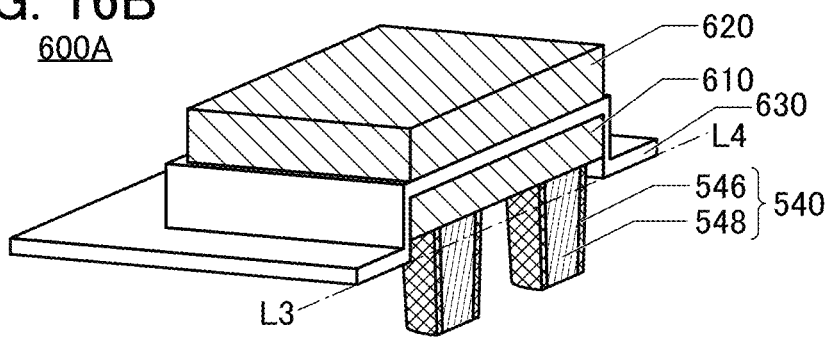
FIG. 16B and FIG. 16C are cross-sectional perspective views illustrating the structure example of the capacitor.
Figure 16C:
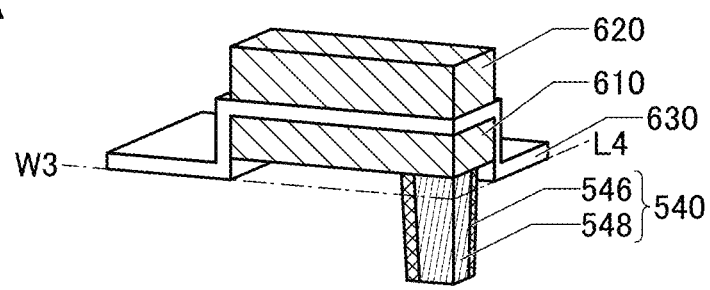

FIG. 16A to FIG. 16C illustrate a capacitor 600A as an example of the capacitor 600 that can be used in the memory devices illustrated in FIG. 8 to FIG. 10, FIG. 13, and FIG. 15. FIG. 16A is a top view of the capacitor 600A, FIG. 16B is a perspective view illustrating a cross section of the capacitor 600A along a dashed-dotted line L3-L4, and FIG. 16C is a perspective view illustrating a cross section of the capacitor 600A along a dashed-dotted line W3-L4. Note that for clarity of the drawings, FIG. 16B and FIG. 16C illustrate only the conductor 546 and conductor 548 (the conductor 546 and the conductor 548 are collectively denoted by 540), the conductor 610, the conductor 620, and the insulator 630.

The conductor 610 functions as one of a pair of electrodes of the capacitor 600A, and the conductor 620 functions as the other of the pair of electrodes of the capacitor 600A. The insulator 630 functions as a dielectric interposed between the pair of electrodes.

The insulator 630 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

Alternatively, for the insulator 630, a stacked-layer structure using a material with high dielectric strength such as silicon oxynitride and a high permittivity (high-k) material may be used, for example. In the capacitor 600A having such a structure, a sufficient capacitance can be ensured owing to the high permittivity (high-k) insulator, and the dielectric strength can be increased owing to the insulator with high dielectric strength, so that the electrostatic breakdown of the capacitor 600A can be inhibited.

As the insulator of a high permittivity (high-k) material (a material having a high dielectric constant), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

Alternatively, for example, a single layer or stacked layers of an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST), may be used as the insulator 630. In the case where the insulator 630 has stacked layers, a three-layer structure in which zirconium oxide, aluminum oxide, and zirconium oxide are formed in this order, or a four-layer structure in which zirconium oxide, aluminum oxide, zirconium oxide, and aluminum oxide are formed in this order can be employed, for example. For the insulator 630, a compound containing hafnium and zirconium may be employed, for example. As miniaturization and high integration of a semiconductor device progress, a problem such as leakage current from a transistor or a capacitor might arise because of a thinner dielectric used for a gate insulator and the capacitor. When a high-k material is used as an insulator functioning as the dielectric used for the gate insulator and the capacitor, a gate potential during the transistor operation can be reduced and the capacitance of the capacitor can be ensured while the physical thickness is kept.

A bottom portion of the conductor 610 in the capacitor 600 is electrically connected to the conductor 546 and the conductor 548. The conductor 546 and the conductor 548 function as plugs or wirings for connection to another circuit element. In FIG. 16A to FIG. 16C, the conductor 546 and the conductor 548 are collectively referred to as a conductor 540.

Although the capacitor 600 illustrated in each of FIG. 8 to FIG. 10, FIG. 13, FIG. 15, and FIG. 16A to FIG. 16C is a planar capacitor, the shape of the capacitor is not limited thereto. For example, the capacitor 600 may be a cylindrical capacitor 600B illustrated in FIG. 17A to FIG. 17C.

Figure 17A:
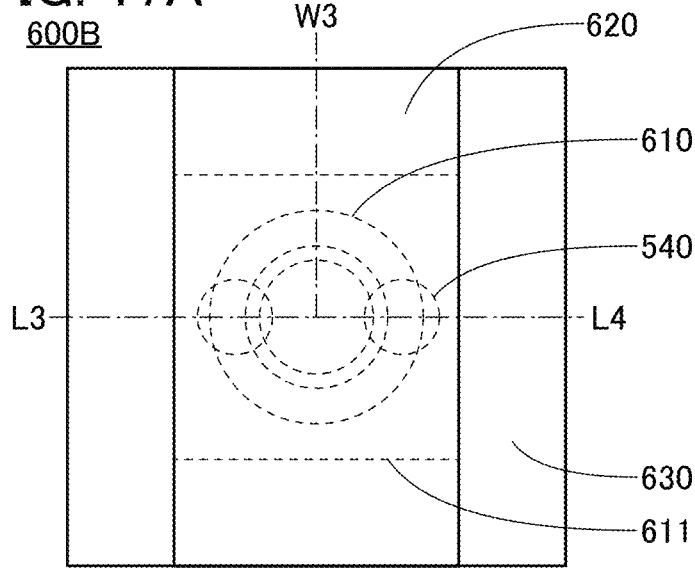
FIG. 17A is a top view illustrating a structure example of a capacitor.
Figure 17B:
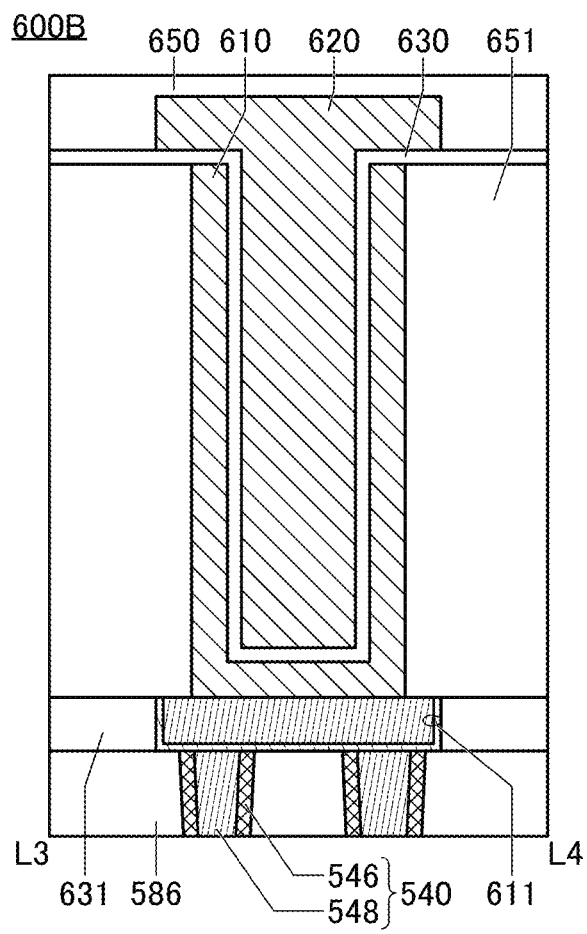
FIG. 17B is a cross-sectional view illustrating the structure example of the capacitor.
Figure 17C:
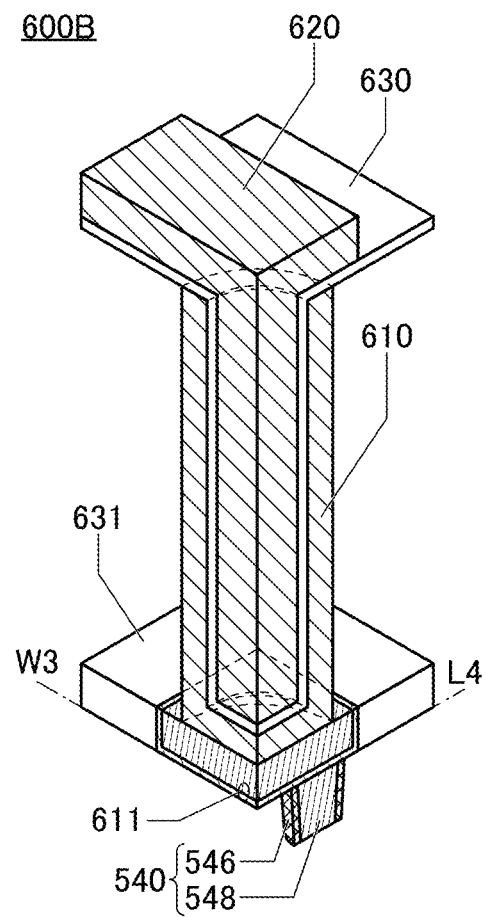
FIG. 17C is a cross-sectional perspective view illustrating the structure example of the capacitor.

FIG. 17A is a top view of the capacitor 600B, FIG. 17B is a cross-sectional view of the capacitor 600B along the dashed-dotted line L3-L4, and FIG. 17C is a perspective view illustrating a cross section of the capacitor 600B along the dashed-dotted line W3-L4. Note that for clarity of the drawings, FIG. 17C only illustrates the conductor 546 and conductor 548 (the conductor 546 and the conductor 548 are collectively denoted by 540), an insulator 631, the conductor 610, the conductor 620, and the insulator 630.

In FIG. 17B, the capacitor 600B includes the insulator 631 over the insulator 586 in which the conductor 540 is embedded, an insulator 651 having an opening portion, the conductor 610 functioning as one of a pair of electrodes, and the conductor 620 functioning as the other of the pair of electrodes.

For the insulator 631, a material similar to that for the insulator 586 can be used, for example.

A conductor 611 is embedded in the insulator 631 to be electrically connected to the conductor 540. For the conductor 611, a material similar to those for the conductor 330 and the conductor 518 can be used, for example.

For the insulator 651, a material similar to that for the insulator 586 can be used, for example.

The insulator 651 has the opening portion as described above, and the opening portion overlaps with the conductor 611.

The conductor 610 is formed on the bottom portion and the side surface of the opening portion. In other words, the conductor 610 overlaps with the conductor 611 and is electrically connected to the conductor 611.

The conductor 610 is formed in such a manner that an opening portion is formed in the insulator 651 by an etching method or the like, and then the conductor 610 is formed by a sputtering method, an ALD method, or the like. After that, the conductor 610 formed over the insulator 651 can be removed by a CMP (Chemical Mechanical Polishing) method or the like while the conductor 610 formed in the opening portion is left.

The insulator 630 is positioned over the insulator 651 and the formation surface of the conductor 610. Note that the insulator 630 functions as a dielectric interposed between the pair of electrodes in the capacitor.

The conductor 620 is formed over the insulator 630 so as to fill the opening portion of the insulator 651.

The insulator 650 is formed to cover the insulator 630 and the conductor 620.

The capacitance value of the cylindrical capacitor 600B illustrated in FIG. 17 can be higher than that of the planar capacitor 600A.

Note that this embodiment can be combined with any of the other embodiments in this specification as appropriate.

Embodiment 4

Described in this embodiment is a metal oxide (hereinafter also referred to as an oxide semiconductor) that can be used in an OS transistor described in the above embodiment.

A metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of the crystal structures of an oxide semiconductor will be described with reference to FIG. 18A. FIG. 18A is a diagram showing the classification of crystal structures of an oxide semiconductor, typically IGZO (a metal oxide containing In, Ga, and Zn).

As shown in FIG. 18A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that single crystal, poly crystal, and completely amorphous are excluded from the category of "Crystalline". The term "Crystal" includes single crystal and poly crystal.

Note that the structures in the thick frame in FIG. 18A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-Ray Diffraction (XRD) spectrum. FIG. 18B shows an XRD spectrum, which is obtained by GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 18B and obtained by GIXD measurement is hereinafter simply referred to as an XRD spectrum. The CAAC-IGZO film in FIG. 18B has a composition in the neighborhood of In:Ga:Zn=4:2:3 [atomic ratio]. The CAAC-IGZO film in FIG. 18B has a thickness of 500 nm.

As shown in FIG. 18B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. As shown in FIG. 18B, the peak at $2\theta$ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 18C shows a diffraction pattern of the CAAC-IGZO film. FIG. 18C shows a diffraction pattern obtained by the NBED method in which an electron beam is incident in the direction parallel to the substrate. The composition of the CAAC-IGZO film in FIG. 18C is In:Ga:Zn=4:2:3 [atomic ratio] or the neighborhood thereof. In the nanobeam electron diffraction method, electron diffraction is performed with a probe diameter of 1 nm.

As shown in FIG. 18C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 18A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer.

Such a layered structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is unlikely to occur. Entry of impurities, formation of defects, or the like might decrease the crystallinity of an oxide semiconductor, which means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic proportions of In, Ga, and Zn in the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] than the second region and lower [Ga] than the second region. Moreover, the second region has higher [Ga] than the first region and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

An oxide semiconductor can have any of various structures that show various different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the above-described oxide semiconductor is used for a transistor is described.

When the above-described oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charges captured by the trap states in an oxide semiconductor take a long time to be released and may behave like fixed electric charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration obtained by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor using an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

Note that this embodiment can be combined with any of the other embodiments in this specification as appropriate.

Embodiment 5

This embodiment describes a control logic circuit, a row driver circuit, a column driver circuit, and an output circuit that can be included in the memory device 100, the memory device 100A, the memory device 100B, the memory device 100C and the like in the above embodiment.

Figure 19:
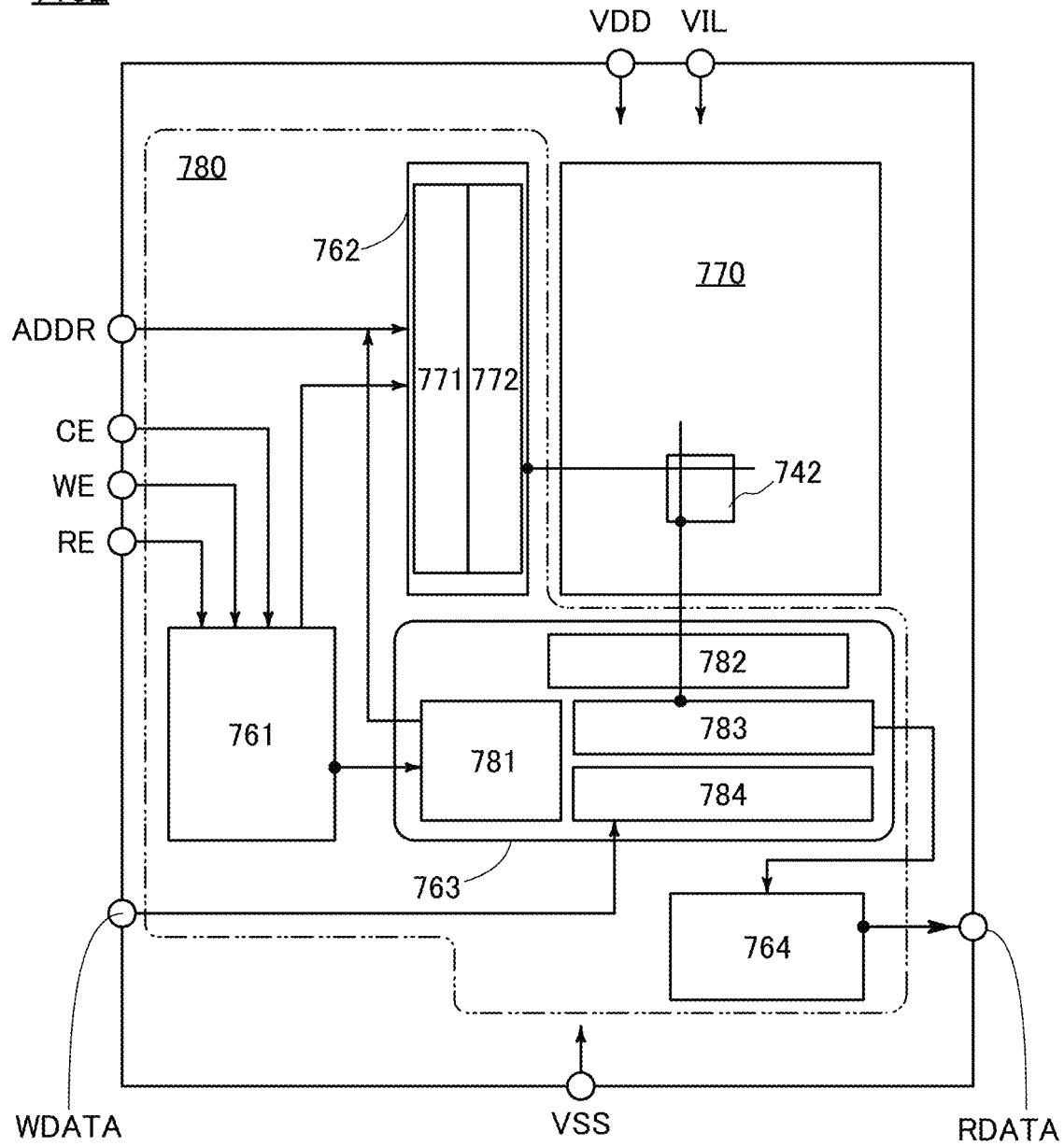
FIG. 19 is a block diagram illustrating a structure example of a memory device.

FIG. 19 is a block diagram illustrating a structure example of a semiconductor device functioning as a memory device. A semiconductor device 710E includes a peripheral circuit 780 and a memory cell array 770. The peripheral circuit 780 includes a control logic circuit 761, a row driver circuit 762, a column driver circuit 763, and an output circuit 764.

The memory cell array 770 includes a plurality of memory cells 742. The row driver circuit 762 includes a row decoder 771 and a word line driver circuit 772. The column driver circuit 763 includes a column decoder 781, a precharge circuit 782, an amplifier circuit 783, and a write circuit 784. The precharge circuit 782 has a function of precharging the wiring BL, the wiring BLB, or the like described in Embodiment 1, for example. The amplifier circuit 783 has a function of amplifying a data signal read from the memory cell array 770, for example. Specifically, the function may be a function of amplifying a potential corresponding to a differential current between currents flowing to the wiring BL and the wiring BLB described in Embodiment 1. The amplified data signal is output to the outside of the semiconductor device 710E as a digital data signal RDATA through the output circuit 764.

As power supply voltages from the outside, a low power supply voltage (VS S), a high power supply voltage (VDD) for the peripheral circuit 780, and a high power supply voltage (VIL) for the memory cell array 770 are supplied to the semiconductor device 710E.

Control signals (CE, WE, and RE), an address signal ADDR, and a data signal WDATA are also input to the semiconductor device 710E from the outside. The address signal ADDR is input to the row decoder 771 and the column decoder 781, and WDATA is input to the write circuit 784.

The control logic circuit 761 processes the signals (CE, WE, and RE) input from the outside, and generates control signals for the row decoder 771 and the column decoder 781. CE is a chip enable signal, WE is a write enable signal, and RE is a read enable signal. The signals processed by the control logic circuit 761 are not limited thereto, and other control signals may be input as necessary. For example, a control signal for determining a defective bit may be input so that a defective bit may be identified with a data signal read from an address of a particular memory cell.

Note that whether each circuit or each signal described above is provided or not can be appropriately determined as necessary.

Note that this embodiment can be combined with any of the other embodiments in this specification as appropriate.

Embodiment 6

This embodiment will show examples of a semiconductor wafer where the semiconductor device or the like described in the above embodiment is formed and electronic components incorporating the semiconductor device.
<Semiconductor Wafer>

First, an example of a semiconductor wafer where a semiconductor device or the like is formed is described with reference to FIG. 20A.

Figure 20A:
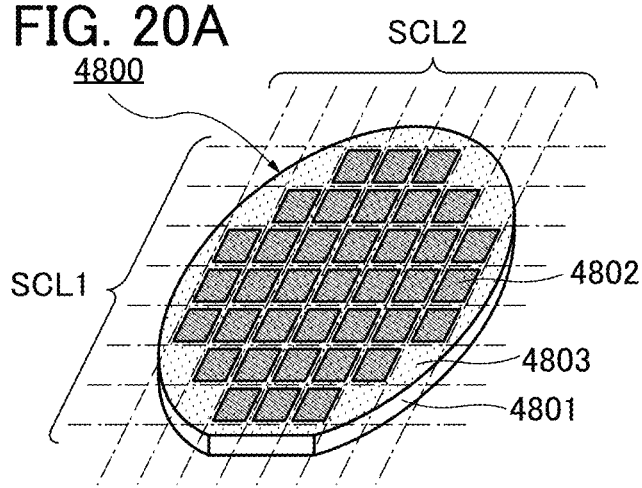
FIG. 20A is a perspective view illustrating an example of a semiconductor wafer.

A semiconductor wafer 4800 illustrated in FIG. 20A includes a wafer 4801 and a plurality of circuit portions 4802 provided on the top surface of the wafer 4801. A portion without the circuit portion 4802 on the top surface of the wafer 4801 is a spacing 4803 that is a region for dicing.

The semiconductor wafer 4800 can be fabricated by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as the next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 20B:
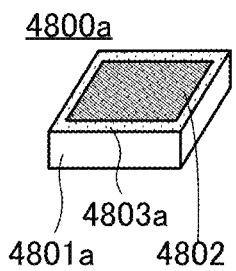
FIG. 20B is a perspective view illustrating an example of a chip.

With the dicing step, a chip 4800a illustrated in FIG. 20B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 20A. The element substrate may be a rectangular semiconductor wafer, for example. The shape of the element substrate can be changed as appropriate, depending on a manufacturing process of an element and an apparatus for manufacturing the element.
<Electronic Component>

Figure 20C:
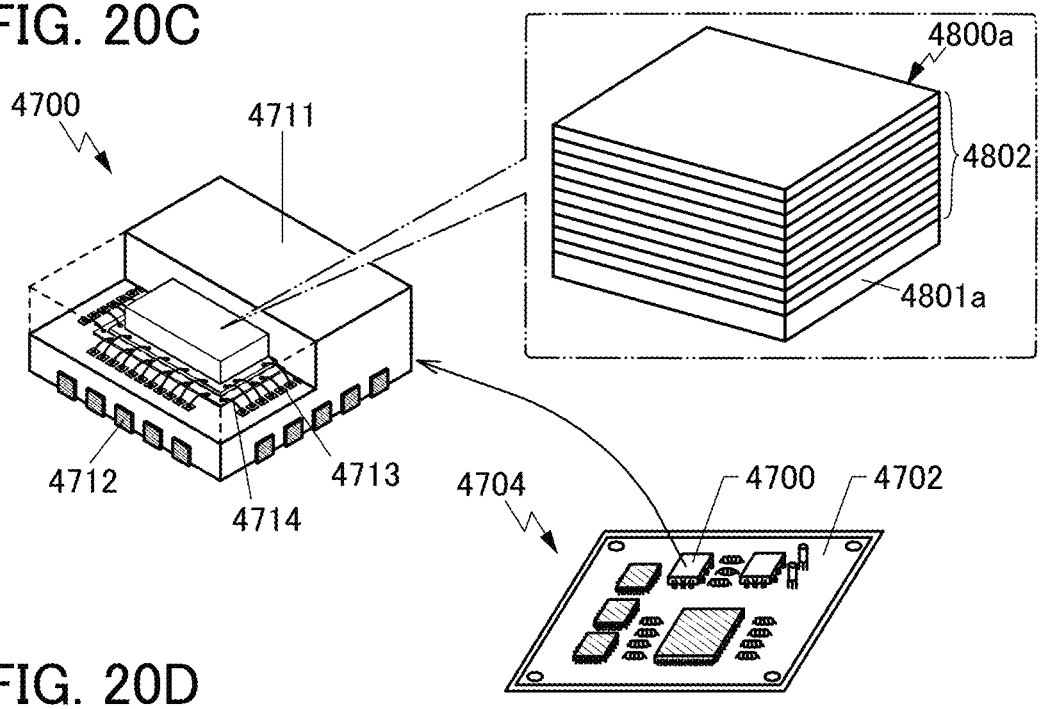
FIG. 20C and FIG. 20D are perspective views illustrating examples of electronic components.

FIG. 20C is a perspective view of an electronic component 4700 and a substrate (a mounting board 4704) on which the electronic component 4700 is mounted. The electronic component 4700 illustrated in FIG. 20C includes the chip 4800a in a mold 4711. Note that the chip 4800a illustrated in FIG. 20C is shown to have a structure in which the circuit portions 4802 are stacked. That is, the semiconductor device described in the above embodiment can be used for the circuit portion 4802. To illustrate the inside of the electronic component 4700, some portions are omitted in FIG. 20C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, whereby the mounting board 4704 is completed.

Figure 20D:
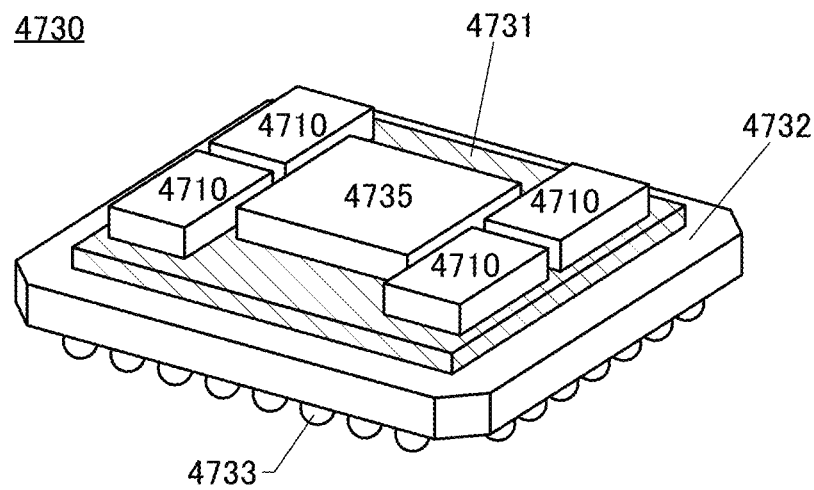

FIG. 20D shows a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the semiconductor device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings are provided in a single layer or multiple layers. Moreover, the interposer 4731 has a function of electrically connecting an integrated circuit provided on the interposer 4731 to an electrode provided on the package substrate 4732. Accordingly, the interposer is referred to as a "redistribution substrate" or an "intermediate substrate" in some cases. A through electrode is provided in the interposer 4731 and the through electrode is used to electrically connect an integrated circuit and the package substrate 4732 in some cases. In a silicon interposer, a TSV (Through Silicon Via) can also be used as the through electrode.

A silicon interposer is preferably used as the interposer 4731. A silicon interposer can be manufactured at lower cost than an integrated circuit because it is not necessary to provide an active element. Moreover, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on the bottom portion of the package substrate 4732. FIG. 20D illustrates an example where the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments described in this specification as appropriate.

Embodiment 7

This embodiment will show examples of electronic devices including the semiconductor device described in the above embodiment. FIG. 21A to FIG. 21J and FIG. 22A to FIG. 22E illustrate electronic devices each of which includes the electronic component 4700 including the semiconductor device.

[Mobile Phone]

Figure 21A:
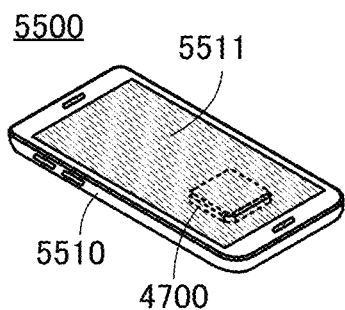
FIG. 21A to FIG. 21J are each a perspective view or a schematic view illustrating an example of a product.

An information terminal 5500 illustrated in FIG. 21A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the semiconductor device described in the above embodiment, the information terminal 5500 can retain a temporary file generated at the time of executing an application (e.g., a web browser's cache).

[Wearable Terminal]

Figure 21B:
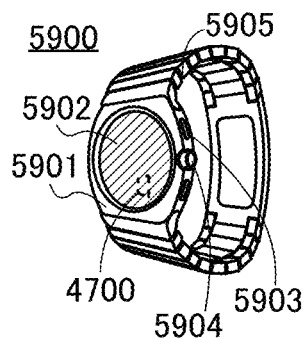

FIG. 21B illustrates an information terminal 5900 that is an example of a wearable terminal. The information terminal 5900 includes a housing 5901, a display portion 5902, an operation button 5903, an operator 5904, a band 5905, and the like.

Like the information terminal 5500 described above, the wearable terminal can retain a temporary file generated at the time of executing an application by using the semiconductor device described in the above embodiment.

[Information Terminal]

Figure 21C:
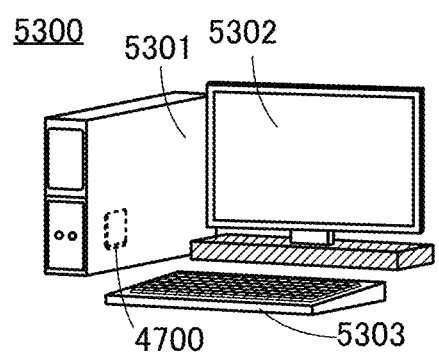

FIG. 21C illustrates a desktop information terminal 5300. The desktop information terminal 5300 includes a main body 5301 of the information terminal, a display 5302, and a keyboard 5303.

Like the information terminal 5500 described above, the desktop information terminal 5300 can retain a temporary file generated at the time of executing an application by using the semiconductor device described in the above embodiment.

Note that although the smartphone, the wearable terminal, and the desktop information terminal are respectively illustrated in FIG. 21A and FIG. 21C as examples of the electronic device, one embodiment of the present invention can be applied to an information terminal other than a smartphone and a desktop information terminal. Examples of an information terminal other than a smartphone and a desktop information terminal include a PDA (Personal Digital Assistant), a laptop information terminal, and a workstation.

[Household Appliance]

Figure 21D:
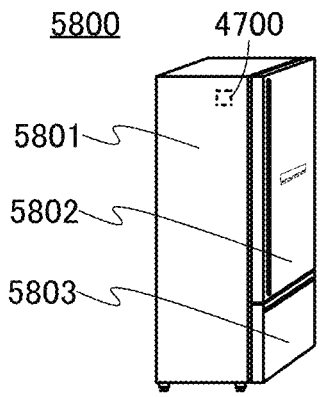

FIG. 21D illustrates an electric refrigerator-freezer 5800 as an example of a household appliance. The electric refrigerator-freezer 5800 includes a housing 5801, a refrigerator door 5802, a freezer door 5803, and the like.

When the semiconductor device described in the above embodiments is used in the electric refrigerator-freezer 5800, the electric refrigerator-freezer 5800 can be used for IoT (Internet of Things), for example. When used for IoT, the electric refrigerator-freezer 5800 can send and receive data on food stored in the electric refrigerator-freezer 5800 and food expiration dates, for example, to/from the above-described information terminal and the like via the Internet. When sending the data, the electric refrigerator-freezer 5800 can retain the data as a temporary file in the semiconductor device.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machines]

Figure 21E:
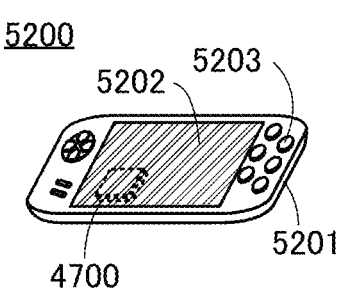

FIG. 21E illustrates a portable game machine 5200 that is an example of a game machine. The portable game machine 5200 includes a housing 5201, a display portion 5202, a button 5203, and the like.

Figure 21F:
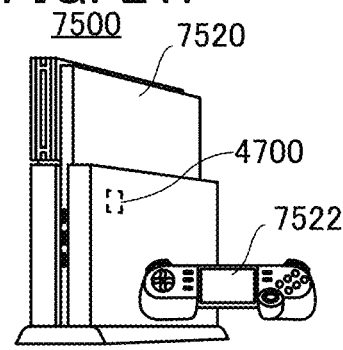

FIG. 21F illustrates a stationary game machine 7500 that is another example of a game machine. The stationary game machine 7500 includes a main body 7520 and a controller 7522. The controller 7522 can be connected to the main body 7520 with or without a wire. Although not illustrated in FIG. 21F, the controller 7522 can include a display portion that displays a game image, and an input interface besides a button, such as a touch panel, a stick, a rotating knob, and a sliding knob, for example. The shape of the controller 7522 is not limited to that illustrated in FIG. 21F, and can be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

When the semiconductor device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Moreover, with the use of the semiconductor device described in the above embodiment, the portable game machine 5200 can retain a temporary file necessary for arithmetic operation that occurs during game play.

Although FIG. 21E and FIG. 21F illustrate the portable game machines as examples of game machines, the electronic device of one embodiment of the present invention is not limited thereto. Examples of the electronic device of one embodiment of the present invention include a home stationary game machine, an arcade game machine installed in entertainment facilities (e.g., a game center and an amusement park), and a throwing machine for batting practice installed in sports facilities.

[Moving Vehicle]

The semiconductor device described in the above embodiment can be used for an automobile, which is a moving vehicle, and around the driver's seat in an automobile.

Figure 21G:
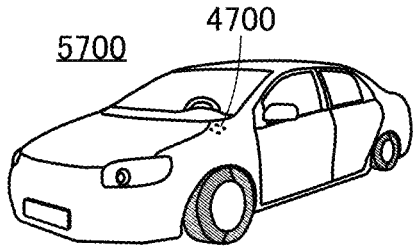

FIG. 21G illustrates an automobile 5700 that is an example of a moving vehicle.

An instrument panel that provides various kinds of information by displaying a speedometer, a tachometer, a mileage, a fuel meter, a gearshift state, and air-conditioning settings is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, which improves safety.

The semiconductor device described in the above embodiment can temporarily retain data, and thus the computer can be used to retain temporary data necessary in an automatic driving system for the automobile 5700 and a system for navigation and risk prediction, for example. The display device may be configured to display temporary information regarding navigation, risk prediction, or the like. Moreover, the semiconductor device may be configured to retain a video taken by a driving recorder provided in the automobile 5700.

Although an automobile is described above as an example of a moving vehicle, a moving vehicle is not limited to an automobile. Examples of moving vehicles include a train, a monorail train, a ship, and a flying object (a helicopter, an unmanned aircraft (a drone), an airplane, and a rocket).

[Camera]

The semiconductor device described in the above embodiment can be used in a camera.

Figure 21H:
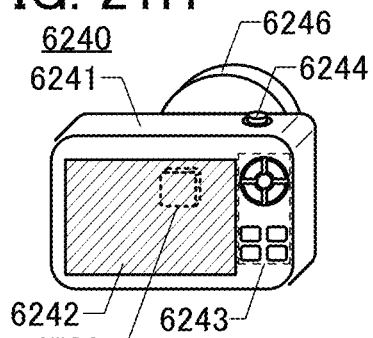

FIG. 21H illustrates a digital camera 6240 that is an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally attached to the digital camera 6240.

When the semiconductor device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

[Video Camera]

The semiconductor device described in the above embodiment can be used in a video camera.

Figure 21I:
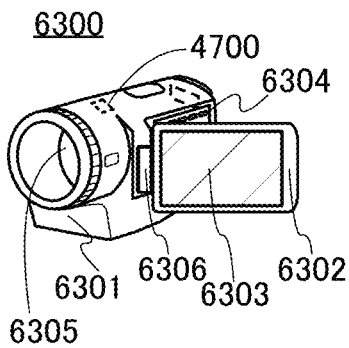

FIG. 21I illustrates a video camera 6300 that is an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above semiconductor device, the video camera 6300 can retain a temporary file generated in encoding.

[ICD]

The semiconductor device described in the above embodiment can be used in an implantable cardioverter-defibrillator (ICD).

Figure 21J:
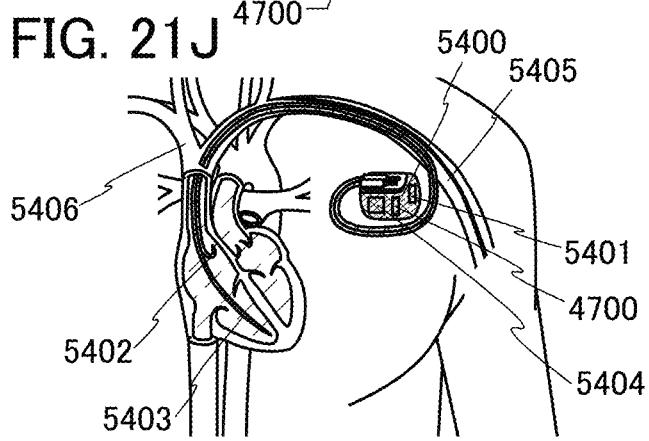

FIG. 21J is a schematic cross-sectional view illustrating an example of an ICD. An ICD main unit 5400 includes at least a battery 5401, an electric component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive electric power, and the battery 5401 is charged with the electric power. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 capable of receiving electric power, an antenna that can transmit physiological signals may be included to construct, for example, a system that monitors the cardiac activity by checking physiological signals such as a pulse, a respiratory rate, a heart rate, and body temperature with an external monitoring device.

[Expansion Device for PC]

The semiconductor device described in the above embodiment can be used in a calculator such as a PC (Personal Computer) and an extension device for an information terminal.

Figure 22A:
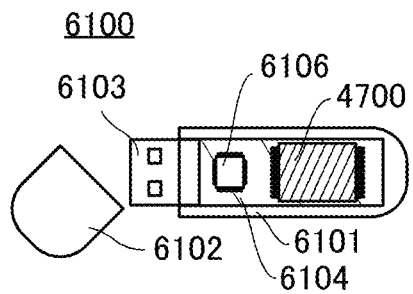
FIG. 22A to FIG. 22E are each a perspective view or a schematic view illustrating an example of a product.

FIG. 22A illustrates, as an example of the extension device, a portable extension device 6100 that includes a chip capable of retaining data and is externally provided on a PC. The extension device 6100 can retain data using the chip when connected to a PC with a USB (Universal Serial Bus), for example. FIG. 22A illustrates the portable extension device 6100; however, the extension device of one embodiment of the present invention is not limited thereto and may be a relatively large extension device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the semiconductor device or the like described in the above embodiment. For example, the substrate 6104 is provided with the electronic component 4700 and a controller chip 6106. The USB connector 6103 functions as an interface for connection to an external device.

[SD Card]

The semiconductor device described in the above embodiment can be used in an SD card that can be attached to an electronic device such as an information terminal or a digital camera.

Figure 22B:
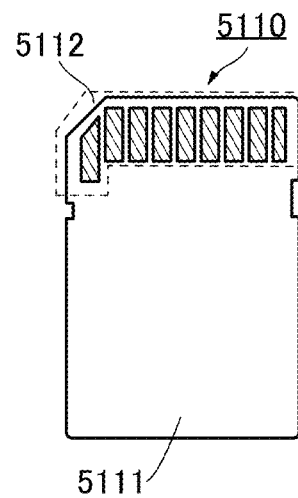
Figure 22C:
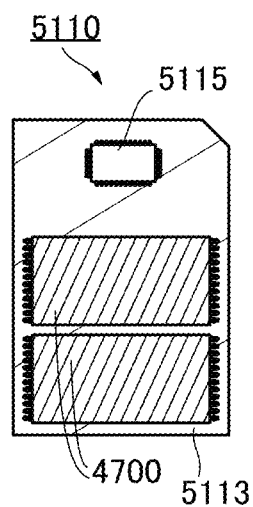

FIG. 22B is a schematic external view of an SD card, and FIG. 22C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a read circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from/to the electronic components 4700.

[SSD]

The semiconductor device described in the above embodiment can be used in a solid state drive (SSD) that can be attached to an electronic device such as an information terminal.

Figure 22D:
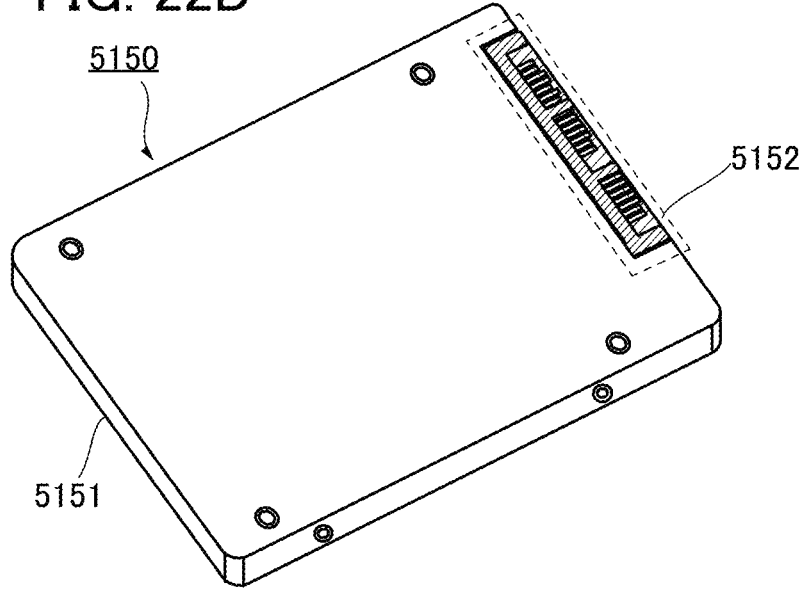
Figure 22E:
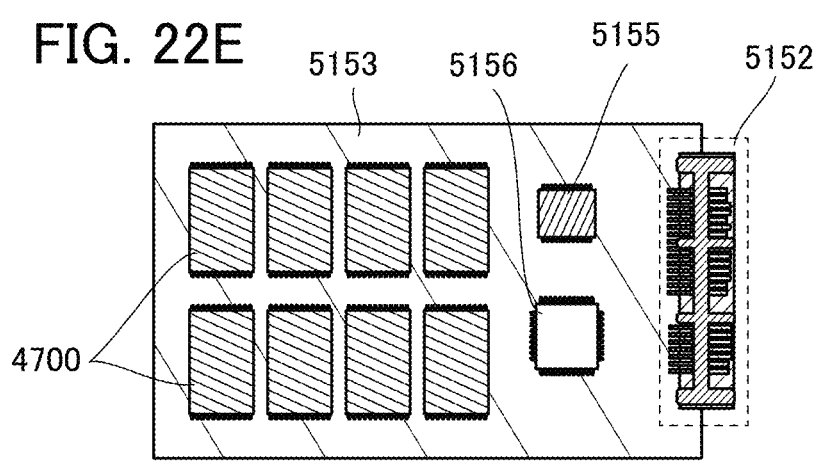

FIG. 22D is a schematic external view of an SSD, and FIG. 22E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the electronic components 4700, a memory chip 5155, and a controller chip 5156 are attached to the substrate 5153. When the electronic components 4700 are also provided on a rear surface side of the substrate 5153, the capacitance of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit structures of the electronic components 4700, the memory chip 5155, and the controller chip 5115 are not limited to those described above, and the circuit structures can be changed as appropriate according to circumstances. For example, a memory functioning as a work memory can also be provided in the controller chip 5156.

Note that this embodiment can be combined with any of the other embodiments in this specification as appropriate.

Example

In this example, an evaluation method of the memory device 100 described in Embodiment 1 and the results are described. As the evaluation method, calculation was performed using a circuit simulator to verify whether the memory device 100 operated properly.

Figure 23A:
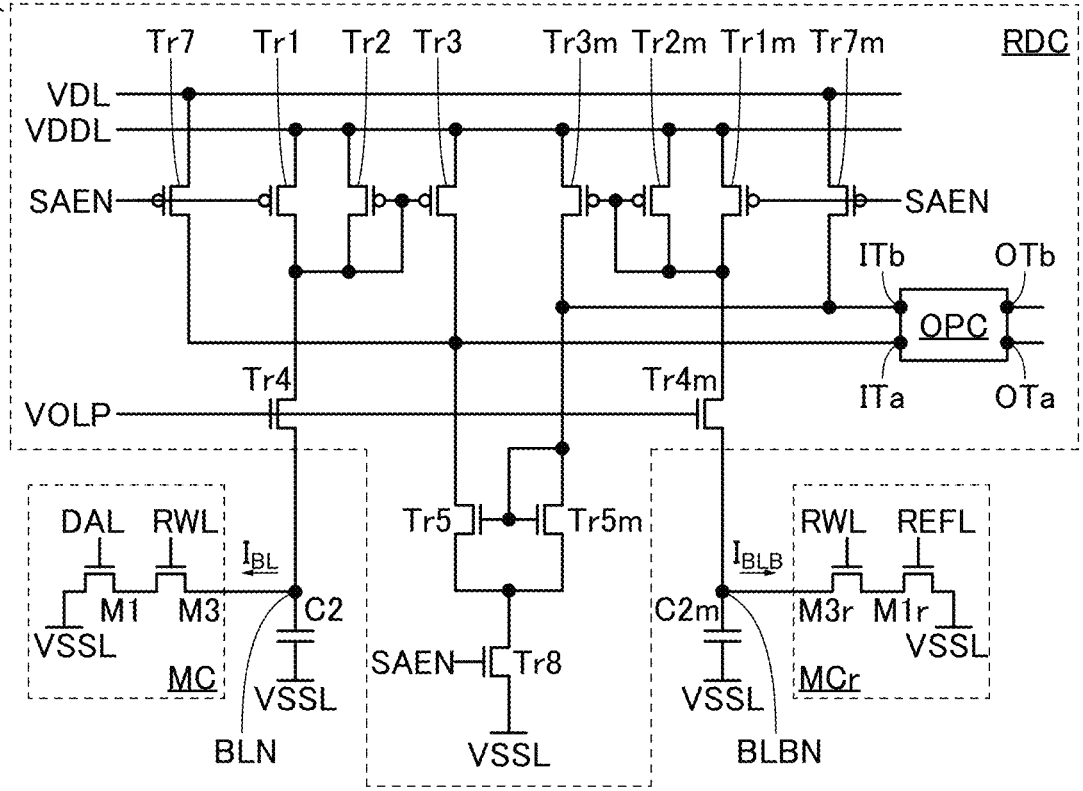
FIG. 23A and FIG. 23B are circuit diagrams showing conditions of circuit calculation.

First, a circuit structure for the calculation is described. FIG. 23A is a circuit structure input to the circuit simulator, which is based on the circuits of the memory device 100 in FIG. 1.

A memory device 100S having the circuit structure input to the circuit simulator includes the reading circuit RDC, the memory cell MC, the memory cell MCr, a capacitor C2, and a capacitor C2*m*.

The capacitor C2 is illustrated as a load (e.g., parasitic capacitance) on the wiring BL of the memory device 100 described in Embodiment 1. Similarly, the capacitor C2*m* is illustrated as a load (e.g., parasitic capacitance) on the wiring BLB of the memory device 100. Note that in this calculation condition, the capacitance values of the capacitor C2 and the capacitor C2*m* are each 40 fF.

The reading circuit RDC includes the transistor Tr1 to the transistor Try, the transistor Trim to the transistor Tr5*m*, a transistor Tr7, a transistor Tr7*m*, a transistor Tr8, and the circuit OPC.

The memory cell MC includes the transistor M1 and the transistor M3. The memory cell MCr includes the transistor M1r and the transistor M3r.

As for each size of the transistor Tr1, the transistor Tr1m, the transistor Tr7, and the transistor Tr7m, the channel length is 0.06 µm and the channel width is 0.48 µm. As for each size of the transistor Tr2 to the transistor Tr5, the transistor Tr8, and the transistor Tr2m to the transistor Tr5m, the channel length is 0.8 µm and the channel width is 0.48 µm. As for each size of the transistor M1, the transistor M1r, the transistor M3, and the transistor M3r, the channel length is 60 nm and the channel width is 60 nm.

Note that the transistor Tr1 to the transistor Tr3, the transistor Tr1m to the transistor Tr3m, the transistor Tr7, and the transistor Tr7m are p-channel transistors, and the transistor Tr4, the transistor Tr4m, the transistor Tr5, the transistor Tr5m, the transistor Tr8, the transistor M1, the transistor M1r, the transistor M3, and the transistor M3r are n-channel transistors.

The transistor Tr1 to the transistor Tr5, the transistor Tr1m to the transistor Tr5m, the transistor Tr7, the transistor Tr7m, and the transistor Tr8 are Si transistors. The transistor M1, the transistor M1r, the transistor M3, and the transistor M3r are OS transistors.

Unlike the circuit OPC included in the memory device 100 in Embodiment 1, the circuit OPC includes a terminal ITa, a terminal ITb, a terminal OTa, and a terminal OTb. The terminal ITa and the terminal ITb each function as an input terminal, and the terminal OTa and the terminal OTb each function as an output terminal. Note that the details of the circuit OPC will be described later.

In the reading circuit RDC, the first terminal of the transistor Tr1 is electrically connected to the first terminal of the transistor Tr2, the gate of the transistor Tr2, the gate of the transistor Tr3, and the first terminal of the transistor Tr4. The first terminal of the transistor Tr3 is electrically connected to a first terminal of the transistor Tr7, the first terminal of the transistor Tr5, and the terminal ITa of the circuit OPC. The first terminal of the transistor Tr1m is electrically connected to the first terminal of the transistor Tr2m, the gate of the transistor Tr2m, the gate of the transistor Tr3m, and the first terminal of the transistor Tr4m. The first terminal of the transistor Tr3m is electrically connected to a first terminal of the transistor Tr7m, the gate of the transistor Tr5, the first terminal of the transistor Tr5m, the gate of the transistor Tr5m, and the terminal ITb of the circuit OPC. The second terminal of the transistor Tr5 is electrically connected to the second terminal of the transistor Tr5m and a first terminal of the transistor Tr8. A second terminal of the transistor Tr8 is electrically connected to the wiring VSSL, and a gate of the transistor Tr8 is electrically connected to the wiring SAEN. The second terminals of the transistor Tr1 to the transistor Tr3 and the second terminals of the transistor Tr1m to the transistor Tr3m are electrically connected to the wiring VDDL. A second terminal of the transistor Tr7 and a second terminal of the transistor Tr7m are electrically connected to a wiring VDL. The gates of the transistor Tr4 and the transistor Tr4m are electrically connected to the wiring VOLP.

As described in Embodiment 1, the wiring VDDL is a wiring for supplying a constant voltage, and was a wiring for supplying a voltage of 1.2 V in this calculation condition.

The wiring VDL functions as a wiring for supplying a constant voltage. In this calculation condition, the wiring VDL was a wiring for supplying a voltage of 0.6 V.

As described in Embodiment 1, the wiring VSSL is a wiring for supplying a constant voltage, and was a wiring for supplying a voltage of 0 V in this calculation condition.

As described in Embodiment 1, the wiring VOLP functions as a wiring for controlling a potential to be output from the second terminals of the transistor Tr4 and the transistor Tr4m. In this calculation condition, a potential supplied by the wiring VOLP was 0 V or 1.2 V.

As described in Embodiment 1, the wiring SAEN functions as a wiring for switching the disable state and the enable state of the reading circuit RDC. In this calculation condition, a potential supplied by the wiring SAEN was 0 V or 1.2 V.

In the memory cell MC, the first terminal of the transistor M1 is electrically connected to the wiring VSSL, and the second terminal of the transistor M1 is electrically connected to the first terminal of the transistor M3. The gate of the transistor M1 is electrically connected to a wiring DAL, and the gate of the transistor M3 is electrically connected to the wiring RWL. Note that the wiring VSSL electrically connected to the first terminal of the transistor M1 corresponds to the wiring CVL2 described in Embodiment 1.

In the memory cell MCr, the first terminal of the transistor M1r is electrically connected to the wiring VSSL, and the second terminal of the transistor M1r is electrically connected to the first terminal of the transistor M3r. The gate of the transistor M1r is electrically connected to a wiring REFL, and a gate of the transistor M3r is electrically connected to the wiring RWL. Note that the wiring VSSL electrically connected to the first terminal of the transistor M1r corresponds to the wiring CVL2 described in Embodiment 1.

The second terminal of the transistor Tr4 is electrically connected to a first terminal of the capacitor C2 and the second terminal of the transistor M3. The second terminal of the transistor Tr4m is electrically connected to a first terminal of the capacitor C2m and the second terminal of the transistor M3r. The electrical connection point of the second terminal of the transistor Tr4 and the second terminal of the transistor M3 is a node BLN, and the electrical connection point of the second terminal of the transistor Tr4m and the second terminal of the transistor M3r is a node BLBN.

As described in Embodiment 1, the wiring RWL functions as the read word line of the memory cell MC and the memory cell MCr. In this calculation condition, the wiring RWL was a wiring for supplying 0 V as a low-level potential and 3.3 V as a high-level potential.

The wiring DAL functions as a wiring for supplying a potential to the gate of the transistor M1 and corresponds to the node N (the first terminal of the capacitor C1) in Embodiment 1. In this calculation condition, the wiring DAL was a wiring for supplying 0 V as a low-level potential and 2.5 V as a high-level potential.

The wiring REFL functions as a wiring for supplying a potential to the gate of the transistor M1r and corresponds to the node Nr (the first terminal of the capacitor C1r) in Embodiment 1. In this calculation condition, the wiring REFL was a wiring for supplying 0.8 V.

Next, the circuit OPC is described.

Figure 23B:
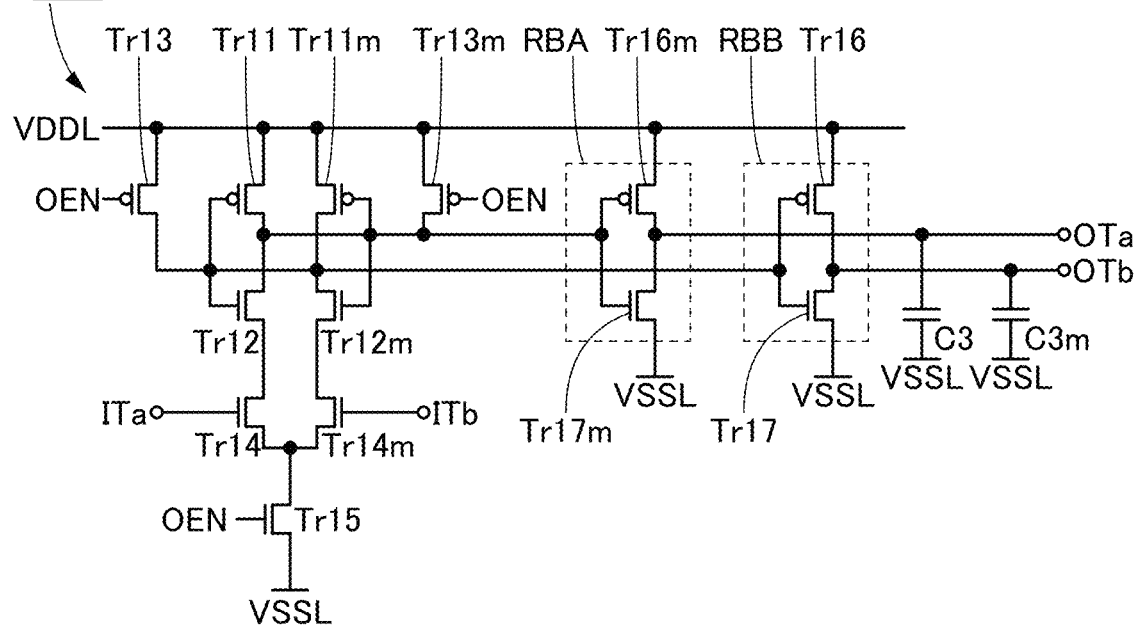

The circuit OPC illustrated in FIG. 23B has a structure changed from that of the circuit OPC in FIG. 2D. Thus, description overlapping with that of the circuit OPC in FIG. 2D is omitted.

The circuit OPC in FIG. 23B includes the transistor Tr11 to a transistor Tr17, the transistor Tr11m to the transistor Tr14m, a transistor Tr16m, a transistor Tr17m, a capacitor C3, and a capacitor C3m. Note that the transistor Tr11, the transistor Tr11m, the transistor Tr13, the transistor Tr13m, the transistor Tr16, and the transistor Tr16m are p-channel transistors, and the transistor Tr12, the transistor Tr12m, the transistor Tr14, the transistor Tr14m, the transistor Tr15, the transistor Tr17, and the transistor Tr17m are n-channel transistors.

As for each size of the transistor Tr11 to the transistor Tr14 and the transistor Tr11m to the transistor Tr14m, the channel length is 0.2 µm and the channel width is 0.48 µm. As for the size of the transistor Tr15, the channel length is 0.4 µm and the channel width is 0.48 µm. As for each size of the transistor Tr16 and the transistor Tr16m, the channel length is 0.06 µm and the channel width is 0.48 µm. As for each size of the transistor Tr17 and the transistor Tr17m, the channel length is 0.06 µm and the channel width is 0.24 µm.

The transistor Tr11 to the transistor Tr17, the transistor Tr11m to the transistor Tr14m, the transistor Tr16m, and the transistor Tr17m are Si transistors.

In the circuit OPC in FIG. 23B, the NOT circuit RBA and the NOT circuit RBB are illustrated. In particular, the NOT circuit RBA is a circuit corresponding to the NOT circuit RBA included in the circuit OPC in FIG. 2D, and includes the transistor Tr16m and the transistor Tr17m. The NOT circuit RBB includes the transistor Tr16 and the transistor Tr17.

The capacitor C3 is illustrated as a load (e.g., parasitic capacitance) on the terminal OTa. Similarly, the capacitor C3m is illustrated as a load (e.g., parasitic capacitance) on the terminal OTb. In this calculation condition, the capacitance values of the capacitor C3 and the capacitor C3m are each 1 fF.

In FIG. 2D, the gate of the transistor Tr14 corresponds to one of the input terminals of the circuit OPC. Thus, in the circuit OPC in FIG. 23B, the gate of the transistor Tr14 is electrically connected to the terminal ITa. In addition, in FIG. 2D, the gate of the transistor Tr14m corresponds to the other of the input terminals of the circuit OPC. Thus, in the circuit OPC in FIG. 23B, the gate of the transistor Tr14m is electrically connected to the terminal ITb.

A gate of the transistor Tr16m and a gate of the transistor Tr17m are electrically connected to the first terminal of the transistor Tr13m, the gate of the transistor Tr11m, the gate of the transistor Tr12m, the first terminal of the transistor Tr11, and the first terminal of the transistor Tr12. A first terminal of the transistor Tr16m is electrically connected to a first terminal of the transistor Tr17m, a first terminal of the capacitor C3, and the terminal OTa. A second terminal of the transistor Tr16m is electrically connected to the wiring VDDL. A second terminal of the transistor Tr17m is electrically connected to the wiring VSSL.

A gate of the transistor Tr16 and a gate of the transistor Tr17 are electrically connected to the first terminal of the transistor Tr13, the gate of the transistor Tr11, the gate of the transistor Tr12, the first terminal of the transistor Tr11m, and the first terminal of the transistor Tr12m. A first terminal of the transistor Tr16 is electrically connected to a first terminal of the transistor Tr17, a first terminal of the capacitor C3m, and the terminal OTb. A second terminal of the transistor Tr16 is electrically connected to the wiring VDDL. A second terminal of the transistor Tr17 is electrically connected to the wiring VSSL.

Second terminals of the capacitor C3 and the capacitor C3m are electrically connected to the wiring VSSL.

As described in Embodiment 1, the wiring OEN functions as a wiring for transmitting a signal for operating the circuit OPC. In this calculation condition, the wiring OEN was a wiring for supplying 0 V as a low-level potential and 1.2 V as a high-level potential.

FIG. 24A to FIG. 24E and FIG. 25A to FIG. 25E show the results of the calculation of the circuit structure in FIG. 23A and FIG. 23B by the circuit simulator. FIG. 24A to FIG. 24E are graphs showing changes in potentials at certain points and currents flowing to certain points under conditions where 3.3 V (a high-level potential) was supplied to the wiring DAL to read data from the memory cell MC, and FIG. 25A to FIG. 25E are graphs showing changes in potentials at certain points and currents flowing to certain points under conditions where 0 V (a low-level potential) was supplied to the wiring DAL to read data from the memory cell MC.

<Case of Reading High-Level Potential from Memory Cell MC>

Figure 24A:
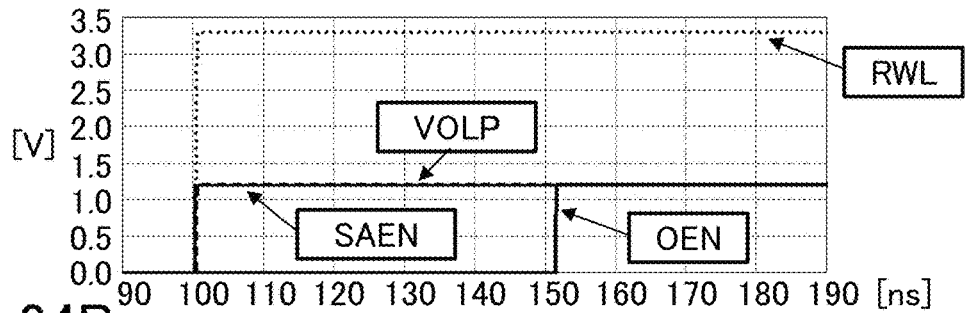
FIG. 24A is a graph showing conditions of circuit calculation.

FIG. 24A is a graph showing changes in potentials of the wiring RWL, the wiring SAEN, the wiring VOLP, and the wiring OEN in the reading circuit RDC in FIG. 23A and FIG. 23B. Note that in FIG. 24A, a line (solid line) showing the change in the potential of the wiring VOLP and a line (dashed line) showing the change in the potential of the wiring SAEN are illustrated to overlap with each other. In the operation of the reading circuit RDC, a potential input to the wiring SAEN was changed from 0 V to 1.2 V, a potential input to the wiring VOLP was changed from 0 V to 1.2 V, and a potential input to the wiring RWL was changed from 0 V to 3.3 V, at a time of 100 ns.

Figure 24B:
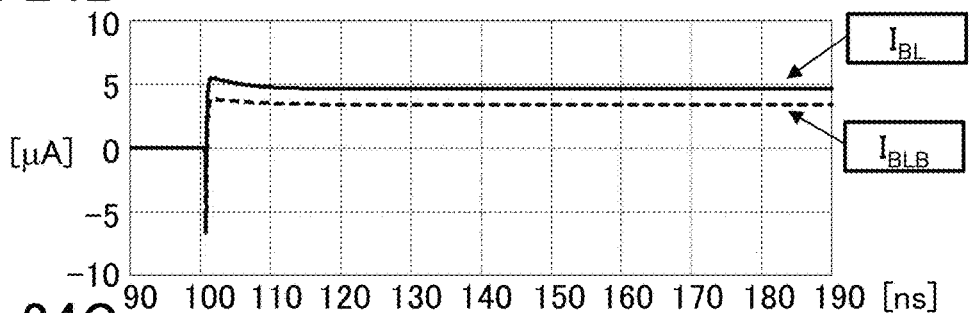
FIG. 24B to FIG. 24E are graphs showing results of the circuit calculation.

Accordingly, a current ($I_{BL}$ here) corresponding to the wiring DAL flows from the second terminal of the transistor Tr4 in the reading circuit RDC to the transistor M3 in the memory cell MC, and a current ($I_{BLB}$ here) corresponding to the wiring REFL flows from the second terminal of the transistor Tr4m in the reading circuit RDC to the transistor M3r in the memory cell MC. FIG. 24B shows the changes in $I_{BL}$ and $I_{BLB}$. It is found from FIG. 24B that $I_{BL}$ and $I_{BLB}$ become stable after a time of around 110 ns. Note that after the time of 110 ns, the current $I_{BL}$ is approximately 4.46 µA and the current $I_{BLB}$ is approximately 3.42 µA.

Figure 24C:
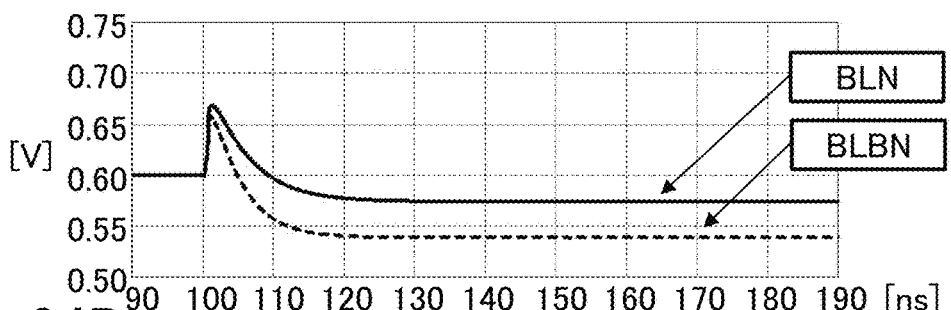

FIG. 24C is a graph showing changes in the potentials of the node BLN and the node BLBN. The potentials of the node BLN and the node BLBN become stable around a time of 130 ns, as shown in the calculation results in FIG. 24C. That is, the time until the current becomes stable is shorter than the time until the voltage becomes stable; thus, it can be said that a current sensing amplifier (CSA) is more suitable than a voltage sensing amplifier (VSA) for the reading operation of the memory device 100S.

Figure 24D:
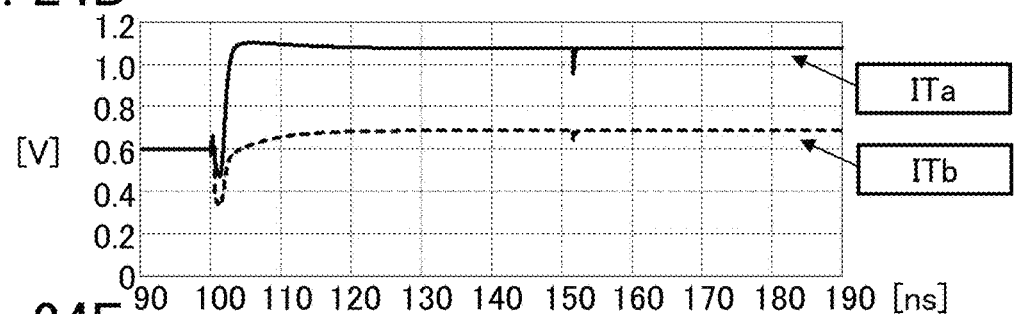

FIG. 24D is a graph showing changes in the potentials input to the terminal ITa and the terminal ITb of the circuit OPC, that is, the potentials input to the differential pair of the transistor Tr14 and the transistor Tr14m. It is found from FIG. 24D that, due to the changes in the potentials of the wiring SAEN, the wiring VOLP, and the wiring RWL at the time of 100 ns, the potential of the terminal ITa changes from 0.6 V to 1.1 V and the potential of the terminal ITb changes from 0.6 V to 0.68 V. In addition, it is found that the potentials become stable after a time of around 120 ns.

In the operation of the reading circuit RDC, the potential of the wiring OEN was changed from 0 V to 1.2 V after a time of around 151 ns (see FIG. 24A). By this operation, the circuit OPC outputs a potential corresponding to the potential input to the terminal ITa and the terminal ITb of the circuit OPC from the terminal OTa and the terminal OTb of the circuit OPC. The potential output from the terminal OTa and the terminal OTb of the circuit OPC corresponds to a reading potential from the memory cell MC.

Figure 24E:
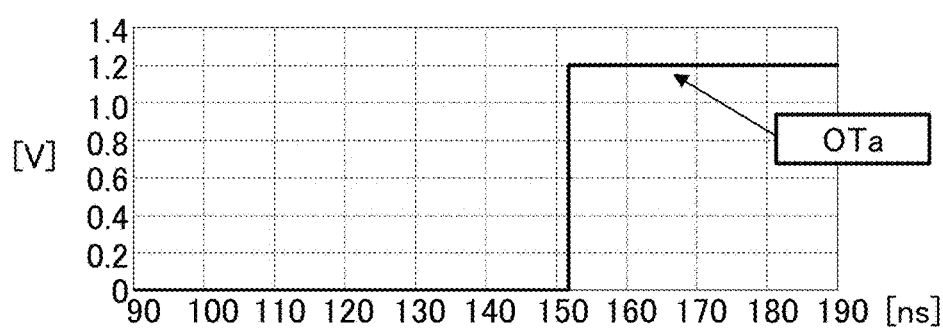

FIG. 24E is a graph showing a change in the potential output from the terminal OTa. It is found from FIG. 24E that the potential of the terminal OTa increases from 0 V to 1.2 V after a time of 150 ns. By reading a high-level potential input to the wiring DAL of the memory cell MC, it was confirmed that the terminal OTa of the circuit OPC outputted a potential of 1.2 V as a high-level potential.

<Case of Reading Low-Level Potential from Memory Cell MC>

Figure 25A:
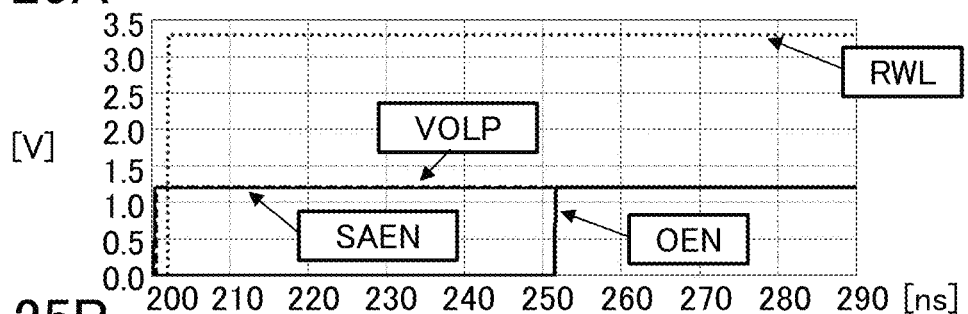
FIG. 25A is a graph showing conditions of circuit calculation.

FIG. 25A is a graph showing changes in potentials of the wiring RWL, the wiring SAEN, the wiring VOLP, and the wiring OEN in the reading circuit RDC in FIG. 23A and FIG. 23B. Note that in FIG. 25A, a line (solid line) showing the change in the potential of the wiring VOLP and a line (dashed line) showing the change in the potential of the wiring SAEN are illustrated to overlap with each other. In the operation of the reading circuit RDC, a potential input to the wiring SAEN was changed from 0 V to 1.2 V, a potential input to the wiring VOLP was changed from 0 V to 1.2 V, and a potential input to the wiring RWL was changed from 0 V to 3.3 V, at a time of 200 ns.

Figure 25B:
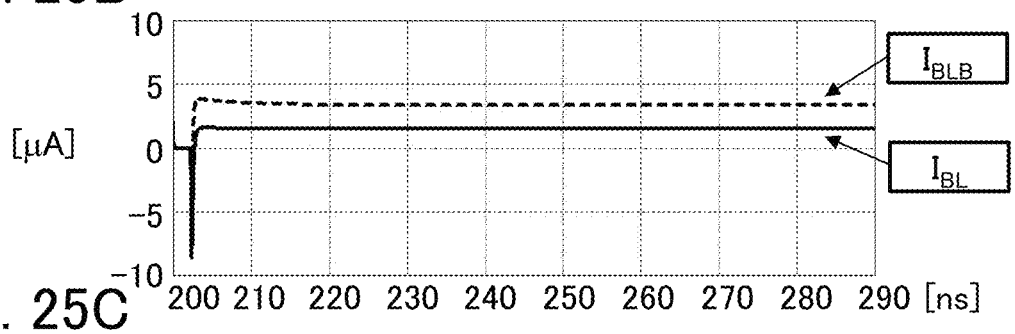
FIG. 25B to FIG. 25E are graphs showing results of the circuit calculation.

Accordingly, the current $I_{BL}$ corresponding to the wiring DAL flows from the second terminal of the transistor Tr4 in the reading circuit RDC to the transistor M3 in the memory cell MC, and the current $I_{BLB}$ corresponding to the wiring REFL flows from the second terminal of the transistor Tr4$m$ in the reading circuit RDC to the transistor M3$r$ of in memory cell MC. FIG. 25B shows the changes in $I_{BL}$ and $I_{BLB}$. It is found from FIG. 25B that $I_{BL}$ and $I_{BLB}$ become stable after a time of around 210 ns. Note that after the time of 210 ns, the current $I_{BL}$ is approximately 1.56 µA and the current $I_{BLB}$ is approximately 3.42 µA.

Figure 25C:
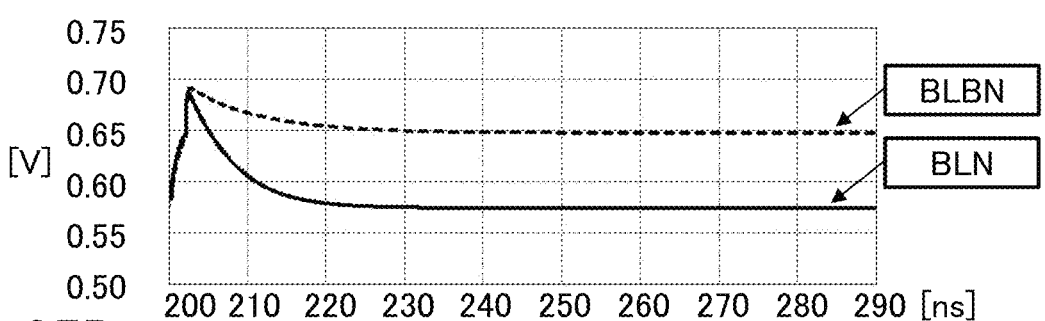

FIG. 25C is a graph showing changes in the potentials of the node BLN and the node BLBN. The potentials of the node BLN and the node BLBN become stable after a time of around 230 ns, as shown in the calculation results in FIG. 25C. That is, the time until the current becomes stable is shorter than the time until the voltage becomes stable.

Figure 25D:
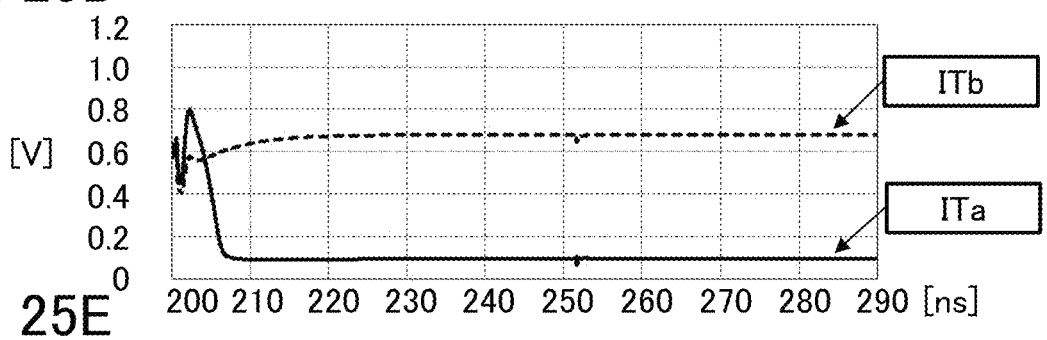

FIG. 25D is a graph showing the changes in the potentials input to the terminal ITa and the terminal ITb of the circuit OPC. It is found from FIG. 25D that, due to the changes in the potentials of the wiring SAEN, the wiring VOLP, and the wiring RWL at the time of 200 ns, the potential of the terminal ITa changes from 0.6 V to 0.1 V and the potential of the terminal ITb changes from 0.6 V to 0.68 V. In addition, the potentials become stable after a time of around 220 ns.

In the operation of the reading circuit RDC, the potential of the wiring OEN is changed from 0 V to 1.2 V after a time of around 251 ns (see FIG. 25A). By this operation, the circuit OPC outputs a potential corresponding to the potential input to the terminal ITa and the terminal ITb of the circuit OPC from the terminal OTa and the terminal OTb of the circuit OPC. The potential output from the terminal OTa and the terminal OTb of the circuit OPC corresponds to a reading potential from the memory cell MC.

Figure 25E:
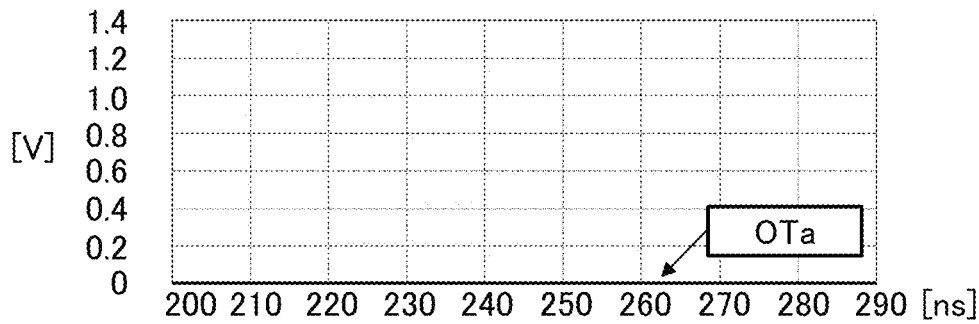

FIG. 25E is a graph showing a change in the potential output from the terminal OTa. It is found from FIG. 25E that the potential of the terminal OTa after a time of 250 ns is 0 V. By reading a low-level potential input to the wiring DAL of the memory cell MC, it was confirmed that the terminal OTa of the circuit OPC outputted a potential of 0 V as a low-level potential.

REFERENCE NUMERALS

MCA: memory cell array, RDC: reading circuit, RDCa: circuit, RDCb: circuit, MC: memory cell, MCr: memory cell, CM: current mirror circuit, CMr: current mirror circuit, CMd: current mirror circuit, OPC: circuit, LE2: load, CMP: comparator, RB1: NOT circuit, RB2: NOT circuit, RBA: NOT circuit, RBB: NOT circuit, M1: transistor, M1$r$: transistor, M2: transistor, M2$r$: transistor, M3: transistor, M3$r$: transistor, Tr1: transistor, Tr1$m$: transistor, Tr2: transistor, Tr2$m$: transistor, Tr3: transistor, Tr3$m$: transistor, Tr4: transistor, Tr4$m$: transistor, Try: transistor, Trym: transistor, Tr6: transistor, Tr7: transistor, Tr7$m$: transistor, Tr8: transistor, Tr11: transistor, Tr11$m$: transistor, Tr12: transistor, Tr12$m$: transistor, Tr13: transistor, Tr13$m$: transistor, Tr14: transistor, Tr14$m$: transistor, Tr15: transistor, Tr16: transistor, Tr16$m$: transistor, Tr17: transistor, Tr17$m$: transistor, OTr4: transistor, OTr4$m$: transistor, OTr5: transistor, OTr5$m$: transistor, C1: capacitor, C1$r$: capacitor, C2: capacitor, C2$m$: capacitor, C3: capacitor, C3$m$: capacitor, N: node, Nr: node, BLN: node, BLBN: node, WWL: wiring, RWL: wiring, WBL: wiring, BL: wiring, BLB: wiring, SAEN: wiring, VOLP: wiring, OEN: wiring, CVL1: wiring, CVL2: wiring, VDDL: wiring, VDL: wiring, VSSL: wiring, VAL: wiring, VBL: wiring, VGL2: wiring, OL: wiring, OLB: wiring, DAL: wiring, REFL: wiring, ITa: terminal, ITb: terminal, OTa: terminal, OTb: terminal, SILR: layer, OSLR1: layer, OSLR2: layer, PRC: processor, DRV1: driver circuit, DRV2: driver circuit, 100: memory device, 100A: memory device, 100B: memory device, 100C: memory device, 100S: memory device, 110: semiconductor device, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 400: transistor, 414: insulator, 416: insulator, 450: insulator, 452: insulator, 454: insulator, 456: conductor, 500: transistor, 501: insulator, 502: insulator, 503: conductor, 503a: conductor, 503b: conductor, 510: insulator, 512: insulator, 514: insulator, 516: insulator, 518: conductor, 520: insulator, 522: insulator, 524: insulator, 530: oxide, 530a: oxide, 530b: oxide, 530c: oxide, 530c1: oxide, 530c2: oxide, 540: conductor, 540a: conductor, 540b: conductor, 542a: conductor, 542b: conductor, 543a: region, 543b: region, 544: insulator, 546: conductor, 548: conductor, 550: insulator, 552: insulator, 560: conductor, 560a: conductor, 560b: conductor, 574: insulator, 580: insulator, 581: insulator, 582: insulator, 586: insulator, 600: capacitor, 600A: capacitor, 600B: capacitor, 610: conductor, 611: conductor, 612: conductor, 620: conductor, 621: conductor, 630: insulator, 631: insulator, 650: insulator, 651: insulator, 710E: semiconductor device, 742: memory cell, 761: control logic circuit, 762: row driver circuit, 763: column driver circuit, 764: output circuit, 770: memory cell array, 771: row decoder, 772: word line driver circuit, 780: peripheral circuit, 781: column decoder, 782: precharge circuit, 783: amplifier circuit, 784: circuit, 4700: an electrical component, 4702: printed circuit board, 4704: circuit board, 4710: semiconductor device, 4714: wire, 4730: an electrical component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display, 5303: keyboard, 5400: ICD main body, 5401: battery, 5402: wire, 5403: wire, 5404:

antenna, 5405: subclavian vein, 5406: superior vena cava, 5500: information terminal, 5510: housing, 5511: display portion, 5700: car, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: extension device, 6101: housing, 6102: cap, 6103: USB connector, 6104: substrate, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 7520: main body, 7522: controller

The invention claimed is:

1. A memory device comprising:
a first layer and a second layer,
wherein the second layer is positioned above the first layer,
wherein the first layer comprises a reading circuit,
wherein the second layer comprises a first memory cell and a second memory cell,
wherein a transistor included in the reading circuit comprises silicon in a channel formation region,
wherein a transistor included in the first memory cell and a transistor included in the second memory cell each comprise a metal oxide in a channel formation region,
wherein the first memory cell is electrically connected to the reading circuit through a first wiring,
wherein the second memory cell is electrically connected to the reading circuit through a second wiring, and
wherein when a first current corresponding to first data retained in the first memory cell flows from the reading circuit to the first memory cell and a second current corresponding to second data retained in the second memory cell flows from the reading circuit to the second memory cell, the reading circuit is configured to read the first data in accordance with an amount relationship between the first current and the second current.

2. The memory device according to claim 1,
wherein the reading circuit comprises a first transistor and a second transistor,
wherein the first transistor and the second transistor are n-channel transistors,
wherein a first terminal of the first transistor is electrically connected to the first wiring, and
wherein a first terminal of the second transistor is electrically connected to the second wiring.

3. The memory device according to claim 2,
wherein the reading circuit comprises a third transistor, a fourth transistor, a fifth transistor, a sixth transistor, a seventh transistor, an eighth transistor, a ninth transistor, a tenth transistor, and a first circuit,
wherein the ninth transistor and the tenth transistor are n-channel transistors,
wherein the third transistor, the fourth transistor, the fifth transistor, the sixth transistor, the seventh transistor, and the eighth transistor are p-channel transistors,
wherein a second terminal of the first transistor is electrically connected to a first terminal of the third transistor, a first terminal of the fifth transistor, a gate of the fifth transistor, and a gate of the seventh transistor,
wherein a first terminal of the seventh transistor is electrically connected to a first terminal of the ninth transistor and an input terminal of the first circuit,
wherein a second terminal of the second transistor is electrically connected to a first terminal of the fourth transistor, a first terminal of the sixth transistor, a gate of the sixth transistor, and a gate of the eighth transistor,
wherein a first terminal of the eighth transistor is electrically connected to a first terminal of the tenth transistor, a gate of the tenth transistor, and a gate of the ninth transistor,
wherein the first circuit is configured to output a reading potential of the first data from an output terminal of the first circuit in accordance with a first potential of the input terminal of the first circuit, and
wherein the first potential is a potential based on the first current and the second current.

4. The memory device according to claim 1,
wherein the reading circuit comprises a third transistor, a fourth transistor, a fifth transistor, a sixth transistor, a seventh transistor, an eighth transistor, a ninth transistor, a tenth transistor, and a first circuit,
wherein the ninth transistor and the tenth transistor are n-channel transistors,
wherein the third transistor, the fourth transistor, the fifth transistor, the sixth transistor, the seventh transistor, and the eighth transistor are p-channel transistors,
wherein a first terminal of the third transistor is electrically connected to the first wiring, a first terminal of the fifth transistor, a gate of the fifth transistor, and a gate of the seventh transistor,
wherein a first terminal of the seventh transistor is electrically connected to a first terminal of the ninth transistor and an input terminal of the first circuit,
wherein a first terminal of the fourth transistor is electrically connected to the second wiring, a first terminal of the sixth transistor, a gate of the sixth transistor, and a gate of the eighth transistor,
wherein a first terminal of the eighth transistor is electrically connected to a first terminal of the tenth transistor, a gate of the tenth transistor, and a gate of the ninth transistor,
wherein the first circuit is configured to output a reading potential of the first data from an output terminal of the first circuit in accordance with a first potential of the input terminal of the first circuit, and
wherein the first potential is a potential based on the first current and the second current.

5. The memory device according to claim 1,
wherein the first memory cell comprises an eleventh transistor, a twelfth transistor, a thirteenth transistor, and a first capacitor,
wherein the second memory cell comprises a fourteenth transistor, a fifteenth transistor, a sixteenth transistor, and a second capacitor,
wherein a gate of the eleventh transistor is electrically connected to a first terminal of the twelfth transistor and a first terminal of the first capacitor,
wherein a first terminal of the eleventh transistor is electrically connected to a first terminal of the thirteenth transistor,
wherein a second terminal of the thirteenth transistor is electrically connected to the first wiring,
wherein a gate of the fourteenth transistor is electrically connected to a first terminal of the fifteenth transistor and a first terminal of the second capacitor,
wherein a first terminal of the fourteenth transistor is electrically connected to a first terminal of the sixteenth transistor, and
wherein a second terminal of the sixteenth transistor is electrically connected to the second wiring.

6. The memory device according to claim 1,
wherein the first memory cell comprises an eleventh transistor, a twelfth transistor, and a first capacitor,
wherein the second memory cell comprises a fourteenth transistor, a fifteenth transistor, and a second capacitor,
wherein a gate of the eleventh transistor is electrically connected to a first terminal of the twelfth transistor and a first terminal of the first capacitor,
wherein a first terminal of the eleventh transistor is electrically connected to the first wiring,
wherein a gate of the fourteenth transistor is electrically connected to a first terminal of the fifteenth transistor and a first terminal of the second capacitor, and
wherein a first terminal of the fourteenth transistor is electrically connected to the second wiring.

7. A semiconductor device comprising the memory device according to claim 1 and a processor,
wherein the processor is included in the first layer.

8. An electronic device comprising the memory device according to claim 1 and a housing.

* * * * *